US011157360B2

(12) United States Patent
Yoneda et al.

(10) Patent No.: US 11,157,360 B2
(45) Date of Patent: Oct. 26, 2021

(54) SEMICONDUCTOR DEVICE, SEMICONDUCTOR WAFER, ELECTRONIC DEVICE, AND OPERATION METHOD

(71) Applicant: SEMICONDUCTOR ENERGY LABORATORY CO., LTD., Atsugi (JP)

(72) Inventors: Seiichi Yoneda, Kanagawa (JP); Takayuki Ikeda, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/619,506

(22) PCT Filed: Jun. 4, 2018

(86) PCT No.: PCT/IB2018/053962
§ 371 (c)(1),
(2) Date: Dec. 5, 2019

(87) PCT Pub. No.: WO2018/229590
PCT Pub. Date: Dec. 20, 2018

(65) Prior Publication Data
US 2020/0142773 A1 May 7, 2020

(30) Foreign Application Priority Data

Jun. 16, 2017 (JP) .............................. JP2017-118261
Nov. 30, 2017 (JP) .............................. JP2017-230394

(51) Int. Cl.
G06F 11/10 (2006.01)
G11C 29/52 (2006.01)
H03M 7/16 (2006.01)

(52) U.S. Cl.
CPC .......... G06F 11/1072 (2013.01); G11C 29/52 (2013.01); H03M 7/16 (2013.01)

(58) Field of Classification Search
CPC ...... H03M 7/16; H03M 13/618; H03M 13/19; G11C 29/028; G11C 11/407; G11C 29/52;
(Continued)

(56) References Cited

U.S. PATENT DOCUMENTS 5,621,682 A 4/1997 Tanzawa et al.
5,719,888 A 2/1998 Tanzawa et al.
(Continued)

FOREIGN PATENT DOCUMENTS

JP 07-234823 A 9/1995
JP 11-088174 A 3/1999
(Continued)

OTHER PUBLICATIONS

International Search Report (Application No. PCT/162018/053962) dated Sep. 11, 2018.
(Continued)

Primary Examiner — Guy J Lamarre
(74) Attorney, Agent, or Firm — Nixon Peabody LLP; Jeffrey L. Costellia

(57) ABSTRACT

A semiconductor device that conducts error detection and correction on multilevel data is provided. The semiconductor device includes a first gray code converter circuit, a second gray code converter circuit, a gray code inverter circuit, an ECC encoder circuit, an ECC decoder circuit, and a memory portion. When input data is retained in the semiconductor device, the first gray code converter circuit converts the input data to data in a gray code format, and the ECC encoder circuit generates inspection data in accordance with the data. The memory portion retains the input data and the inspection data. When the input data that has been retained is output from the semiconductor device, the second gray code converter circuit converts the input data read out (Continued)

from the memory portion into data in a gray code format, and the ECC decoder circuit conducts error detection and correction on the data and the inspection data read out from the memory portion. After that, the gray code inverter circuit converts the corrected data to have the same format as that of the input data.

10 Claims, 26 Drawing Sheets

(58) Field of Classification Search
CPC ... G11C 29/022; G11C 29/023; G11C 11/401; G06F 11/1012; G06F 11/1072
See application file for complete search history.

(56) References Cited

U.S. PATENT DOCUMENTS

| | | | |
|---|---|---|---|
| 5,996,108 | A | 11/1999 | Tanzawa et al. |
| 6,298,459 | B1 | 10/2001 | Tsukamoto |
| 6,653,956 | B2 | 11/2003 | Tsukamoto |
| 6,703,951 | B2 | 3/2004 | Tsukamoto |
| 8,614,916 | B2 | 12/2013 | Nagatsuka et al. |
| 9,240,244 | B2 | 1/2016 | Nagatsuka et al. |
| 9,472,293 | B2 | 10/2016 | Nagatsuka et al. |
| 9,762,249 | B1 * | 9/2017 | Faisal ................... H03L 7/093 |
| 9,773,787 | B2 | 9/2017 | Matsuzaki |
| 10,163,519 | B2 | 12/2018 | Ikeda et al. |
| 10,187,082 | B1 * | 1/2019 | Tee ...................... H03K 23/005 |
| 2001/0043150 | A1 | 11/2001 | Tsukamoto |
| 2007/0040209 | A1 * | 2/2007 | Spadea ............... H01L 29/7393 |
| | | | 257/315 |
| 2013/0145238 | A1 * | 6/2013 | Alhussien .......... H03M 13/1154 |
| | | | 714/786 |
| 2015/0220390 | A1 * | 8/2015 | Liu ................... H03M 13/1575 |
| | | | 714/773 |
| 2016/0350182 | A1 | 12/2016 | Tsutsui |

FOREIGN PATENT DOCUMENTS

| | | |
|---|---|---|
| JP | 2000-132995 A | 5/2000 |
| JP | 2012-129795 A | 7/2012 |
| JP | 2012-256400 A | 12/2012 |
| JP | 2014-199707 A | 10/2014 |
| JP | 2016-224932 A | 12/2016 |
| KR | 2000-0056995 A | 9/2000 |
| KR | 10-0337750 | 5/2002 |

OTHER PUBLICATIONS

Written Opinion (Application No. PCT/IB2018/053962) dated Sep. 11, 2018.

* cited by examiner

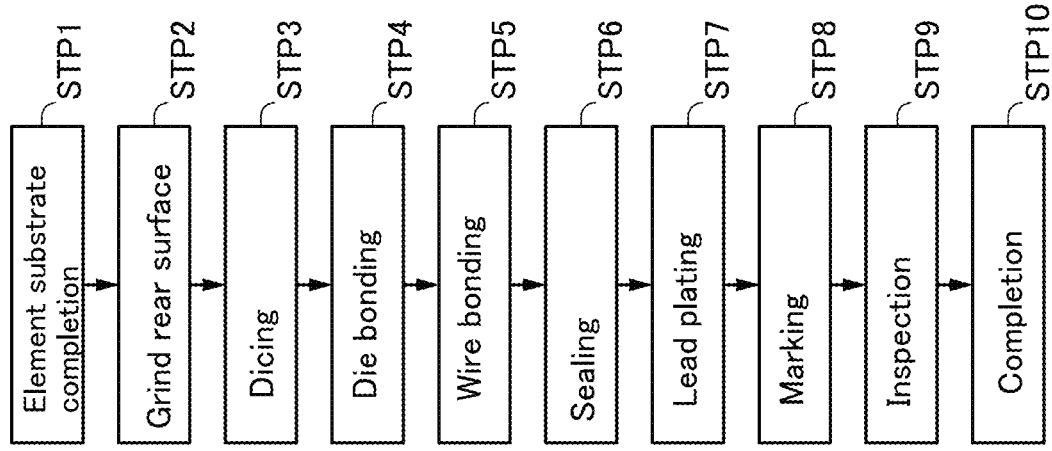
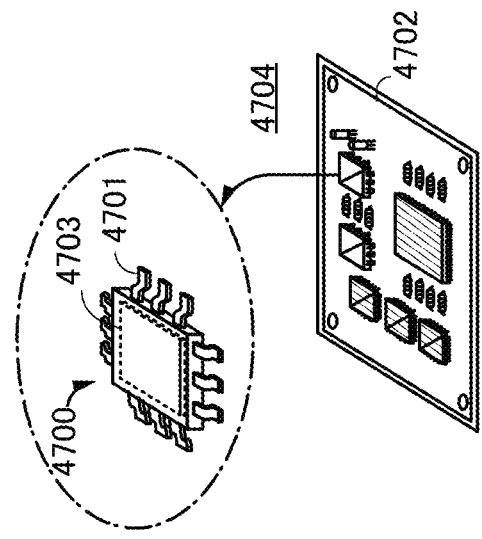
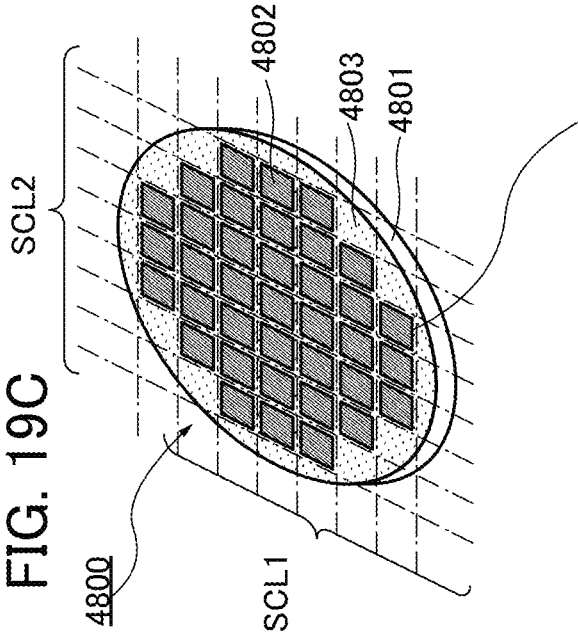
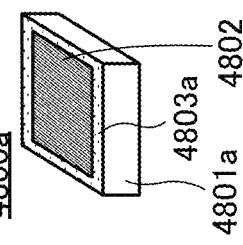
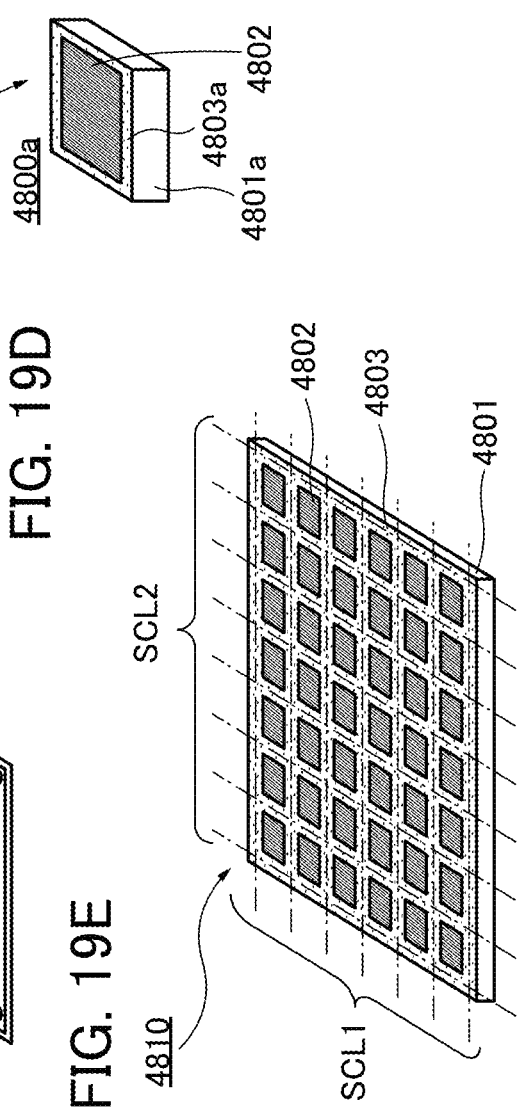
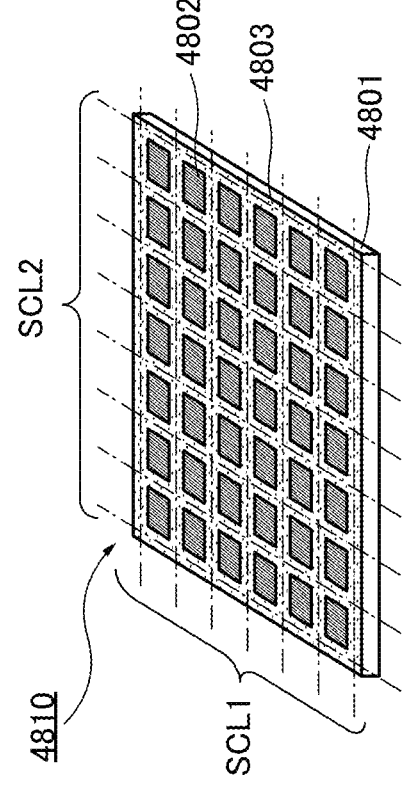

SEMICONDUCTOR DEVICE, SEMICONDUCTOR WAFER, ELECTRONIC DEVICE, AND OPERATION METHOD

TECHNICAL FIELD

One embodiment of the present invention relates to a semiconductor device, a semiconductor wafer, an electronic device, and an operation method.

Note that one embodiment of the present invention is not limited to the above technical field. The technical field of the invention disclosed in this specification and the like relates to an object, a method, or a manufacturing method. Another one embodiment of the present invention relates to a process, a machine, manufacture, or a composition (composition of matter). Therefore, specific examples of the technical field of one embodiment of the present invention disclosed in this specification include a semiconductor device, a display device, a liquid crystal display device, a light-emitting device, a power storage device, an imaging device, a memory device, a processor, an electronic device, a method for driving of them, a method for manufacturing of them, a method for testing of them, or a system thereof.

BACKGROUND ART

In recent years, electronic components such as a central processing unit (CPU), a memory device, and a sensor have been used for a variety of electronic devices such as a personal computer, a smart phone, and a digital camera. The electronic components have been improved in various aspects such as miniaturization and low power consumption.

In particular, the amount of data handled in the above-described electronic devices or the like tends to increase recently, which creates a demand for memory devices having high storage capacity. Patent Document 1 and Patent Document 2 each disclose a semiconductor device enabling writing and reading of multilevel data. In order to achieve a memory device having high storage capacity, a technique for miniaturization of circuits included in the memory device is required.

In addition, in the case where the amount of handled data is large, many errors such that data different from written data is read out occur in some cases. Patent Document 3 discloses a memory system that checks and correct errors in the case where the amount of handled data is large.

REFERENCES

Patent Documents

[Patent Document 1] Japanese Published Patent Application No. 2012-256400
[Patent Document 2] Japanese Published Patent Application No. 2014-199707
[Patent Document 3] Japanese Published Patent Application No. 2016-224932

SUMMARY OF THE INVENTION

Problems to be Solved by the Invention

Data read out from a memory device is subjected to ECC (Error Checking and Correction) processing, whereby whether the data has an error or not is determined. When the error exists, correction is conducted on the data.

As an example of ECC, SECDED (Single-bit Error Correction Double-bit Error Detection) is given. With use of SECDED, error detection and error correction can be conducted on data that is to be processed when the data has only a one-bit error. However, when the data that is to be processed has only two-bit error, error detection can be conducted on the data, but error correction cannot be conducted. When data having a large number of bits is intended to be subject to error detection and error correction, a large number of check digits is necessary.

By the way, in the case of a memory device that can retain multilevel data in one memory cell, distributed threshold voltages the number of which is equated with the number of bits which can be retained in the memory cell are needed. For example, in the case of a memory cell capable of retaining 4 bits, distribution of 16 threshold voltages is needed. In particular, as the number of bits which can be retained is increased, the width of the threshold voltage distribution has to be narrowed. In the case where the distribution width of the threshold voltage is narrow, there is a possibility that deviation of a value of data that is originally retained occurs in reading out the data from the memory cell so that a different value is read out.

For example, there is a case where a value "3" ("011" in binary notation) is retained in a memory cell capable of retaining 3 bits and a value "4" ("100" in binary notation) is read out by deviation from the value of the retained data. In such a manner, there is a case where read-out data is deviated from original data by 1 in decimal notation when a multilevel data is read out from the memory cell.

In particular, in such a case, although a difference between "3" and "4" in decimal notation is only one, values from the first bit to the third bit of each of "011" and "100" in binary notation are completely different. Thus, error detection and error correction by the above-described SECDED cannot be conducted.

An object of one embodiment of the present invention is to provide a novel semiconductor device. Alternatively, an object of one embodiment of the present invention is to provide a system including a novel semiconductor device.

Alternatively, an object of one embodiment of the present invention is to provide a semiconductor device that can conduct error detection and error correction on multilevel data. Alternatively, an object of one embodiment of the present invention is to provide a semiconductor device with reduced power consumption.

Note that the object of one embodiment of the present invention is not limited to the above objects. The above-mentioned objects do not preclude the existence of other objects. Other objects are the ones that are not described in this section and will be described below. The other objects that are not described in this section will be derived from the description of the specification, the drawings, and the like and can be extracted from these descriptions by those skilled in the art. Note that one embodiment of the present invention is to solve at least one of the above-mentioned objects and other objects. Note that in one embodiment of the present invention, the description mentioned above and the other objects do not need to be achieved.

Means for Solving the Problems (1)

One embodiment of the present invention is a semiconductor device including a first gray code converter circuit, a second gray code converter circuit, a gray code inverter circuit, an ECC encoder circuit, an ECC decoder circuit, and a memory portion. The semiconductor device is characterized in that: the first gray code converter circuit is electrically connected to the ECC encoder circuit; the ECC encoder circuit is electrically connected to the memory portion; the memory portion is electrically connected to the second gray code converter circuit; the memory portion is electrically connected to the ECC decoder circuit; the second gray code converter circuit is electrically connected to the ECC decoder circuit; the ECC decoder circuit is electrically connected to the gray code inverter circuit; the first gray code converter circuit has a function of converting first data input to the first gray code converter circuit to have a gray code and outputting the converted data as second data; the ECC encoder circuit has a function of generating first inspection data on the basis of the second data and outputting the first inspection data; the memory portion has a function of retaining the first data and the first inspection data and a function of reading out and outputting the first data as third data and the first inspection data as second inspection data; the second gray code converter circuit has a function of converting the third data to have a gray code and outputting the converted data as a fourth data; the ECC decoder circuit has a function of conducting error detection on the fourth data and the second inspection data, a function of outputting fifth data that is the fourth data subjected to error correction when an error is detected from the fourth data, and a function of outputting the fourth data when an error is not detected from the fourth data; and the gray code inverter circuit has a function of converting the fourth data or the fifth data to have a code format of the first data from the gray code and outputting the converted data.

(2)

Alternatively, one embodiment of the present invention is a semiconductor device including a first gray code converter circuit, a second gray code converter circuit, a first gray code inverter circuit, a second gray code inverter circuit, an ECC encoder circuit, an ECC decoder circuit, and a memory portion. The semiconductor device is characterized in that: the first gray code converter circuit is electrically connected to the ECC encoder circuit; the ECC encoder circuit is electrically connected to the first gray code inverter circuit; the first gray code inverter circuit is electrically connected to the memory portion; the memory portion is electrically connected to the second gray code converter circuit; the second gray code converter circuit is electrically connected to the ECC decoder circuit; the ECC decoder circuit is electrically connected to the second gray code inverter circuit; the first gray code converter circuit has a function of converting first data input to the first gray code converter circuit to have a gray code and outputting the converted data as second data; the ECC encoder circuit has a function of generating first inspection data on the basis of the second data and outputting the inspection data; the first gray code inverter circuit has a function of converting the first inspection data from the gray code to have a code format of the first data and outputting the converted data as second inspection data; the memory portion has a function of retaining the first data and the second inspection data and a function of reading out and outputting the first data as third data and the second inspection data as third inspection data; the second gray code converter circuit has a function of converting the third data to have a gray code and outputting the converted data as fourth data and a function of converting the third inspection data to have a gray code and outputting the converted data as fourth inspection data; the ECC decoder circuit has a function of conducting error detection on the fourth data and the fourth inspection data, a function of outputting fifth data that is the fourth data subjected to error correction when an error is detected from the fourth data, a function of outputting the fourth data when an error is detected from the fourth inspection data, and a function of outputting the fourth data when an error is not detected from the fourth data or the fourth inspection data; and the second gray code inverter circuit has a function of converting the fourth data or the fifth data from the gray code to have a code format of the first data and outputting the converted data.

(3)

Alternatively, one embodiment of the present invention is the semiconductor device in the above (1) or the above (2), characterized in that: the memory portion includes a memory cell; the memory cell includes a transistor; and the transistor includes a metal oxide in a channel formation region.

(4)

Alternatively, one embodiment of the present invention is a semiconductor wafer including the semiconductor device described in any one of the above (1) to (3) and a region for dicing.

(5)

Alternatively, one embodiment of the present invention is an electronic device characterized by including the semiconductor device described in any one of the above (1) to (3) and a housing.

(6)

Alternatively, one embodiment of the present invention is an operation method of a semiconductor device, including first to seventh steps. The semiconductor device includes a first gray code converter circuit, a second gray code converter circuit, a gray code inverter circuit, an ECC encoder circuit, an ECC decoder circuit, and a memory portion. The operation method is characterized in that: the first step includes a step of converting a first data input to the first gray code converter circuit to have a gray code and outputting the converted data as second data by the first gray code converter circuit; the second step has a step of generating first inspection data on the basis of the second data and outputting the first inspection data by the ECC encoder circuit; the third step has a step of retaining the first data and the first inspection data in the memory portion; the fourth step has a step of reading out the third data as first data from the memory portion and a step of reading out second inspection data as the first inspection data from the memory portion; the fifth step has a step of converting third data input to the second gray code converter circuit to have a gray code and outputting the converted data as fourth data by the second gray code converter circuit; the sixth step has a step of conducting error detection on the fourth data and the second inspection data by the ECC decoder circuit, a step of conducting error correction on the fourth data using the second inspection data and outputting the corrected data as fifth data by the ECC decoder circuit when the error is detected from the fourth data, and a step of outputting the fourth data by the ECC decoder circuit when the error is not detected from the fourth data; and the seventh step has a step of converting the fourth data or the fifth data from the gray code to have a code format of the first data and outputting the converted data by the gray code inverter circuit.

(7)

Alternatively, one embodiment of the present invention is an operation method of a semiconductor device, including first to eighth steps and including a first gray code converter circuit, a second gray code converter circuit, a first gray code inverter circuit, a second gray code inverter circuit, an ECC encoder circuit, an ECC decoder circuit, and a memory portion. The operation method is characterized in that: the first step has a step of converting first data input to the first gray code converter circuit to have a gray code and outputting the converted data as second data by the first gray code converter circuit; the second step has a step of generating first inspection data on the basis of the second data and outputting the first inspection data by the ECC encoder circuit; the third step has a step of converting the first inspection data from the gray code to have a code format of the first data and outputting the converted data as second inspection data by the first gray code inverter circuit; the fourth step has a step of retaining the first data and the second inspection data in the memory portion; the fifth step has a step of reading out third data as the first data from the memory portion and a step of reading out third inspection data as the second inspection data from the memory portion; the sixth step has a step of converting third data input to the second gray code converter circuit to have a gray code and outputting the converted data as fourth data by the second gray code converter circuit, and a step of converting third inspection data input to the second gray code converter circuit to have a gray code and outputting the converted data as fourth inspection data by the second gray code converter circuit; the seventh step has a step of conducting error detection on the fourth data and the fourth inspection data by the ECC decoder circuit, a step of conducting error correction on the fourth data using the fourth inspection data and outputting the fourth data as the fifth data by the ECC decoder circuit when the error is detected from the fourth data, and a step of outputting the fourth data by the ECC decoder circuit when the error is not detected from the fourth data; and the eighth step has a step of converting the fourth data or the fifth data from the gray code to have a code format of the first data and outputting the converted data by the second gray code inverter circuit.

Effect of the Invention

With one embodiment of the present invention, a novel semiconductor device can be provided. Alternatively, with one embodiment of the present invention, a system including a novel semiconductor device can be provided.

Alternatively, with one embodiment of the present invention, a semiconductor device which can conduct error detection and error correction on multilevel data can be provided. Alternatively, with one embodiment of the present invention, a semiconductor device with reduced power consumption can be provided.

Note that the effect of one embodiment of the present invention is not limited to the above effects. The above-mentioned effects do not disturb the existence of other effects. Note that other effects are effects that are not described in this section and will be described below. The effects that are not mentioned in this section can be derived from the description of the specification, the drawings, and the like and can be extracted as appropriate from these descriptions by those skilled in the art. One embodiment of the present invention is the one having at least one of the above-mentioned effects and other effects. Therefore, one embodiment of the present invention does not have the effects mentioned above in some cases.

BRIEF DESCRIPTION OF THE DRAWINGS

[FIG. 19] A flow chart showing a manufacturing example of electronic components, perspective views of an electronic component, and perspective views of a semiconductor wafer.

MODE FOR CARRYING OUT THE INVENTION

In this specification and the like, a metal oxide means an oxide of a metal in a broad expression. Metal oxides are classified into an oxide insulator, an oxide conductor (including a transparent oxide conductor), an oxide semiconductor (also simply referred to as an OS), and the like. For example, in the case where a metal oxide is used in an active layer of a transistor, the metal oxide is referred to as an oxide semiconductor in some cases. That is, in the case where a metal oxide forms a channel formation region of a transistor having at least one of an amplifying function, a rectifying function, and a switching function, the metal oxide can be called a metal oxide semiconductor or an OS for short. Furthermore, in the case where there is description of an OS FET (or an OS transistor), the metal oxide can also be referred to as a transistor including a metal oxide or an oxide semiconductor.

Embodiment 1

In this embodiment, a semiconductor device that is one embodiment of the present invention will be described.

Structure Example 1

Figure 1:
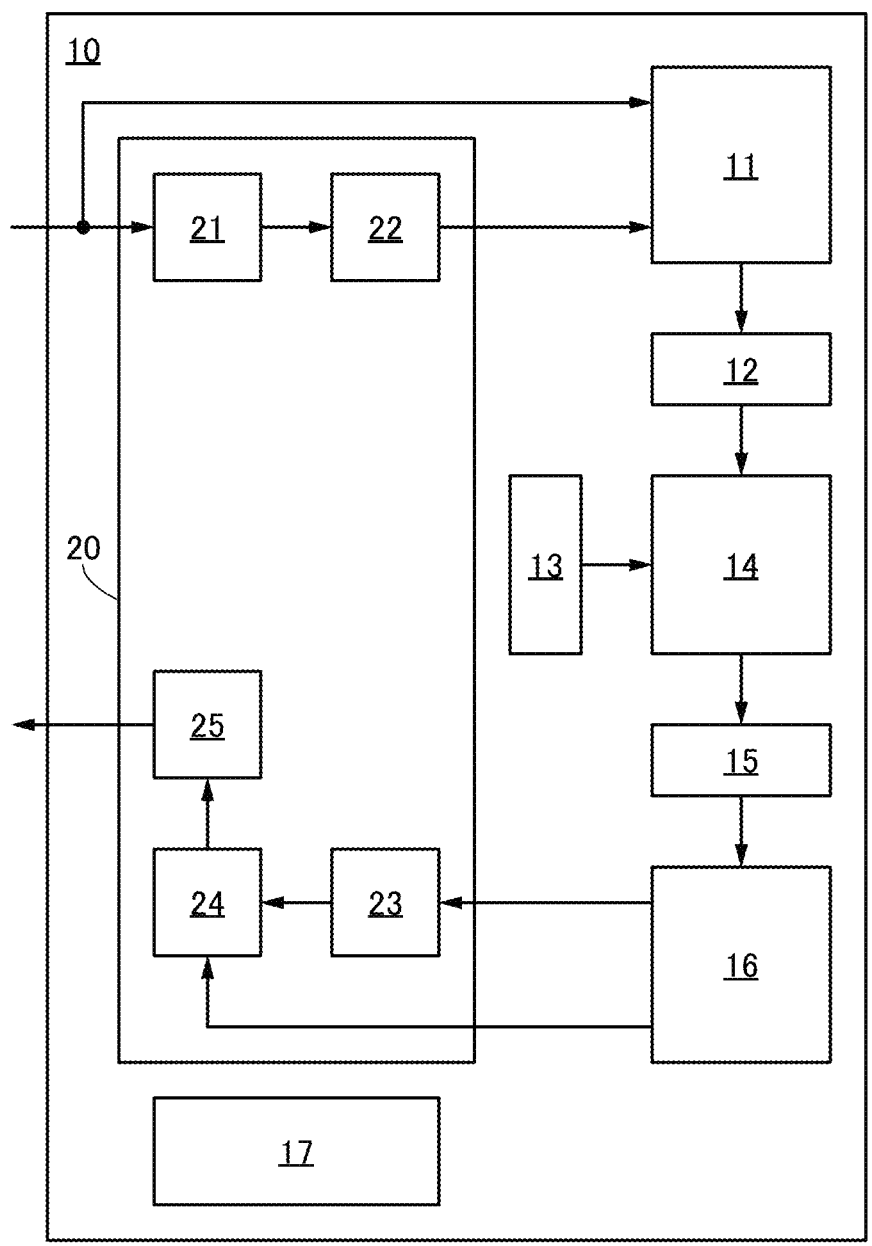
[FIG. 1] A block diagram showing an example of a semiconductor device.

FIG. 1 is a block diagram illustrating a semiconductor device of one embodiment of the present invention. A semiconductor device 10 includes a digital-analog converter circuit 11, a writing circuit 12, a row driver 13, a memory cell array 14, a reading circuit 15, an analog-digital converter circuit 16, a power-supply unit 17, and a control portion 20. In this specification and the like, the digital-analog converter circuit 11, the writing circuit 12, the row driver 13, a memory cell array 15, and the analog-digital circuit 16 are collectively referred to as a memory portion in some cases.

The control portion 20 includes a gray code converter circuit 21, an ECC encoder circuit 22, a gray code converter circuit 23, an ECC decoder circuit 24, and a gray code inverter circuit 25.

The semiconductor device 10 can be formed as one semiconductor chip, for example. Note that although the control portion 20 is included in the semiconductor device 10 in FIG. 1, a structure where the control portion 20 is provided outside the semiconductor device 10 may be employed.

The digital-analog converter circuit 11 has a function of converting input digital data into analog data and a function of transmitting the analog data to the writing circuit 12.

The writing circuit 12 has a function of transmitting the analog data transmitted from the digital-analog converter circuit 11 to the memory cell array 14. Note that the writing circuit 12 also has a function of dividing the analog data into a plurality of columns of the memory cell array 14 when transmitting the analog data.

The row driver 13 has a function of transmitting a signal for selecting a memory cell where the analog data is to be written to the memory cell array 14. In addition, the row driver 13 has a function of transmitting a selection signal for reading the analog data to the memory cell array 14.

The memory cell array 14 has memory cells arranged in a matrix, for example, m memory cells in the column direction and n memory cells in the row directions (each of m and n is an integer greater than or equal to 1). Note that in one embodiment of the present invention, the memory cell has a function of retaining multilevel data.

The reading circuit 15 has a function of reading the analog data retained in the memory cell of the memory cell array 14.

The analog-digital converter circuit 16 has a function of converting the analog data, which has been retained in the memory cell and read by the reading circuit 15, into digital data.

The power-supply unit 17 has a function of supplying a predetermined voltage to each circuit included in the semiconductor device 10. Note that in FIG. 1, wirings which show electrical connection between the power-supply unit 17 and each wiring are omitted.

Next, the control portion 20 and its structure example are described.

The control portion 20 has a function of converting data input to the semiconductor device 10 to have an appropriate format and transmitting the converted data to the digital-analog converter circuit 11 and a function of restoring the data read out from the memory cell array 14 to have the code format at the time when the data has been input and outputting the data to the outside of the semiconductor device 10. In this embodiment, data to be input and data to be output are described on the assumption that they have a binary code format.

The gray code converter circuit 21 has a function of converting data having a binary code, which is input to the semiconductor device 10, into data having a gray code.

The ECC encoder circuit 22 has a function of generating an error correction code corresponding to the data input to the ECC encoder circuit 22.

The gray code converter circuit 23 has a function of converting data having a binary code, which is output from the analog-digital converter circuit 16, to have a gray code.

The ECC decoder circuit 24 has a function of conducting error detection and error correction on the data that has been converted to have a gray code by the gray code converter circuit 23 with use of the error correction code read out from the memory cell array 14. Note that the data subjected to error detection and error correction is output as a gray code.

The gray code inverter circuit 25 has a function of converting the data having a gray code, which is output from the ECC decoder circuit 24, into data having a binary code and outputting the converted data to the outside of the semiconductor device 10.

Although FIG. 1 shows a structure where the control portion 20 is included in the semiconductor device 10, one embodiment of the present invention is not limited thereto. For example, a structure may be employed in which the control portion 20 is provided outside the semiconductor device 10 and various data conversion is performed outside the semiconductor device 10.

Operation Example of Structure Example 1

Figure 2:
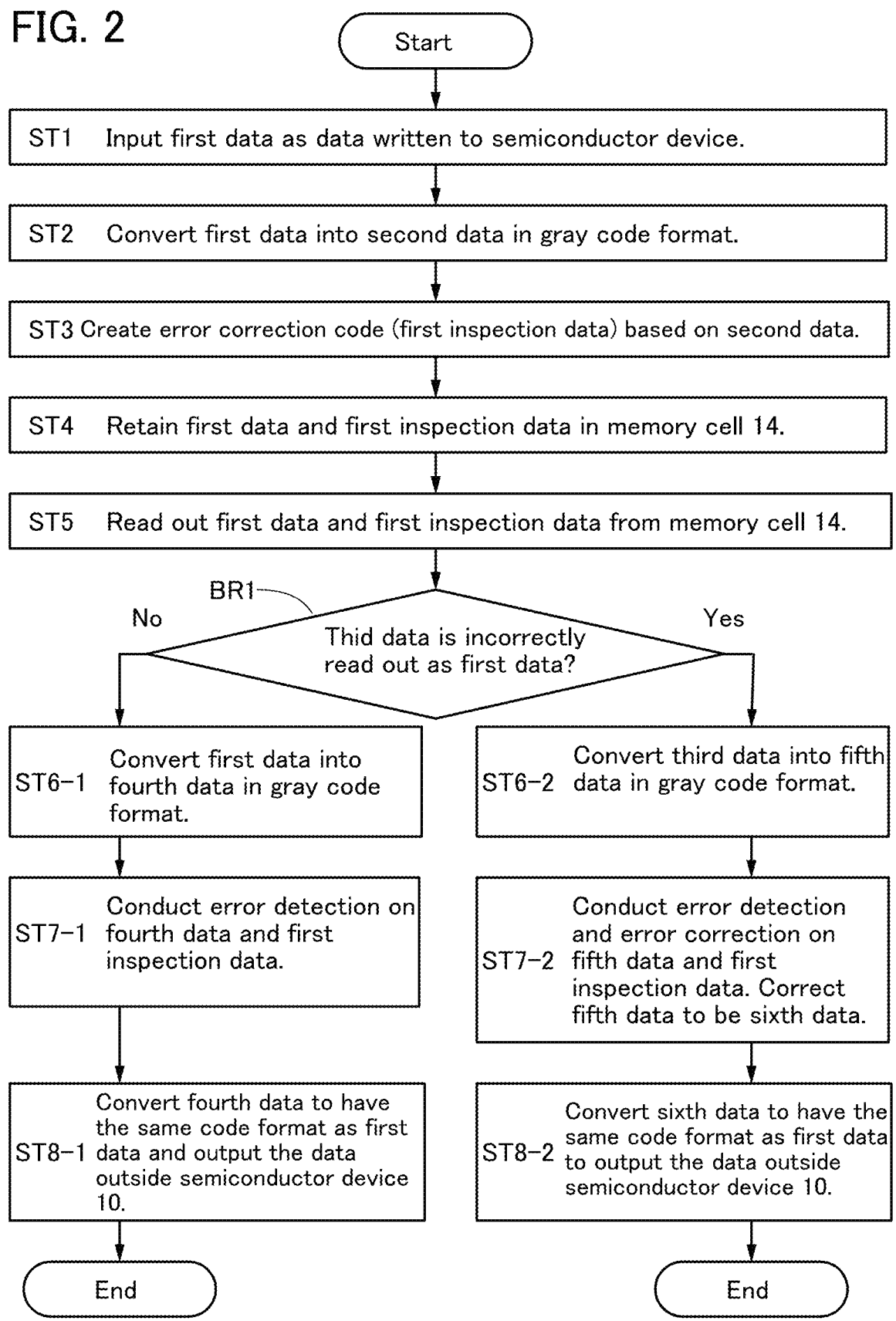
[FIG. 2] A flow chart showing an operation example of a semiconductor device.

Next, an operation example of the semiconductor device 10 is specifically described. A flow chart shown in FIG. 2 shows the operation example of the semiconductor device 10. The flow chart shown in FIG. 2 is branched at Step BR1, which does not mean that the operation after Step BR1 conducted by the semiconductor device 10 differs depending on the correctness of data, but means only a difference of whether a value of data read out from the memory cell array 14 is a correct value or a different value from the original value. Thus, operations conducted in Step ST 6-1 and Step ST 6-2 after Step BR1 are similar to each other. In addition, operations conducted in Step ST 7-1 and Step ST 7-2 are similar to each other, and operations conducted in Step ST 8-1 and Step ST 8-2 also are similar to each other. Note that the determination of the data correctness is conducted by the ECC decoder circuit 24 in Step ST 7-1 or Step ST 7-2.

Note that in this operation example, 4-bit values can be retained in the memory cell included in the memory cell array 14 of the semiconductor device 10.

[Step ST1]

First, a case of writing data to the semiconductor device 10 is considered. As data to be written, for example, data as a binary code of "0011" (binary notation) (hereinafter, referred to as first data) is supposed to be input to the semiconductor device 10. The first data is input to the digital-analog converter circuit 11 and the gray code converter circuit 21.

[Step ST2]

The first data "0011" is converted into data having a gray code format by the gray code converter circuit 21. Specifically, the first data "0011" is turned into "0010" (hereinafter, referred as second data) by conversion into a gray code. Then, the second data "0010" is input to the ECC encoder circuit 22.

[Step ST3]

The second data "0010" is input to the ECC encoder circuit 22, whereby an error correction code corresponding to the second data is generated. Note that in this operation example, the error correction code is an inspection bit portion of a hamming code. The hamming code corresponding to the second data "0010" is a product of the second data "0010" and a generator matrix G. For example, the generator matrix G is defined as follows:

[Formula 1]

$$G = \begin{pmatrix} 1 & 0 & 0 & 0 & 1 & 1 & 0 \\ 0 & 1 & 0 & 0 & 0 & 1 & 1 \\ 0 & 0 & 1 & 0 & 1 & 0 & 1 \\ 0 & 0 & 0 & 1 & 1 & 1 & 1 \end{pmatrix} \quad (E1)$$

Then, from the product of the second data "0010" and the generator matrix G, the hamming code corresponding to the data is determined. Note that the calculation of the sum of the matrix in this embodiment is performed as exclusive OR.

[Formula 2]

$$(0\ 0\ 1\ 0) \cdot G = (0\ 0\ 1\ 0\ 1\ 0\ 1) \quad (E2)$$

The hamming code is constructed of an information bit portion and the inspection bit portion. In the hamming code shown in Formula (E2), the information bit portion indicates values from the leftmost column to the fourth column, "0010", and the inspection bit portion indicates values from the rightmost column to the third column, "101". Thus, the error correction code described in this operation example is "101" (hereinafter, referred to as first inspection data). The first inspection data "101" is input to the digital-analog converter circuit 11.

[Step ST4]

Through the above operation, the first data "0011" and the first inspection data "101" are input to the digital-analog converter circuit 11. Each of the data is converted from a digital value to an analog value by the digital-analog converter circuit 11. The data converted into the analog value is transmitted to the writing circuit 12.

Note that when digital-value data is converted into analog-value data, the converted data is supposed to be represented by an analog value; however, for clear explanation, even data converted into an analog value is represented by an original digital value in this specification and the like for convenience.

The first data "0011" and the first inspection data "101", which are converted into analog values, are transmitted to the memory cell array 14 by the writing circuit 12. At this time, the first data "0011" and the first inspection data "101" can be retained in the memory cell of the memory cell array 14 by a selectin signal transmitted from the row driver 13 to the memory cell array 14.

[Step ST5, Step BR1]

Next, the case where the first data "0011" and the first inspection data "101" are read out from the semiconductor device 10 is described. Note that, here, will be described two cases: a case where the first data "0011" and the first inspection data "101" are read out normally (No), and a case where the first inspection data "101" is read out normally, and the first data "0011" is not read out normally but "0100" (hereinafter, referred to as third data) deviated from the first data "0011" by one in decimal notation is read out (Yes).

<<Case where First Data is Normally Read Out>>

The first data "0011" and the first inspection data "101" retained in the memory cell array 14 are read out by the reading circuit 15. The read data is each transmitted to the analog-digital converter circuit 16.

The analog-digital converter circuit 16 conducts conversion on each of the first data "0011" and the first inspection data "101" from an analog value into a digital value. The first data "0011" converted into a digital value is transmitted to the gray code converter circuit 23, and the first inspection data "101" converted into a digital value is transmitted to the ECC decoder circuit 24.

[Step ST6-1]

The first data "0011" is converted into "0010" of a gray code (hereinafter, referred to as fourth data) by the gray code converter circuit 23. The fourth data "0010" is transmitted to the ECC decoder circuit 24.

[Step ST 7-1]

Whether the data read from the memory cell array 14 is correct or not is determined by the ECC decoder circuit 24 with use of the transmitted first inspection data "101" and fourth data "0010". At this point, a hamming code "0010101" is composed of the fourth data "0010" as a high-order bit and the first inspection data "101" as a low-order bit. The determination is conducted by finding a product of the hamming code "0010101" and a transposed matrix of a check matrix H in the ECC decoder circuit 24. The check matrix H is a non-zero matrix satisfying the following Formula (E3) and Formula (E4).

[Formula 3]

$$H \cdot {}^t G = \begin{pmatrix} 0 & 0 & 0 & 0 \\ 0 & 0 & 0 & 0 \\ 0 & 0 & 0 & 0 \end{pmatrix} \quad (E3)$$

[Formula 4]

$$G \cdot {}^t H = \begin{pmatrix} 0 & 0 & 0 \\ 0 & 0 & 0 \\ 0 & 0 & 0 \\ 0 & 0 & 0 \end{pmatrix} \quad (E4)$$

Therefore, the check matrix H is represented by the following formula.

[Formula 5]

$$H = \begin{pmatrix} 1 & 0 & 1 & 1 & 1 & 0 & 0 \\ 1 & 1 & 0 & 1 & 0 & 1 & 0 \\ 0 & 1 & 1 & 1 & 0 & 0 & 1 \end{pmatrix} \quad (E5)$$

As a result, the product of the hamming code "0010101" and the transposed matrix of the check matrix H is represented by the following formula.

[Formula 6]

$$(0\ 0\ 1\ 0\ 1\ 0\ 1) \cdot {}^tH = (0\ 0\ 0) \quad (E6)$$

According to Formula (E6), the product of the hamming code "0010101" and the transposed matrix of the check matrix H is (000), which indicates that the fourth data "0010" and the first inspection data "101" are correct data. That is, the first data "0011" and the first inspection data "101" are data normally read out from the memory cell array 14.

[Step ST 8-1]

Next, the fourth data "0010" is transmitted to the gray code inverter circuit 25. The fourth data "0010" is subjected to conversion from a gray code into a binary code by the gray code inverter circuit 25. Thus, the fourth data "0010" as a gray code is converted into "0011" as a binary code. This value is the same as the input first data "0011". In other words, the read and output data coincides with the input and retained data, which indicates that the correct data is output from the semiconductor device 10. The first data "0011" is output outside the semiconductor device 10, whereby the reading operation of the semiconductor device 10 is completed.

<<Case where First Data is Incorrectly Read Out>>

When the first data "0011" and the first inspection data "101" retained in the memory cell array 14 are read by the reading circuit 15, as described above, not the first data "0011" but third data "0100" that is a value deviated from the first data "0011" by 1 in decimal notation is supposed to be read out. The read data is each transmitted to the analog-digital converter circuit 16.

The analog-digital converter circuit 16 conducts conversion on each of the third data "0100" and the first inspection data "101" from an analog value into a digital value. The third data "0100" converted in a digital value is transmitted to the gray code converter circuit 23, and the first inspection data "101" converted in a digital value is transmitted to the ECC decoder circuit 24.

[Step ST 6-2]

At this time, the third data "0100" is turned into "0110" (hereinafter, referred to as fifth data) by conversion from a binary code into a gray code by the gray code converter circuit 23. The fifth data "0110" is transmitted to the ECC decoder circuit 24.

[Step ST 7-2]

Whether the data read out from the memory cell array 14 is correct or not is determined by the ECC decoder circuit 24 with use of the first inspection data "101" and the fifth data "0110". At this point, a hamming code "0110101" is composed of the fifth data "0110" and the first inspection data "101". The determination is conducted by finding a product of the hamming code "0110101" and the transposed matrix of the check matrix H in the ECC decoder circuit 24.

[Formula 7]

$$(0\ 1\ 1\ 0\ 1\ 0\ 1) \cdot {}^tH = (0\ 1\ 1) \quad (E7)$$

According to Formula (E7), the product of the hamming code "0110101" and the check matrix H is (011) which coincides with a value in the second column of the check matrix H. This indicates that the value in the second column from the left of the hamming code "0110101" is wrong. In other words, the ECC decoder circuit 24 can determine that the value in the second column from the left of the fifth data "0110" as a gray code is wrong, and the third data "0100" is data deviated from the originally retained data by one in decimal notation at the time of reading out from the memory cell array 14.

Since it is revealed that the value in the second column from the left of the fifth data "0110" is wrong, the ECC decoder circuit 24 can correct the value in the second column from the left of the fifth data "0110" to be "0010" (hereinafter, referred to as sixth data). In particular, the fifth data is in a gray code, and a value of the fifth data is deviated only by one in decimal notation; thus, only a change of 1-bit value is enough for the correction of the fifth data.

[Step ST 8-2]

Next the sixth data "0010" is transmitted to the gray code inverter circuit 25. Conversion of the sixth data "0010" from a gray code into a binary code is conducted by the gray code inverter circuit 25. Accordingly, the sixth data "0010" as a gray code is converted into "0011" as a binary code. This is the same value as the input first data "0011". In other words, the read-out and output data coincides with the input and retained data, which indicates that the correct data is output from the semiconductor device 10. "0011" is output outside of the semiconductor device 10, whereby the reading operation of the semiconductor device 10 is completed.

As described above, when multilevel data retained in the memory cell array 14 is read out from the memory cell array 14, the multilevel data can be output as a normal data (data without errors) from the semiconductor device 10.

Note that although the hamming code is used for generation of an error correction code in this operation example, an extension hamming code may be used instead. With use of the extension hamming code, detection of 1-bit errors and correction of their error, or detection of 2-bit errors can be conducted. If an error correction code is generated using the extension hamming code in this operation example, the error correction code is 4 bits.

Note that although the hamming code is used for generation of the error correction code in the operation example of Structure example 1, another sign for error detection and/or error correction may be used.

Structure Example 2

Figure 3:
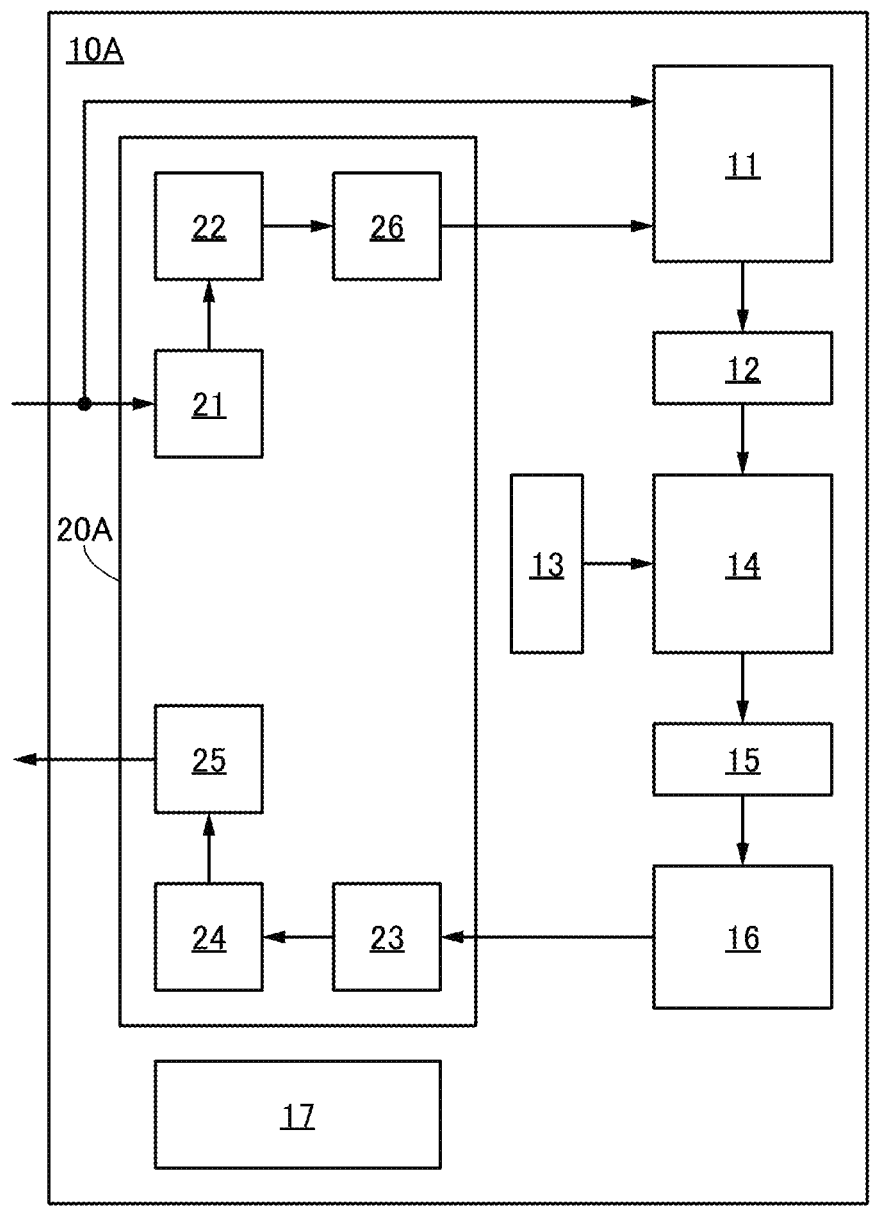
[FIG. 3] A block diagram showing an example of a semiconductor device.

FIG. 3 is a block diagram illustrating a semiconductor device that is a different structure example from the semiconductor device 10 illustrated in FIG. 1. A semiconductor device 10A includes the digital-analog converter circuit 11, the writing circuit 12, the row driver 13, the memory cell array 14, the reading circuit 15, the analog-digital converter circuit 16, the power-supply unit 17, and a control portion 20A.

The control portion 20A includes the gray code converter circuit 21, the ECC encoder circuit 22, the gray code converter circuit 23, the ECC decoder circuit 24, the gray code inverter circuit 25, and a gray code inverter circuit 26. Note that the control portion 20A includes the gray code inverter circuit 26, which is a different point from the control portion 20.

Hereinafter, regarding the circuits included in the semiconductor device 10A, this structure example omits the description of portions that can be used as the circuits with the same reference numerals as those in the semiconductor device 10, and only describes different portions from the circuits included in the semiconductor device 10.

The gray code inverter circuit 26 has a function of inverting a gray code of the data output from the ECC encoder circuit 22 and transmitting the inverted data to the digital-analog converter circuit 11.

The ECC decoder circuit 24 has a function of conducting error check and error correction on the data read out from the memory cell array 14 with use of an error correction code included in the data input to the ECC decoder circuit 24.

Note that although FIG. 3 shows a structure where the control portion 20A is included in the semiconductor device 10A, one embodiment of the present invention is not limited thereto. For example, a structure may be employed in which the control portion 20A is provided outside the semiconductor device 10A and various data conversion is performed outside the semiconductor device 10A.

Operation Example 1 of Structure Example 2

Figure 4:
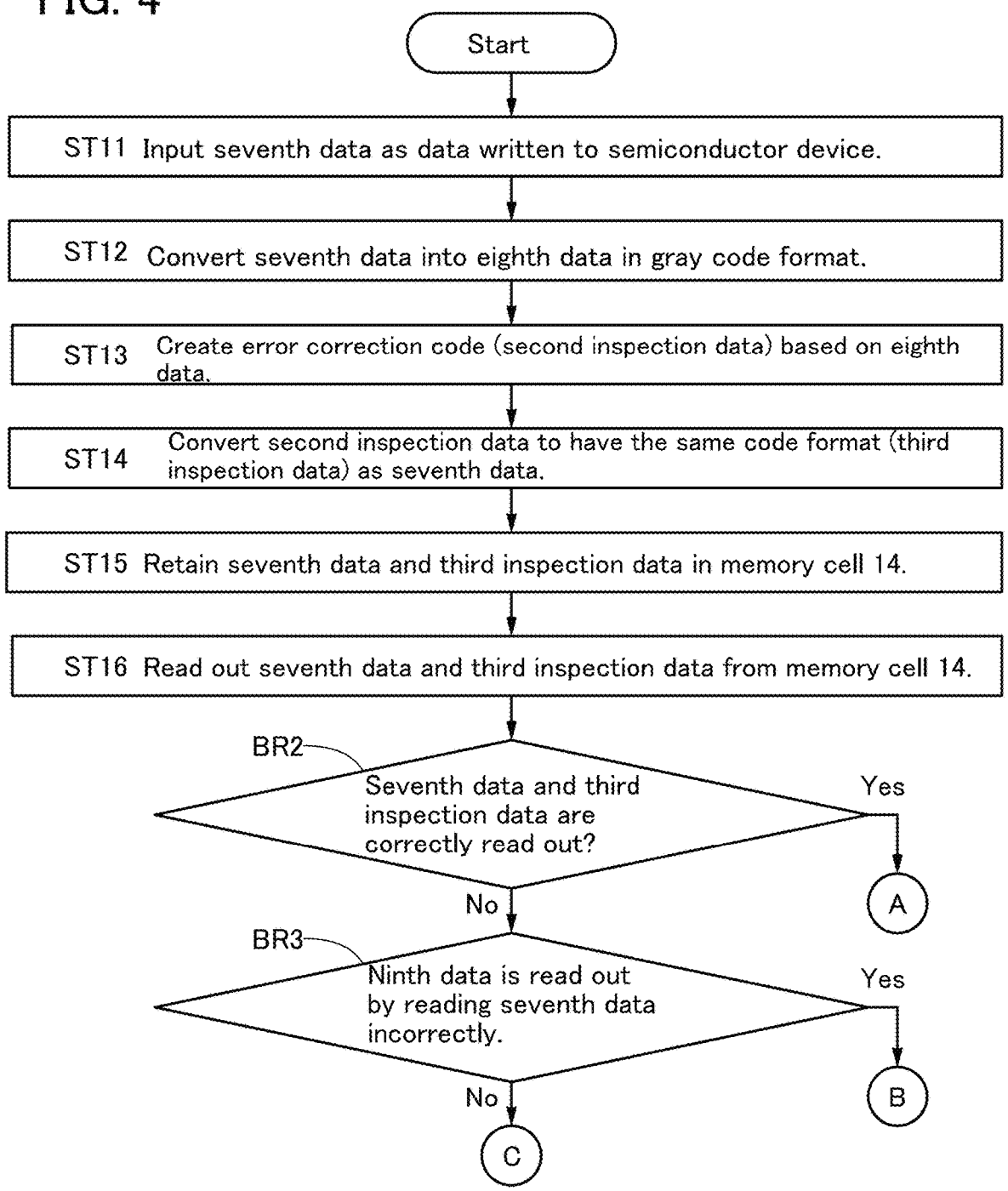
[FIG. 4] A flow chart showing an operation example of a semiconductor device.
Figure 5:
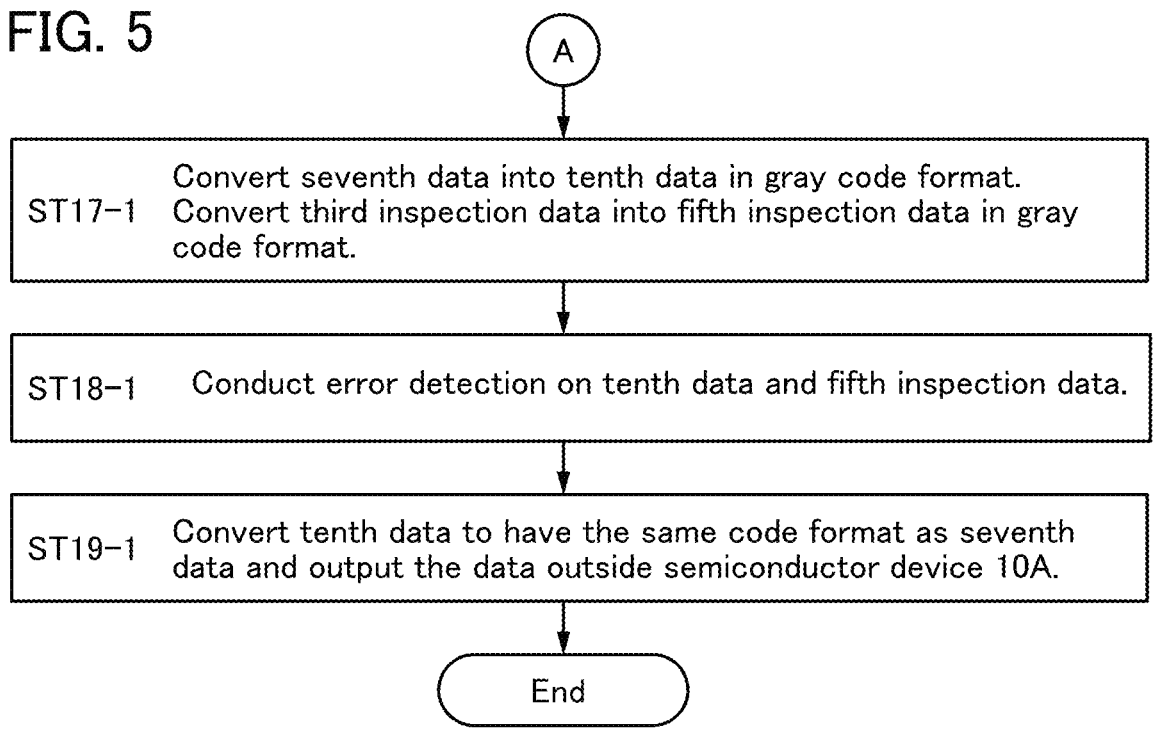
[FIG. 5] A flow chart showing an operation example of a semiconductor device.
Figure 6:
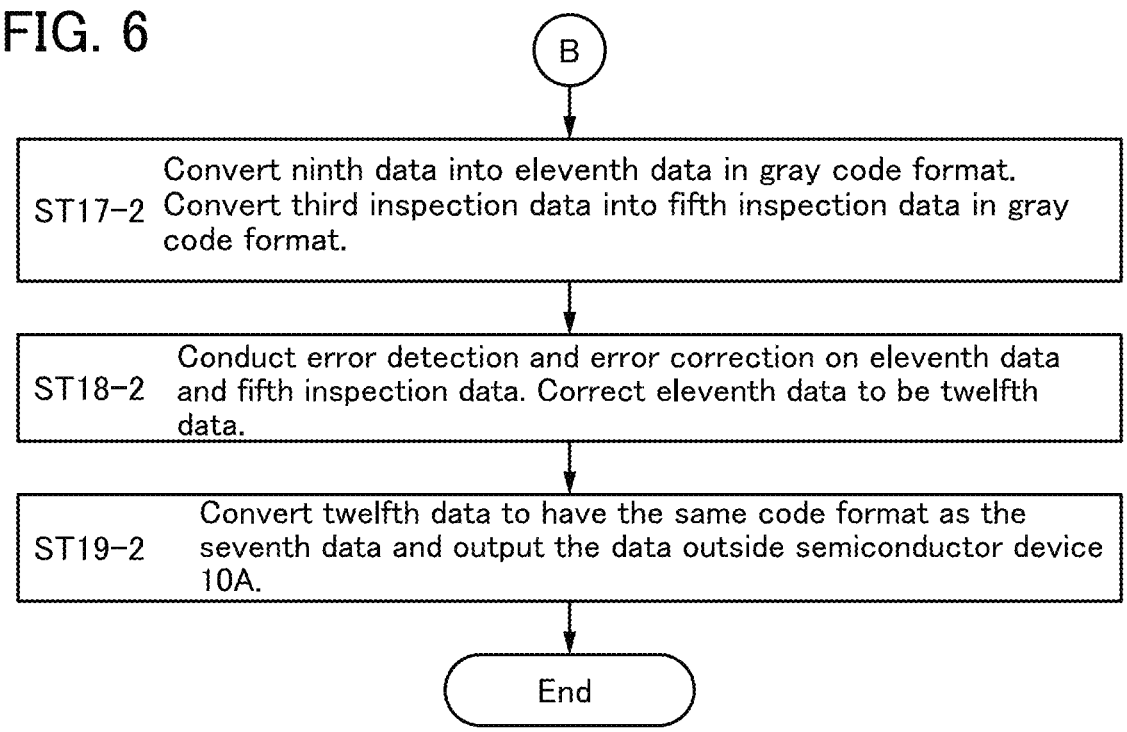
[FIG. 6] A flow chart showing an operation example of a semiconductor device.
Figure 7:
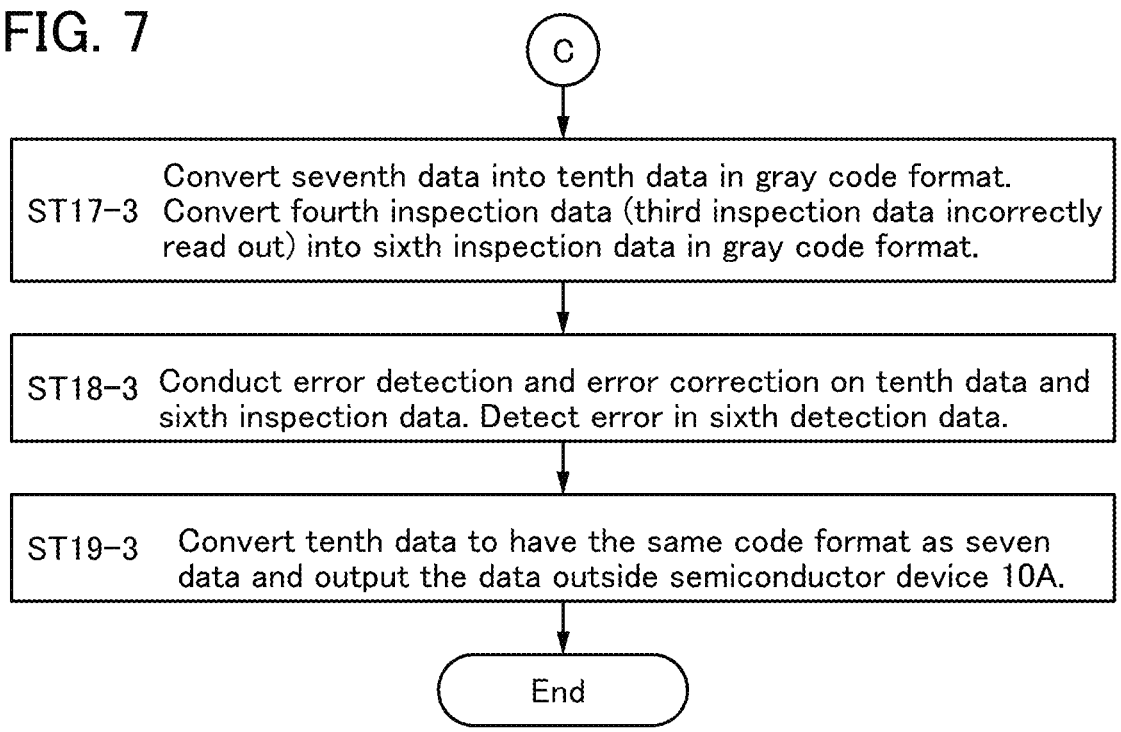
[FIG. 7] A flow chart showing an operation example of a semiconductor device.

Next, an operation example of the semiconductor device 10A will be specifically described. The flow charts shown in FIG. 4 to FIG. 7 show an operation example of the semiconductor device 10A. A illustrated in FIG. 4 signifies the transition to A illustrated in FIG. 5, B illustrated in FIG. 4 signifies the transition to B illustrated in FIG. 6, and C illustrated in FIG. 4 signifies the transition to C illustrated in FIG. 7. The flow chart shown in FIG. 4 is branched at Step BR2 and Step BR3, which does not mean that the operation after Step BR2 or Step BR3 conducted by the semiconductor device 10A differs depending on the correctness of data, but means only a difference of whether a value of data read out from the memory cell array 14 is a correct value or a different value from the original value. Thus, in Step ST 17-1, Step ST 17-2, and Step ST 17-3, similar operations are conducted. In addition, in Step ST 18-1, Step ST 18-2, and Step ST 18-3 similar operations are conducted, and in Step ST 19-1, Step ST 19-2, and Step ST 19-3 similar operations are conducted.

Note that in this operation example, the memory cell in the memory cell array 14 of the semiconductor device 10A can retain 4-bit values.

[Step ST11]

First, a case of writing data to the semiconductor device 10A is considered. As the written data, for example, data of a binary code "0100" (binary notation) (hereinafter, referred to as seventh data) is input to the semiconductor device 10A. The seventh data is input to the digital-analog converter circuit 11 and the gray code converter circuit 21.

[Step ST12]

The seventh data is turned to be a gray code by the gray code converter circuit 21. Specifically, the seventh data "0100" is converted into a gray code, thereby being "0110" (hereinafter, referred to as eighth data). Then, the eighth data "0110" is input to the ECC encoder circuit 22.

[Step ST13]

The eighth data "0110" is input to the ECC encoder circuit 22, whereby an error correction code corresponding to the eighth data is generated. Note that in this operation example, the error correction code corresponds to an inspection bit portion of an extension hamming code. The extension hamming code corresponding to the eighth data "0110" can be generated by obtaining a product of the eighth data "0110" and the generator matrix G and adding exclusive OR of all bits of the product (codeword) to the end of the product.

For example, when the generator matrix G is represented by the above-described Formula (E1), the product of the eighth data "0110" and the generator matrix G can be calculated as follows.

[Formula 8]

$$(0\ 1\ 1\ 0) \cdot G = (0\ 1\ 1\ 0\ 1\ 1\ 0) \tag{E8}$$

Then, the exclusive OR of all bits in the calculated codeword (Formula (E8)) is added to the end of the codeword, whereby the extension hamming code can be obtained. In this case, the extension hamming code corresponding to the eighth data "0110" is "01101100". Note that the extension hamming code is also composed of an information bit portion and an inspection bit portion. The information bit portion corresponds to values in columns up to the fourth column from left, "0110", and the inspection bit portion corresponds to values in columns up to the fourth column from right, "1100". Thus, the error correction code described in this operation example is "1100" (hereinafter, referred to as second inspection data). The second inspection data "1100" is input to the gray code inverter circuit 26.

[Step ST14]

The second inspection data "1100" is converted from a gray code into a binary code by the gray code inverter circuit 26. Thus, the second inspection data "1100" that is a gray code is converted into "1000" (hereinafter, referred to as third inspection data) as a binary code.

[Step ST15]

Through the above operation, the seventh data "0100" and the third inspection data "1000" are input to the digital-analog converter circuit 11. Each of the data is converted from a digital value to an analog value by the digital-analog converter circuit 11. The data converted into the analog value is transmitted to the writing circuit 12.

The seventh data "0100" and the third inspection data "1000" converted into the analog values are transmitted to the memory cell array 14 by the writing circuit 12. At this time, the seventh data "0100" and the third inspection data "1000" can be retained in the memory cell of the memory cell array 14 by a selection signal transmitted from the row driver 13 to the memory cell array 14.

[Step ST16, Step BR2, Step BR3]

Next, the case where the seventh data "0100" and the third inspection data "1000" are read out from the semiconductor device 10 is described. Note that, here, will be described three cases: a case where the seventh data "0100" and the third inspection data "1000" are normally read out; a case where while the third inspection data "1000" is normally read out, the seventh data "0100" is not normally read out but "0011" (hereinafter, referred to as ninth data) deviated from the seventh data "0100" by one in decimal notation is read out; and a case where while the seventh data "0100" is normally read out, "0111" (hereinafter, referred to as fourth inspection data) deviated from the third inspection data "1000" by one in decimal notation is read out.

<<Case where Seventh Data and Third Inspection Data are Normally Read Out>>

By the reading circuit 15, the seventh data "0100" and the third inspection data "1000" retained in the memory cell array 14 are read out. Each of the read-out data is transmitted to the analog-digital converter circuit 16.

The analog-digital converter circuit 16 conducts conversion of each of the seventh data "0100" and the third inspection data "1000" from an analog value into a digital value. Both the seventh data "0100" and the third inspection data "1000" converted into digital values are transmitted to the gray code converter circuit 23.

[Step ST17-1]

By the gray code converter circuit 23, the seventh data "0100" is converted into a gray code "0110" (hereinafter, referred to as tenth data), and the third inspection data "1000" is converted into a gray code "1100" (hereinafter, referred to as fifth inspection data). Then, the tenth data "0110" and the fifth inspection data "1100" are transmitted to the ECC decoder circuit 24.

[Step ST18-1]

By the ECC decoder circuit 24, whether the data read out from the memory cell array 14 is correct or not is determined with use of the transmitted tenth data "0110" and fifth inspection data "1100". At this point, an extension hamming code "01101100" is composed of the tenth data "0110" as a high-order bit and the fifth inspection data "1100" as a low-order bit. The determination is conducted by calculating a product of the extension hamming code "01101100" and a transposed matrix of the check matrix H in the ECC decoder circuit 24. The check matrix H is represented by the following formula.

[Formula 9]

$$H = \begin{pmatrix} 1 & 0 & 1 & 1 & 1 & 0 & 0 & 0 \\ 1 & 1 & 0 & 1 & 0 & 1 & 0 & 0 \\ 0 & 1 & 1 & 1 & 0 & 0 & 1 & 0 \\ 1 & 1 & 1 & 1 & 1 & 1 & 1 & 1 \end{pmatrix} \quad (E9)$$

Thus, the product of the extension hamming code "01101100" and the transposed matrix of the check matrix H is as follows.

[Formula 10]

$$(0\ 1\ 1\ 0\ 1\ 1\ 0\ 0) \cdot {}^t H = (0\ 0\ 0\ 0) \quad (E10)$$

According to Formula (E10), the product of the extension hamming code "01101100" and the transposed matrix of the check matrix H is (0000), which indicates that the tenth data "0110" and the fifth inspection data "1100", which are gray codes, are data without errors. That is, it can be said that the seventh data "0100" and the third inspection data "1000" are data normally read out from the memory cell array 14.

[Step ST19-1]

Next, the tenth data "0110" is transmitted to the gray code inverter circuit 25. Thus, conversion is conducted on the tenth data "0110" that is a gray code from a gray code into a binary code. Thus, the tenth data "0110" that is a gray code is converted into a binary code "0100". This is the same value as the input seventh data "0100". In other words, the read-out and output data coincides with the input and retained data, which indicates that correct data is output from the semiconductor device 10A. "0100" is output outside the semiconductor device 10A, whereby the reading operation of the semiconductor device 10A is completed.

<<Case where Seventh Data is Incorrectly Read Out>>

When the seventh data "0100" and the third inspection data "1000" that are retained in the memory cell array 14 are read out by the reading circuit 15, as described above, not the seventh data "0100" but the ninth data "0011" deviated from the seventh data "0100" is read out. Each of the read-out data is transmitted to the analog-digital converter circuit 16.

The analog-digital converter circuit 16 conducts conversion of each of the ninth data "0011" and the third inspection data "1000" from an analog value into a digital value. The ninth data "0011" and the third inspection data "1000" which are converted into the digital values are transmitted to the gray code converter circuit 23.

[Step ST17-2]

By the gray code converter circuit 23, the ninth data "0011" is converted into "0010" having a gray code (hereinafter, referred to as eleventh data), and the third inspection data "1000" is converted into the fifth inspection data "1100" having a gray code. Then, the eleventh data "0010" and the fifth inspection data "1100" are transmitted to the ECC decoder circuit 24.

[Step ST18-2]

By the ECC decoder circuit 24, whether the data read out from the memory cell array 14 is correct or not is determined with use of the transmitted eleventh data "0010" and fifth inspection data "1100". At this point, an extension hamming code "00101100" is composed of the eleventh data "0010" as a high-order bit and the fifth inspection data "1100" as a low-order bit. The determination is conducted by calculating a product of the extension hamming code "00101100" and the transposed matrix of the check matrix H in the ECC decoder circuit 24.

[Formula 11]

$$(0\ 0\ 1\ 0\ 1\ 1\ 0\ 0) \cdot {}^t H = (0\ 1\ 1\ 1) \quad (E11)$$

According to Formula (E11), the product of the hamming code "00101101" and the transposed matrix of the check matrix H is (0111), which coincides with a value in the second column from the left of the check matrix H. This indicates that the value in the second column from the left of the hamming code "00101101" is wrong. In other words, the ECC decoder circuit 24 can determine that only a bit in the second column from the left of the eleventh data "0010" as a gray code is wrong, and the ninth data "0011" is data deviated by one in decimal notation from the originally retained data at the time of being read out from the memory cell array 14.

Since it is known that the value in the second column from the left of the eleventh data "0010" is wrong, the ECC decoder circuit 24 can correct the second column from the left of the eleventh data "0010" to be "0110" (hereinafter, referred to as twelfth data). In particular, the eleventh data is a gray code, and the value of the eleventh data is deviated only by one in decimal notation; thus, only a change of 1-bit value is enough for the correction of the eleventh data.

[Step ST19-2]

Next, the twelfth data "0110" is transmitted to the gray code inverter circuit 25. By the gray code inverter circuit 25, conversion from the gray code to the binary code is conducted on the twelfth data "0110". Thus, the twelfth data "0110" is converted into a binary code "0100". This is the same value as the input seventh data "0100". In other words, the read-out and output data coincides with the input and retained data, which indicates that the correct data is output from the semiconductor device 10A. "0100" is output outside the semiconductor device 10A, whereby the reading operation of the semiconductor device 10A is completed.

<<Case where Third Inspection Data is Incorrectly Read Out>>

When the seventh data "0100" and the third inspection data "1000", which are retained in the memory cell array 14, are read out by the reading circuit 15, as described above, not the third inspection data "1000" but the fourth inspection data "0111" as a value deviated from the third inspection data "1000" is supposed to be read out. Each of the read-out data is transmitted to the analog-digital converter circuit 16.

The analog-digital converter circuit 16 conducts conversion of each of the seventh data "0100" and the fourth inspection data "0111" from an analog value to a digital value. The seventh data "0100" and the fourth inspection data "0111" which are converted into the digital values are transmitted to the gray code converter circuit 23.

[Step ST17-3]

By the gray code converter circuit 23, the seventh data "0100" is converted into a gray code to be the tenth data "0110", and the fourth inspection data "0111" is converted into a gray code to be data "0100" (hereinafter, referred to as sixth inspection data). Then, the tenth data "0110" and the sixth inspection data "0100" are transmitted to the ECC decoder circuit 24.

[Step ST18-3]

By the ECC decoder circuit 24, whether the data read out from the memory cell array 14 is correct or not is determined with use of the transmitted tenth data "0110" and sixth inspection data "0100". At this point, an extension hamming code "01100100" is composed of the tenth data "0110" as a high-order bit and the sixth inspection data "0100" as a low-order bit. The determination is conducted by calculating a product of the extension hamming code "01100100" and the transposed matrix of the check matrix H in the ECC decoder circuit 24.

[Formula 12]

$$(0\ 1\ 1\ 0\ 0\ 1\ 0\ 0)\cdot{}^tH = (1\ 0\ 0\ 1) \quad (E12)$$

According to Formula (E12), the product of the extension hamming code "01100100" and the transposed matrix of the check matrix H is (1001), which coincides with a value in the fifth column from the left of the check matrix H. This indicates that the value in the fifth column from the left of the extension hamming code "01100100" is wrong. In other words, the ECC decoder circuit 24 can determine that only a bit in the first column from the left of the sixth inspection data "0100" is wrong, and the fourth inspection data "0111" is data deviated by one in decimal notation from the originally retained data at the time of being read out from the memory cell array 14.

By the extension hamming code, error detection of 1 bit can be conducted. In other words, a data error occurs only in 1 bit in the combination of the seventh data and the fourth inspection data; thus, the seventh data "0100" read out from the memory cell array 14 is a normal value.

[Step ST19-3]

Next, the tenth data "0110" is transmitted to the gray code inverter circuit 25. By the gray code inverter circuit 25, conversion from the gray code into the binary code is conducted on the tenth data "0110". Thus, the tenth data "0110" is converted into "0100" as a binary code. This is the same value as the input seventh data "0100". In other words, the read-out and output data coincides with the input and retained data, which indicates that correct data is output from the semiconductor device 10A. "0100" is output outside the semiconductor device 10A, whereby the reading operation of the semiconductor device 10A is completed.

Through the above, the multilevel data retained in the memory cell array 14 can be output from the semiconductor device 10A as normal data (data without errors) when the multilevel data is read out from the memory cell array 14.

Operation Example 2 of Structure Example 2

In this operation example, the case of retaining 32-bit input data is described on the assumption that the memory cell in the memory cell array 14 of the semiconductor device 10A can retain 4-bit values.

When the input data is input to the semiconductor device 10A, the input data is transmitted to the digital-analog converter circuit 11 and the gray code converter circuit 21 in the control portion 20. For the operation of the gray code converter circuit 21, the description of Operation Example 1 of Structure Example 2 is referred to.

The input data converted into a gray code by the gray code converter circuit 21 is transmitted to the ECC encoder circuit 22. Then, the ECC encoder circuit 22 conducts encoding (generation of an error correction code) on the basis of the input data converted into the gray code. Note that for the encoding (generation of an error correction code) by the ECC encoder circuit 22 in this operation example, an extension hamming code is used. The gray-code data has 32 bits as described above. When encoding of the extension hamming code is conducted on the 32-bit data, a 32-bit code and a 7-bit code are generated for an information bit portion and an inspection bit portion, respectively. The inspection bit portion is transmitted as an error correction code to the digital-analog converter circuit 11.

Figure 8:
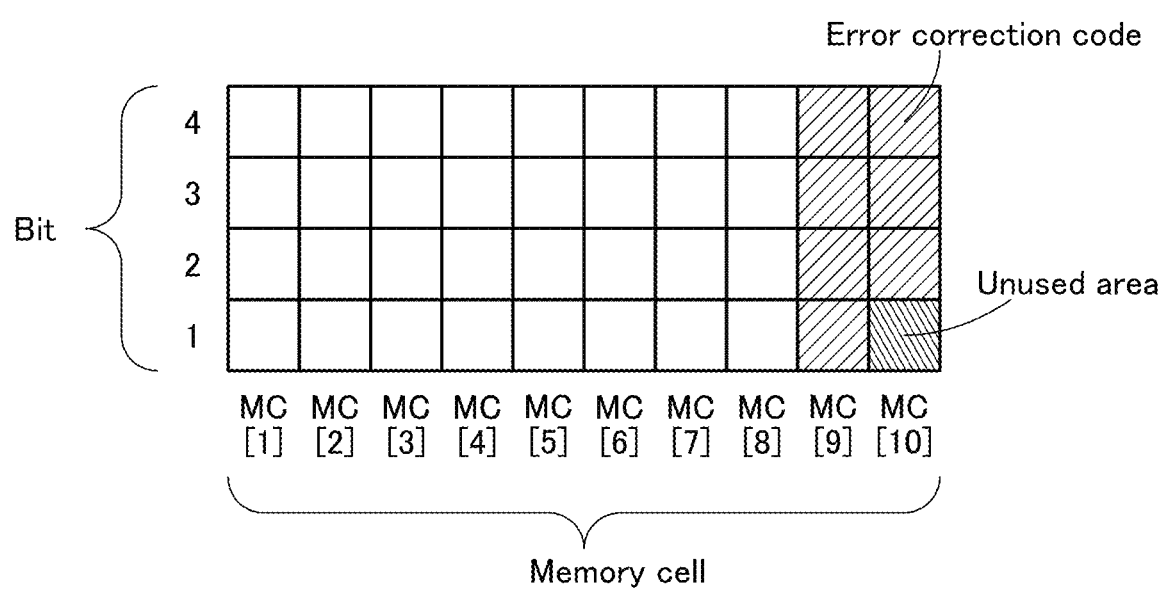
[FIG. 8] A conceptual diagram illustrating data retained in a memory cell.

Meanwhile, since the memory cell in the memory cell array 14 can retain the 4-bit value, at least 10 memory cells are necessary to retain the input data with 32 bits and the error correction code with 7 bits. A layout example of data for retaining the 32-bit input data and the 7-bit error correction code in the memory cell is illustrated in FIG. 8. In FIG. 8, a memory cell MC[1] to a memory cell MC[10] are shown in the horizontal direction, and bit retained in the corresponding memory cell is shown in the vertical direction.

In FIG. 8, the 7-bit error correction code is retained in the first bit to the fourth bit of the memory cell MC[9] and in the second bit to the fourth bit of the memory cell MC[10]. In addition, the first bit of the memory cell MC[10] is an unused portion where data is not retained. The input data is retained in regions other than the above. In other words, the input data is divided to be retained in each of the memory cell MC[1] to the memory cell MC[8].

Note that in this operation example, regions retaining data and an error correction code can be determined freely without being limited to the layout drawing shown in FIG. 8, Note that the operation method of the structure examples shown in this embodiment is not limited to Step ST1 to Step ST5, Step ST6-1 to Step ST8-1, and Step ST6-2 to Step ST8-2 shown in FIG. 2, Step ST11 to Step ST16, Step ST17-1 to Step ST19-1, Step ST17-2 to Step ST19-2, and Step ST17-3 to Step ST19-3 shown in FIG. 4 to FIG. 7. In this specification and the like, processing shown in the flow charts is classified according to functions and shown as independent steps. However, in actual processing or the like, it is difficult to separate processing shown in the flow charts for every function, and there are such a case where a plurality of steps are associated with one step and a case where one step is associated with a plurality of steps. Thus, the processing shown in the flow charts is not limited to each step described in the specification, and the steps can be exchanged as appropriate depending on circumstances. Specifically, depending on circumstances or conditions or as needed, a change of the order of the steps, addition and elimination of a step, or the like can be performed.

Note that this embodiment can be combined with other embodiments in this specification as appropriate.

Embodiment 2

In this embodiment, one example of a memory cell included in the memory cell array 14 of the semiconductor device 10 and the semiconductor device 10A described in the aforementioned embodiment will be described.

<DRAM>

Figure 9A:
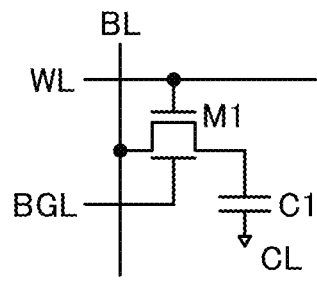
[FIG. 9] Circuit diagrams each illustrating a configuration example of a memory cell.

For the memory cell, a memory cell of DRAM can be used, for example. FIG. 9(A) illustrates a circuit configuration example of a memory cell of DRAM. A memory cell 1410 includes a transistor M1 and a capacitor C1. Note that the transistor M1 includes a front gate (simply referred to as a gate in some cases) and a back gate.

A first terminal of the transistor M1 is electrically connected to a first terminal of the capacitor C1, a second terminal of the transistor M1 is electrically connected to a wiring BL, a gate of the transistor M1 is electrically connected to a wiring WL, and the back gate of the transistor M1 is electrically connected to a wiring BGL. A second terminal of the capacitor C1 is electrically connected to a wiring CL.

The wiring BL functions as a bit line, and the wiring WL functions as a word line. The wiring CL functions as a wiring for applying a predetermined potential to the second terminal of the capacitor C1. In data writing and reading, a low-level potential (referred to as reference potential in some cases) is preferably applied to the wiring CL.

The wiring BGL functions as a wiring for applying a potential to the back gate of the transistor M1. By applying a given potential to the wiring BGL, a threshold voltage of the transistor M1 can be amplified.

Data writing and reading are conducted in such a manner that a high-level potential is applied to the wiring WL to turn on the transistor M1, and the wiring BL is electrically connected to the first terminal of the capacitor C1.

In addition, the memory cell included in the semiconductor device described in the above embodiment is not limited to the memory cell 1410. Depending on circumstances or conditions or as needed, the selection of circuits, a change in connection of circuits and the like can be conducted.

Figure 9B:
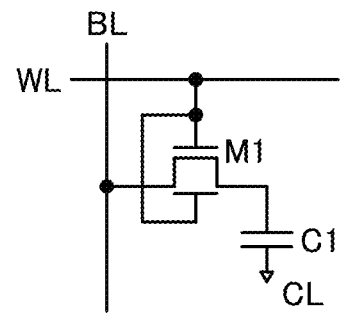

For example, the memory cell included in the semiconductor device described in the above embodiment may have a structure of a memory cell illustrated in FIG. 9(B). In a memory cell 1420, the back gate of the transistor M1 is electrically connected not to the wiring BGL but to the wiring WL. With such a structure, the potential which is equal to that at the gate of the transistor M1 can be applied to the back gate of the transistor M1; thus, the amount of current flowing through the transistor M1 can be increased when the transistor M1 is on.

Figure 9C:
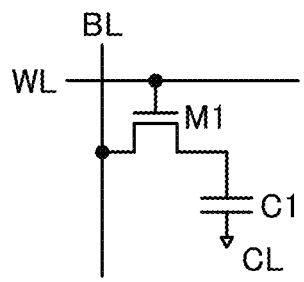

Furthermore, for example, the memory cell included in the semiconductor device described in the above embodiment may be a memory cell including a transistor with a single-gate structure, that is, a transistor M1 without a back gate. FIG. 9(C) illustrates a circuit configuration example of the memory cell. A memory cell 1430 has a structure where a back gate is eliminated from the transistor M1 in the memory cell 1410. Note that by using the memory cell 1430 in the semiconductor device, a manufacturing process of the semiconductor device can be shortened from that in the case of using the memory cell 1410 and the memory cell 1420 because the transistor M1 does not include a back gate.

<Gain-Cell-Type Memory Cell with Two Transistors and One Capacitor>

Figure 10A:
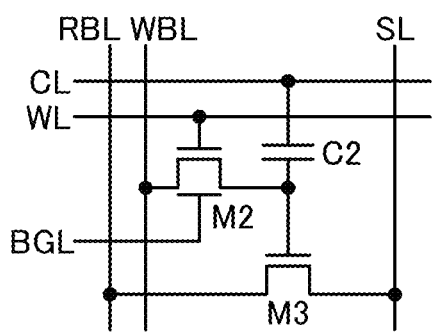
[FIG. 10] Circuit diagrams each illustrating a configuration example of a memory cell.

FIG. 10(A) illustrates a configuration example of a gain-cell-type memory cell including two transistors and one capacitor. A memory cell 1440 includes a transistor M2, a transistor M3, and a capacitor C2. Note that the transistor M2 includes a front gate (simply referred to as a gate in some cases) and a back gate.

A first terminal of the transistor M2 is electrically connected to a first terminal of the capacitor C2, a second terminal of the transistor M2 is electrically connected to a wiring WBL, a gate of the transistor M2 is electrically connected to the wiring WL, and the back gate of the transistor M2 is electrically connected to the wiring BGL. A second terminal of the capacitor C2 is electrically connected to the wiring CL. A first terminal of the transistor M3 is electrically connected to the wiring RBL, a second terminal of the transistor M3 is electrically connected to a wiring SL, and a gate of the transistor M3 is electrically connected to the first terminal of the capacitor C2.

The wiring WBL functions as a write bit line, the wiring RBL functions as a read bit line, and the wiring WL functions as a word line. The wiring CL functions as a wiring for applying a predetermined potential to the second terminal of the capacitor C2. In data writing and data retention, a low-level potential (referred to as a reference potential in some cases) is preferably applied to the wiring CL.

The wiring BGL functions as a wiring for applying a potential to the back gate of the transistor M2. By applying a given potential to the wiring BGL, the threshold voltage of the transistor M2 can be amplified.

Data writing is performed in such a manner that a high-level potential is applied to the wiring WL to turn on the transistor M2, so that the wiring WBL is electrically connected to the first terminal of the capacitor C2. Specifically, when the transistor M2 is in an on state, a potential corresponding to information stored in the wiring WBL is applied, whereby the potential is written to the first terminal of the capacitor C2 and the gate of the transistor M3. After that, a low-level potential is applied to the wiring WL to turn off the transistor M2, whereby the potential of the first terminal of the capacitor C2 and the potential of the gate of the transistor M3 are held.

Data reading is performed by application of a predetermined potential to the wiring SL. The current flowing between a source and a drain of the transistor M3 and the potential of the first terminal of the transistor M3 are determined by the potential of the gate of the transistor M3 and the potential of the second terminal of the transistor M3. Thus, the potential of the wiring RBL electrically connected to the first terminal of the transistor M3 is read out, so that the potential of the first terminal of the capacitor C2 (or the gate of the transistor M3) can be read out. In other words, information written into this memory cell can be read out from the potential held in the first terminal of the capacitor C2 (the gate of the transistor M3).

Furthermore, the memory cell included in the semiconductor device described in the above embodiment is not limited to the memory cell 1440. Depending on circumstances or conditions or as needed, the selection of circuits, a change in connection of circuits and the like can be conducted.

Figure 10B:
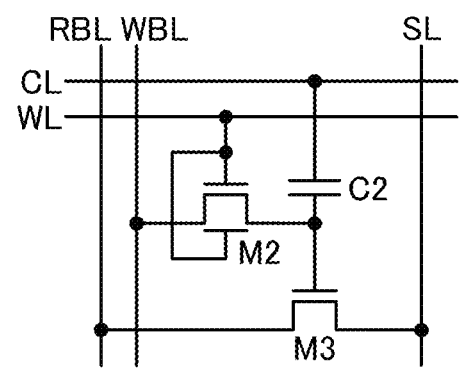

For example, the memory cell included in the semiconductor device described in the above embodiment may have a structure of a memory cell illustrated in FIG. 10(B). In a memory cell 1450, the back gate of the transistor M2 is electrically connected not to the wiring BGL but to the wiring WL as in the transistor M1 included in the memory cell 1420 in FIG. 9(B). With such a structure, the potential equal to the potential at the gate of the transistor M2 can be applied to the back gate of the transistor M2; thus, the amount of current flowing through the transistor M2 can be increased when the transistor M2 is in an on state.

Figure 10C:
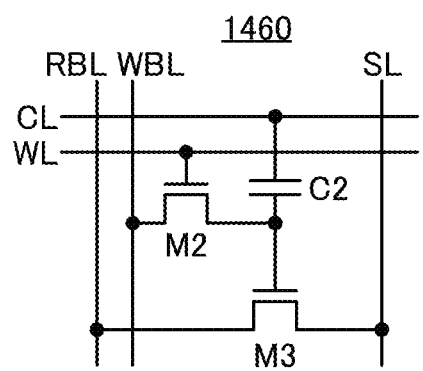

For example, the memory cell included in the semiconductor device described in the above embodiment may be a memory cell including a transistor M2 without a back gate. FIG. 10(C) illustrates a circuit configuration example of a memory cell. The structure of the memory cell 1460 is such that the back gate is eliminated from the transistor M2 in the memory cell 1440. Note that by using the memory cell 1460 in the semiconductor device, a manufacturing process of the semiconductor device can be shortened form that in the case of using the memory cell 1440 and the memory cell 1450 because the transistor M2 does not include a back gate.

Figure 10D:
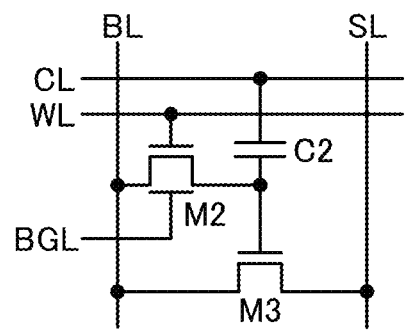

Alternatively, for example, the wiring WBL and the wiring RBL may be collectively connected to be one as the wiring BL. FIG. 10(D) illustrates a circuit configuration example of the memory cell. In a memory cell 1470, one wiring BL corresponds to the wiring WBL and the wiring RBL in the memory cell 1440, and the second terminal of the transistor M2 and the first terminal of the transistor M3 are electrically connected to the wiring BL. In other words, the memory cell 1470 operates in such a configuration that one wiring BL serves as a write bit line and a read bit line.

<Gain-Cell-Type Memory Cell with Three Transistors and One Capacitor>

Figure 11A:
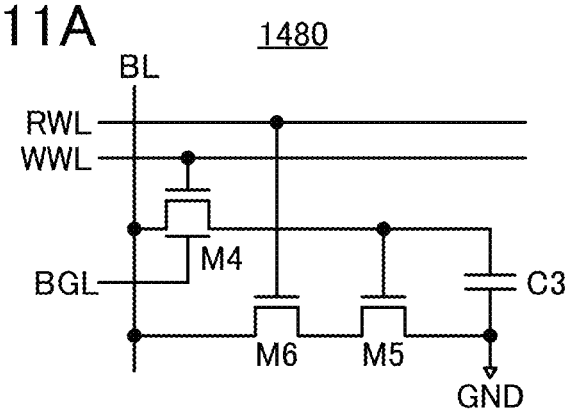
[FIG. 11] Circuit diagram each illustrating a configuration example of a memory cell.

FIG. 11(A) illustrates a gain-cell-type memory cell including three transistors and one capacitor. A memory cell 1480 includes a transistor M4 to a transistor M6 and a capacitor C3. Note that the transistor M4 in includes a front gate (simply referred to as a gate in some cases) and a back gate.

A first terminal of the transistor M4 is electrically connected to a first terminal of the capacitor C3, a second terminal of the transistor M4 is electrically connected to the wiring BL, a gate of the transistor M4 is electrically connected to a wiring WWL, and the back gate of the transistor M4 is electrically connected to the wiring BGL. A second terminal of the capacitor C3 is electrically connected to a first terminal of a transistor M5 and a wiring GND. A second terminal of the transistor M5 is electrically connected to a first terminal of the transistor M6 and a gate of the transistor M5 is electrically connected to the first terminal of the capacitor C3. A second terminal of the transistor M6 is electrically connected to the wiring BL, and a gate of the transistor M6 is electrically connected to a wiring RWL.

The wiring BL functions as a bit line, the wiring WWL functions as a write word line, and the wiring RWL functions as a read word line.

The wiring BGL functions as a wiring for applying a potential to the back gate of the transistor M4. By applying a given potential to the wiring BGL, the threshold voltage of the transistor M4 can be amplified.

The wiring GND is a wiring for supplying a low-level potential.

Data writing is performed in such a manner that a high-level potential is applied to the wiring WWL to turn on the transistor M4, so that the wiring BL is electrically connecting to the first terminal of the capacitor C3. Specifically, when the transistor M4 is in an on state, a potential corresponding to information stored in the wiring BL is applied, whereby the potential is written to the first terminal of the capacitor C3 and the gate of the transistor M5. After that, the low-level potential is applied to the wiring WWL to turn off the transistor M4, so that the potential of the first terminal of the capacitor C3 and the potential of the gate of the transistor M5 are held.

Data reading is performed in such a manner that after a predetermined potential is pre-charged to the wiring BL, the wiring BL is made in an electrically floating state, and a high-level potential is applied to the wiring RWL. Since the wiring RWL is at the high level, the transistor M6 is turned on, so that the wiring BL and the second terminal of the transistor M5 are electrically connected to each other. At this time, the potential of the wiring BL is supplied to the second terminal of the transistor M5; however, the potential of the second terminal of the transistor M5 and the potential of the wiring BL are fluctuated in accordance with the potential held at the first terminal of the capacitor C3 (or the gate of the transistor M5). In this situation, by reading out the potential of the wiring BL, the potential held at the first terminal of the capacitor C3 (or the gate of the transistor M5) can be read out. In other words, information written into the memory cell can be read from the potential held at the first terminal of the capacitor C3 (the gate of the transistor M5).

In addition, the memory cell included in the semiconductor device described in the above embodiment is not limited to the memory cell 1480. Depending on circumstances or conditions or as needed, the selection of circuits, a change in connection of circuits and the like can be conducted. For example, the memory cell 1480 may have a structure in which the back gate of the transistor M4 is electrically connected not to the wiring BGL but to the wiring WWL (not illustrated) as in the transistor M1 in the memory cell 1420 illustrated in FIG. 9(B) and the transistor M2 of the memory cell 1450 in FIG. 10(B). With such a structure, the potential equal to that at the gate of the transistor M4 can be applied to the back gate of the transistor M4; thus, the amount of current flowing in the transistor M4 can be increased when the transistor M4 is in an on state. For example, as in the transistor M1 in the memory cell 1430 illustrated in FIG. 9(C) and the transistor M2 in the memory cell 1460 in FIG. 10(C), the structure of the memory cell 1480 may include the transistor M4 without a back gate (not illustrated). With such a structure, the manufacturing process of the semiconductor device can be shortened by that for a back gate that is not provided in the transistor M4.

<Memory Cell of SRAM>

Figure 11B:
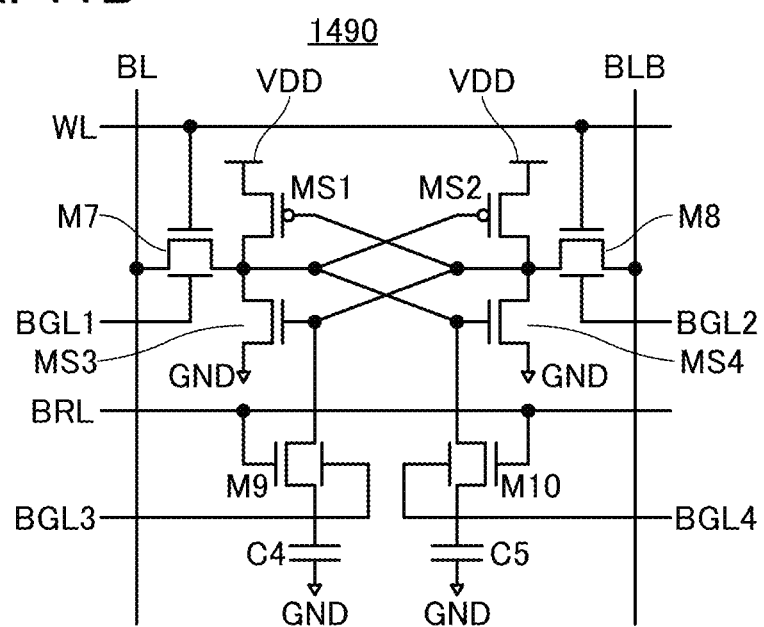

FIG. 11(B) illustrates an example of SRAM (Static Random Access Memory). Note that a memory cell 1490 illustrated in FIG. 11(B) is a memory cell of an SRAM capable of backup. The memory cell 1490 includes a transistor M7 to a transistor M10, a transistor MS1 to a transistor MS4, a capacitor C4, and a capacitor C5. Note that the transistor M7 to the transistor M10 each include a front gate (simply referred to as gate in some cases) and a back gate. Note that the transistor MS1 and a transistor MS2 are p-channel transistors, and a transistor MS3 and the transistor MS4 are n-channel transistors.

A first terminal of the transistor M7 is electrically connected to the wiring BL, a second terminal of the transistor M7 is electrically connected to a first terminal of the transistor MS1, a first terminal of the transistor MS3, a gate of the transistor MS2, a gate of the transistor MS4, and a first terminal of the transistor M10. A gate of the transistor M7 is electrically connected to a wiring WL, and the back gate of the transistor M7 is electrically connected to a wiring BGL1. A first terminal of a transistor M8 is electrically connected to a wiring BLB, a second terminal of the transistor M8 is electrically connected to a first terminal of the transistor MS2, a first terminal of the transistor MS4, a gate of the transistor MS1, a gate of the transistor MS3, and a first terminal of a transistor M9. A gate of the transistor M8 is electrically connected to the wiring WL, and the back gate of the transistor M8 is electrically connected to a wiring BGL2.

A second terminal of the transistor MS1 is electrically connected to a wiring VDD. A second terminal of the transistor MS2 is electrically connected to the wiring VDD. A second terminal of the transistor MS3 is electrically connected to the wiring GND. A second terminal of the transistor MS4 is electrically connected to the wiring GND.

A second terminal of the transistor M9 is electrically connected to a first terminal of the capacitor C4, and a gate of the transistor M9 is electrically connected to the wiring BRL, and the back gate of the transistor M9 is electrically connected to a wiring BGL3. A second terminal of the transistor M10 is electrically connected to a first terminal of the capacitor C5, a gate of the transistor M10 is electrically connected to the wiring BRL, and the back gate of the transistor M10 is electrically connected to the wiring BGL4.

A second terminal of the capacitor C4 is electrically connected to the wiring GND, and a second terminal of the capacitor C5 is electrically connected to the wiring GND.

The wiring BL and the wiring BLB each function as a bit line, the wiring WL functions as a word line, and the wiring BRL controls the conduction state and the non-conduction state of the transistor M9 and the transistor M10.

The wirings BGL1 to the wiring BGL4 each function as a wiring for applying a potential to each back gate of the transistor M7 to the transistor M10. By applying given potentials to the wiring BGL1 to the wiring BGL4, the threshold voltages of the transistor M7 to the transistor M10 can be amplified.

The wiring VDD is a wiring supplying a high-level potential, and the wiring GND is a wiring supplying a low-level potential.

Data writing is performed by application of a high-level potential to the wiring WL and applying a high-level potential to the wiring BRL. Specifically, when the transistor M10 is in an on state, a potential corresponding to information stored in the wiring BL is applied, whereby the potential is written to the second terminal side of the transistor M10.

In the memory cell 1490, an inverter loop is constructed by the transistor MS1 to the transistor MS2; thus, an inverted signal of a data signal corresponding to the potential is input to the second terminal side of the transistor M8. The transistor M8 is in an on state; thus, an inverted signal of a signal input to the wiring BL is output to the wiring BLB. Since the transistor M9 and the transistor M10 are in an on state, the potentials of the second terminal of the transistor M7 and the second terminal of the transistor M8 are respectively held at the first terminal of the capacitor C5 and the first terminal of the capacitor C4. Then, a low-level potential is applied to the wiring WL and a low-level potential is applied to the wiring BRL to turn off the transistor M7 to the transistor M10, so that the first terminal of the capacitor C4 and the first terminal of the capacitor C5 are held.

Data reading is performed in such a manner that after the wiring BL and the wiring BLB are pre-charged at a predetermined potential in advance, a high-level potential is applied to the wiring WL and the wiring BRL, so that the potential at the first terminal of the capacitor C4 is refreshed by the inverter loop in the memory cell 1490 and is output to the wiring BLB. The potential of the first terminal of the capacitor C5 is refreshed by the inverter loop in the memory cell 1490 and is output to the wiring BL. Since the pre-charged potentials at the wiring BL and the wiring BLB are fluctuated to the potential at the first terminal of the capacitor C5 and the potential at the first terminal of the capacitor C4, the potential held in the memory cell can be read out from the potential of the wiring BL or the wiring BLB.

Note that in each of channel formation regions in the transistor M1 to the transistor M10 described in this embodiment, an oxide semiconductor containing any one of indium, zinc, an element M (an element M is aluminum, gallium, yttrium, or tin), and zinc can be used. That is, OS transistors can be used as the transistor M1 to the transistor M10. In particular, an oxide semiconductor containing indium, gallium, and zinc is preferable; CAC-OS described in Embodiment 5 is further preferable. Since an OS transistor including an oxide semiconductor containing indium, gallium, and zinc has a feature of extremely low off-state current, the use of OS transistors as the transistor M1 to the transistor M10 can extremely reduce the leakage current of the transistor M1 to the transistor M10. That is, written data can be held for a long time by the transistor M1 to the transistor M10; thus, the frequency of refresh operations of the memory cell can be reduced. In addition, refresh operation of the memory cell can be unnecessary.

Note that silicon is preferably used for each of channel formation regions in the transistor M3, the transistor M5, the transistor M6, and the transistor MS1 to the transistor MS4 described in this embodiment. In particular, LTP5 (Low Temperature Poly-Silicon) is preferable for the silicon (hereinafter, referred to as Si transistor). Since a Si transistor has higher field-effect mobility than the OS transistor in some cases, use of the Si transistor for a reading transistor or a transistor in an inverter is suitable.

Note that this embodiment can be combined with other embodiments in this specification as appropriate.

Embodiment 3

In this embodiment, the case of using multilevel data in the memory cell (the DRAM, the gain-cell-type memory cell including two transistors and one capacitor, the gain-cell-type memory cell including three transistors and one capacitor) described in the above embodiment will be described. One memory cell is configured to be capable of storing not binary data but data in a more than ternary state, whereby storage capacity of the memory cell can be increased.

Figure 12:
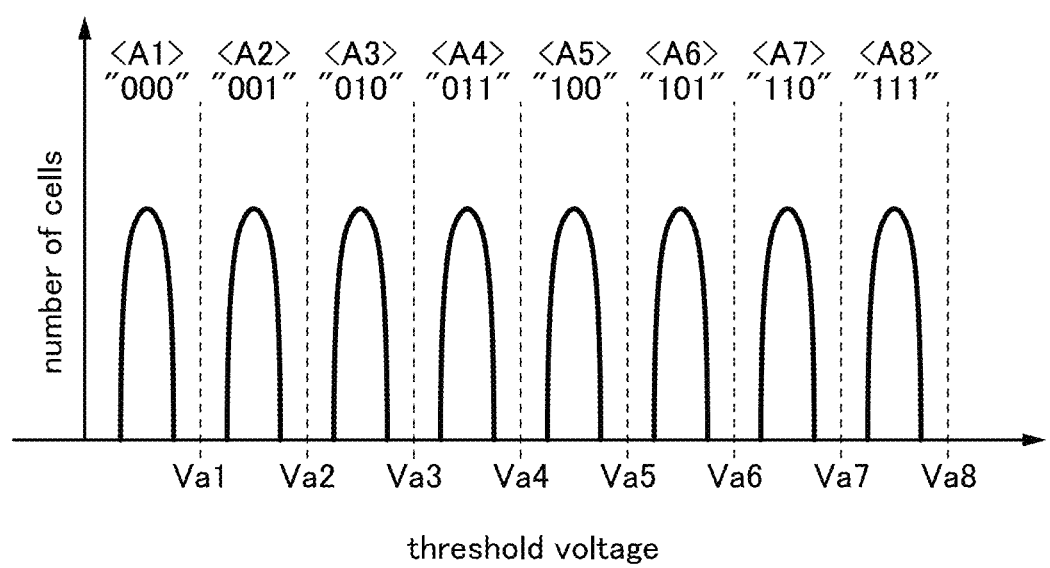
[FIG. 12] A schematic diagram of distributed threshold voltages in a memory cell.

FIG. 12 is a schematic diagram illustrating an example of threshold voltage distribution in memory cells that can store multilevel data.

FIG. 12 shows an example case where the memory cells has eight data states (also referred to as "logic state"). The eight data states are called data states A1-A8 in ascending order of the threshold voltage (represented as threshold voltage in the figure; referred to as threshold value in this embodiment). To the data states A1-A8, respective 3-bit data, "000", "001", "010", "011", "100", "101", "110", and "111" are assigned.

Note that the threshold values in the eight data state each have a distribution width in some cases, which is caused by a difference between the memory cell generated at the time of completion of the fabrication, parasitic capacitance of circuits in the memory cells, or the like. In FIG. 12, the vertical axis represents the number of memory cells (number of cells), which illustrates the distribution width of threshold value in each of the eight data states.

Eight voltages Va1-Va8 for distinguishing the eight data states in the memory cells are set for a memory device including the memory cells. The voltages Va1-Va8 are boundary values of threshold levels for distinguishing the adjacent data states and are used as reading voltages for reading the data from the memory cells.

By setting the memory cell described in the other embodiment so as to exchange the multilevel data as described above, the storage capacity of a memory device including the memory cell can be enhanced.

Note that this embodiment can be combined with other embodiments in this specification as appropriate.

Embodiment 4

In this embodiment, one embodiment of the semiconductor device described in the above embodiments will be described with reference to FIG. 13 and FIG. 14. Note that, as a semiconductor device 100 described in this specification, for example, the semiconductor device 10 and the semiconductor device 10A can be indicated. Furthermore, as the semiconductor device 100, for example, the digital-analog converter circuit 11, the writing circuit 12, the row driver 13, the memory cell array 14, the reading circuit 15, the analog-digital converter circuit 16, the power-supply unit 17, and the like, which are included in the semiconductor device 10, can be indicated. Furthermore, as the semiconductor device 100, for example, the gray code converter circuit 21, the ECC encoder circuit 22, the gray code converter circuit 23, the ECC decoder circuit 24, the gray code inverter circuit 25, the gray code inverter circuit 26, and the like, which are included in the control portion 20 or the control portion 20A, can be indicated.

<Cross-Sectional Structure of Semiconductor Device 100>

Figure 13:
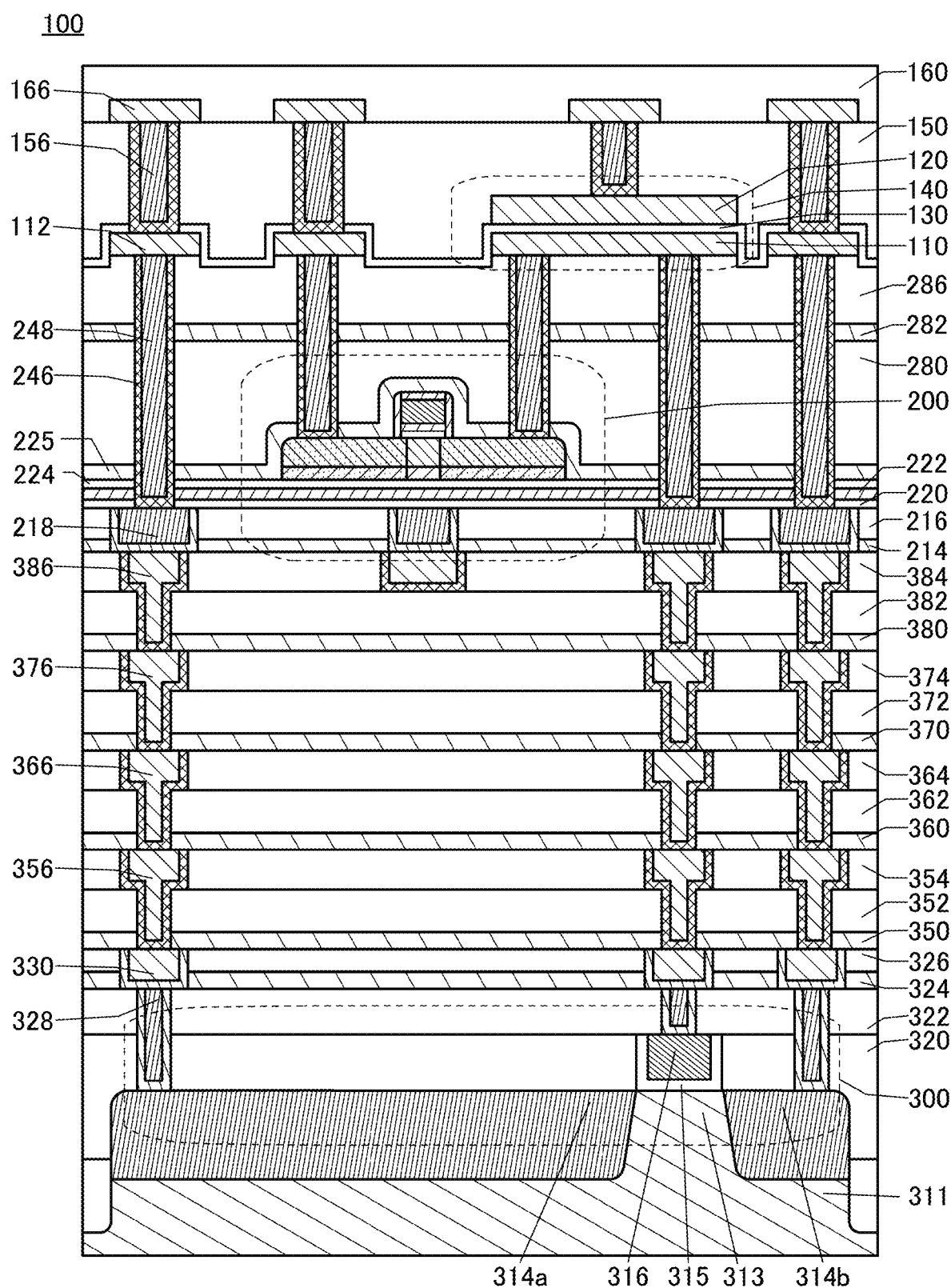
[FIG. 13] A cross-sectional view illustrating a structure example of a semiconductor device.

FIG. 13 is a schematic cross-sectional view illustrating an example of the semiconductor device 100. The semiconductor device 100 includes a transistor 300, a transistor 200, and a capacitor 140. The transistor 200 is provided above the transistor 300, and the capacitor 140 is provided above the transistor 300 and the transistor 200.

The transistor 200 is an OS transistor including an oxide semiconductor in a channel formation region. Since the OS transistor can be formed with high yield even when miniaturized, the transistor 200 can be miniaturized. The use of such a transistor in a semiconductor device allows miniaturization or high integration of the semiconductor device. Since the off-state current of the OS transistor is small, by using it for a semiconductor device, stored contents can be retained for a long time. In other words, since refresh operation is not required or frequency of refresh operation is extremely low, the power consumption of the semiconductor device can be sufficiently reduced.

The transistor 300 is provided over a substrate 311 and includes a conductor 316, an insulator 315, a semiconductor region 313 that is part of the substrate 311, and a low-resistance region 314a and a low-resistance region 314b functioning as a source region or a drain region.

The transistor 300 is of either a p-channel type or an n-channel type.

A region of the semiconductor region 313 where a channel is formed, a region in the vicinity thereof, the low-resistance region 314a and the low-resistance region 314b functioning as the source region or the drain region, and the like preferably include a semiconductor such as a silicon-based semiconductor, and preferably include single crystal silicon. Alternatively, the regions may be formed using a material containing Ge (germanium), SiGe (silicon germanium), GaAs (gallium arsenide), GaAlAs (gallium aluminum arsenide), or the like. Such a region may have a structure using silicon whose effective mass is controlled by applying stress to the crystal lattice and thereby changing the lattice spacing.

The low-resistance region 314a and the low-resistance region 314b contain an element that imparts n-type conductivity, such as arsenic or phosphorus, or an element that imparts p-type conductivity, such as boron, in addition to a semiconductor material used for the semiconductor region 313.

For the conductor 316 functioning as a gate electrode, a semiconductor material such as silicon containing an element that imparts n-type conductivity, such as arsenic or phosphorus, or an element that imparts p-type conductivity, such as boron; or a conductive material such as a metal material, an alloy material, or a metal oxide material can be used.

Note that the work function is determined by a conductor material, whereby the threshold voltage can be adjusted by changing the conductor material. Specifically, it is preferable to use a material such as titanium nitride or tantalum nitride for the conductor. Moreover, in order to ensure both conductivity and embeddability, it is preferable to use a stacked layer of metal materials such as tungsten and aluminum as the conductor, and it is particularly preferable to use tungsten in terms of heat resistance.

In the transistor 300 illustrated in FIG. 13, the semiconductor region 313 (part of the substrate 311) in which a channel is formed has a convex shape. Furthermore, the conductor 316 is provided to cover the side surfaces and the top surface of the semiconductor region 313 with the insulator 315 interposed therebetween. Note that for the conductor 316, a material that adjusts the work function may be used. Such a transistor 300 is also referred to as a FIN-type transistor because it utilizes a convex portion of the semiconductor substrate. Note that an insulator functioning as a mask for forming the convex portion may be placed in contact with an upper portion of the convex portion. Furthermore, although the case where the convex portion is formed by processing part of the semiconductor substrate is described here, a semiconductor film having a convex shape may be formed by processing an SOI substrate.

Note that the transistor 300 illustrated in FIG. 13 is an example and the structure is not limited thereto; an appropriate transistor may be used in accordance with a circuit configuration or a driving method.

An insulator 320, an insulator 322, an insulator 324, and an insulator 326 are provided to be stacked in this order to cover the transistor 300.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, or aluminum nitride may be used, for example.

Note that in this specification, silicon oxynitride refers to a material that contains oxygen at a higher proportion than nitrogen, and silicon nitride oxide refers to a material that contains nitrogen at a higher proportion than oxygen. Moreover, in this specification, aluminum oxynitride refers to a material that contains oxygen at a higher proportion than nitrogen, and aluminum nitride oxide refers to a material that contains nitrogen at a higher proportion than oxygen.

The insulator 322 may have a function of a planarization film for planarizing a level difference caused by the transistor 300 or the like provided thereunder. For example, the top surface of the insulator 322 may be planarized by planarization treatment using a chemical mechanical polishing (CMP) method or the like to improve planarity.

Furthermore, as the insulator 324, a film having a barrier property that inhibits diffusion of hydrogen and impurities from the substrate 311, the transistor 300, or the like into a region where the transistor 200 is provided is preferably used.

As an example of the film having a barrier property against hydrogen, silicon nitride formed by a CVD method can be used. Here, diffusion of hydrogen into a semiconductor element including an oxide semiconductor, such as the transistor 200, degrades the characteristics of the semiconductor element in some cases. Therefore, a film that inhibits hydrogen diffusion is preferably provided between the transistor 200 and the transistor 300. The film that inhibits diffusion of hydrogen is specifically a film from which a small amount of hydrogen is released.

The amount of released hydrogen can be analyzed by thermal desorption spectroscopy (TDS), for example. The amount of hydrogen released from the insulator 324 that is converted into hydrogen atoms per area of the insulator 324 is, for example, smaller than or equal to $10 \times 10^{15}$ atoms/cm², preferably smaller than or equal to $5 \times 10^{15}$ atoms/cm² in TDS analysis in a film-surface temperature range of 50° C. to 500° C., for example.

Note that the permittivity of the insulator 326 is preferably lower than that of the insulator 324. For example, the dielectric constant of the insulator 326 is preferably lower than 4, further preferably lower than 3. Furthermore, for example, the dielectric constant of the insulator 326 is preferably 0.7 times or less, further preferably 0.6 times or less the dielectric constant of the insulator 324. When a material with a low permittivity is used for an interlayer film, the parasitic capacitance generated between wirings can be reduced.

Moreover, a conductor 328, a conductor 330, and the like are embedded in the insulator 320, the insulator 322, the insulator 324, and the insulator 326. Note that the conductor 328 and the conductor 330 each have a function of a plug or a wiring. In addition, a plurality of conductors functioning as plugs or wirings are collectively denoted by the same reference numeral in some cases. Furthermore, in this specification and the like, a wiring and a plug electrically connected to the wiring may be a single component. That is, there are cases where part of a conductor functions as a wiring and part of a conductor functions as a plug.

As a material for each of plugs and wirings (the conductor 328, the conductor 330, and the like), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, for example, as materials of each plug and wiring. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 13, an insulator 350, an insulator 352, an insulator 354, an insulator 360, an insulator 362, an insulator 364, an insulator 370, an insulator 372, an insulator 374, an insulator 380, an insulator 382, and an insulator 384 are stacked in this order. Furthermore, with respect to the insulators, a conductor 356, a conductor 366, a conductor 376, and a conductor 386 are formed. These conductors have a function of a plug or a wiring. Note that these conductors can be provided using a material similar to those for the conductor 328 and the conductor 330.

Note that it is preferable to use an insulator having a barrier property against hydrogen for the insulator 350, the insulator 360, the insulator 370, and the insulator 380, as for the insulator 324. The conductor 356, the conductor 366, the conductor 376, and the conductor 386 preferably include a conductor having a barrier property against hydrogen. For example, in the case where the insulator 350 and the conductor 356 are focused, diffusion of hydrogen from the transistor 300 to the transistor 200 can be prevented by forming the conductor 356 in an opening in the insulator 350. The same applies to the other insulators and the other conductor.

Note that as the conductor having a barrier property against hydrogen, tantalum nitride is preferably used, for example. Furthermore, by stacking tantalum nitride and tungsten, which has high conductivity, the diffusion of hydrogen from the transistor 300 can be inhibited while the conductivity as a wiring is kept.

An insulator 214 and an insulator 216 are provided to be stacked over the insulator 384. A substance having a barrier property against oxygen and hydrogen is preferably used for either the insulator 214 or the insulator 216.

For example, for the insulator 214, it is preferable to use a film having a barrier property so as to prevent hydrogen and impurities from being diffused from the substrate 311 or a region where the transistor 300 is provided into the region where the transistor 200 is provided. Therefore, a material similar to that for the insulator 324 can be used.

Furthermore, as an example of the film having a barrier property against hydrogen, silicon nitride formed by a CVD method can be used. Here, diffusion of hydrogen into a semiconductor element including an oxide semiconductor, such as the transistor 200, degrades the characteristics of the semiconductor element in some cases. Therefore, a film that inhibits hydrogen diffusion is preferably provided between the transistor 200 and the transistor 300. The film that inhibits diffusion of hydrogen is specifically a film from which a small amount of hydrogen is released.

As the film having a barrier property against hydrogen, a metal oxide such as aluminum oxide, hafnium oxide, or tantalum oxide is preferably used for the insulator 214, for example.

In particular, aluminum oxide has an excellent blocking effect that inhibits the passage of both oxygen and impurities such as hydrogen and moisture which are factors of a change in electrical characteristics of the transistor. Accordingly, aluminum oxide can prevent entry of impurities such as hydrogen and moisture into the transistor 200 in a fabrication process and after the fabrication of the transistor. Furthermore, release of oxygen from the oxide included in the transistor 200 can be inhibited. Thus, aluminum oxide is suitably used as a protective film for the transistor 200.

For the insulator 216, for example, a material similar to that for the insulator 320 can be used. Furthermore, when a material with a relatively low permittivity is used for an interlayer film, the parasitic capacitance generated between wirings can be reduced. For example, a silicon oxide film or a silicon oxynitride film can be used as the insulator 216.

A conductor 218, a conductor (e.g., an electrode functioning as a back gate) included in the transistor 200, and the like are embedded in the insulator 214 and the insulator 216. The conductor 218 can be provided using a material similar to those for the conductor 328 and the conductor 330.

The conductor 218 is preferably a conductor having a barrier property against oxygen, hydrogen, and water. In such a structure, the transistor 300 and the transistor 200 can be separated by a layer having a barrier property against oxygen, hydrogen, and water. As a result, the diffusion of hydrogen from the transistor 300 to the transistor 200 can be prevented.

The transistor 200 is provided above the insulator 216. Note that an OS transistor may be used as the transistor 200. The details of the transistor 200 will be described in Embodiment 5.

The insulator 280 is provided above the transistor 200. In the insulator 280, an excess-oxygen region is preferably formed. In particular, in the case of using an oxide semiconductor in the transistor 200, when an insulator including an excess-oxygen region is provided for an interlayer film or the like in the vicinity of the transistor 200, oxygen vacancies in the oxide semiconductor included in the transistor 200 are reduced, whereby the reliability can be improved. The insulator 280 that covers the transistor 200 may function as a planarization film that covers an uneven shape thereunder. Note that the insulator 280 is provided in contact with an insulator 225 formed over the transistor 200.

As the insulator including an excess-oxygen region, specifically, an oxide material from which part of oxygen is released by heating is preferably used. An oxide that releases part of oxygen by heating is an oxide film in which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS analysis. Note that the temperature of the film surface in the TDS analysis is preferably in a range higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, a metal oxide can be used.

An insulator 282 may be provided over the insulator 280. A substance having a barrier property against oxygen or hydrogen is preferably used for the insulator 282. Thus, the insulator 282 can be formed using a material similar to that used for forming the insulator 214. For the insulator 282, a metal oxide such as aluminum oxide, hafnium oxide, or tantalum oxide is preferably used, for example. Alternatively, for example, when the insulator 282 is deposited by a sputtering method using plasma containing oxygen, oxygen can be added to the insulator 280 serving as a base layer of the insulator 282.

In particular, aluminum oxide has an excellent blocking effect that inhibits the passage of both oxygen and impurities such as hydrogen and moisture which are factors of a change in electrical characteristics of the transistor. Accordingly, aluminum oxide can prevent entry of impurities such as hydrogen and moisture into the transistor 200 in a fabrication process and after the fabrication of the transistor. Furthermore, release of oxygen from the oxide included in the transistor 200 can be inhibited. Thus, aluminum oxide is suitably used as a protective film for the transistor 200.

An insulator 286 is provided over the insulator 282. A material similar to that for the insulator 320 can be used for the insulator 286. Furthermore, when a material with a relatively low permittivity is used for an interlayer film, the parasitic capacitance generated between wirings can be reduced. For example, a silicon oxide film or a silicon oxynitride film can be used as the insulator 286.

An insulator 220, an insulator 222, an insulator 224, and an insulator 225 are provided on the periphery of the transistor 200. The insulator 220, the insulator 222, the insulator 224, and the insulator 225 are described in detail in Embodiment 5. Note that a conductor 246, a conductor 248, and the like are embedded in the insulator 220, the insulator 222, the insulator 224, the insulator 225, the insulator 280, the insulator 282, and the insulator 286.

The conductor 246 and the conductor 248 can be provided using a material similar to those for the conductor 328 and the conductor 330.

Subsequently, the capacitor 140 is provided above the transistor 200. The capacitor 140 includes a conductor 110, a conductor 120, and an insulator 130.

A conductor 112 may be provided over the conductor 246 and the conductor 248. Note that the conductor 112 and the conductor 110 can be formed at the same time.

For the conductor 112 and the conductor 110, a metal film containing an element selected from molybdenum, titanium, tantalum, tungsten, aluminum, copper, chromium, neodymium, and scandium; a metal nitride film containing any of the above-described elements as its component (a tantalum nitride film, a titanium nitride film, a molybdenum nitride film, or a tungsten nitride film); or the like can be used. Alternatively, it is possible to use a conductive material such as an indium tin oxide, an indium oxide containing tungsten oxide, an indium zinc oxide containing tungsten oxide, an indium oxide containing titanium oxide, an indium tin oxide containing titanium oxide, an indium zinc oxide, or an indium tin oxide to which silicon oxide is added.

The conductor 112 and the conductor 110 illustrated in FIG. 13 each have a single-layer structure; however, the structure is not limited thereto, and a stacked-layer structure of two or more layers may be employed. For example, between a conductor having a barrier property and a conductor having a high conductivity, a conductor which is highly adhesive to the conductor having a barrier property and the conductor having high conductivity may be formed.

In addition, as a dielectric of the capacitor 140, the insulator 130 is provided over the conductor 112 and the conductor 110. The insulator 130 can be provided to have a stacked layer or a single layer using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, or hafnium nitride.

For example, a material having high dielectric strength, such as silicon oxynitride, is preferably used for the insulator 130. With the structure, the dielectric strength of the capacitor 140 can be increased and the electrostatic breakdown of the capacitor 140 can be inhibited owing to the insulator 130.

Over the insulator 130, the conductor 120 is provided to overlap with the conductor 110. Note that for the conductor 120, a conductive material such as a metal material, an alloy material, or a metal oxide material can be used. It is preferable to use a high-melting-point material that has both heat resistance and conductivity, such as tungsten or molybdenum, and it is particularly preferable to use tungsten. Furthermore, in the case where the conductor 120 is formed concurrently with another component such as a conductor, Cu (copper), Al (aluminum), or the like, which is a low-resistance metal material, is used.

An insulator 150 is provided over the conductor 120 and the insulator 130. The insulator 150 can be provided using a material similar to that for the insulator 320. Furthermore, the insulator 150 may function as a planarization film that covers uneven shapes thereunder.

A conductor 156 is embedded in the insulator 150. Note that the conductor 156 can be provided using a material similar to those for the conductor 328 and the conductor 330.

A conductor 166 is provided over the conductor 156. An insulator 160 is provided over the conductor 166 and the insulator 150. Furthermore, the insulator 160 may function as a planarization film that covers uneven shapes thereunder.

The above is the description of the structure example. With the use of this structure, a change in electrical characteristics can be reduced and reliability can be improved in a semiconductor device using an OS transistor. Alternatively, the power consumption of a semiconductor device using an OS transistor can be reduced. Alternatively, a semiconductor device using an OS transistor can be miniaturized or highly integrated. Alternatively, a miniaturized or highly integrated semiconductor device can be provided with high productivity.

Modification Example of Semiconductor Device 100

Figure 14:
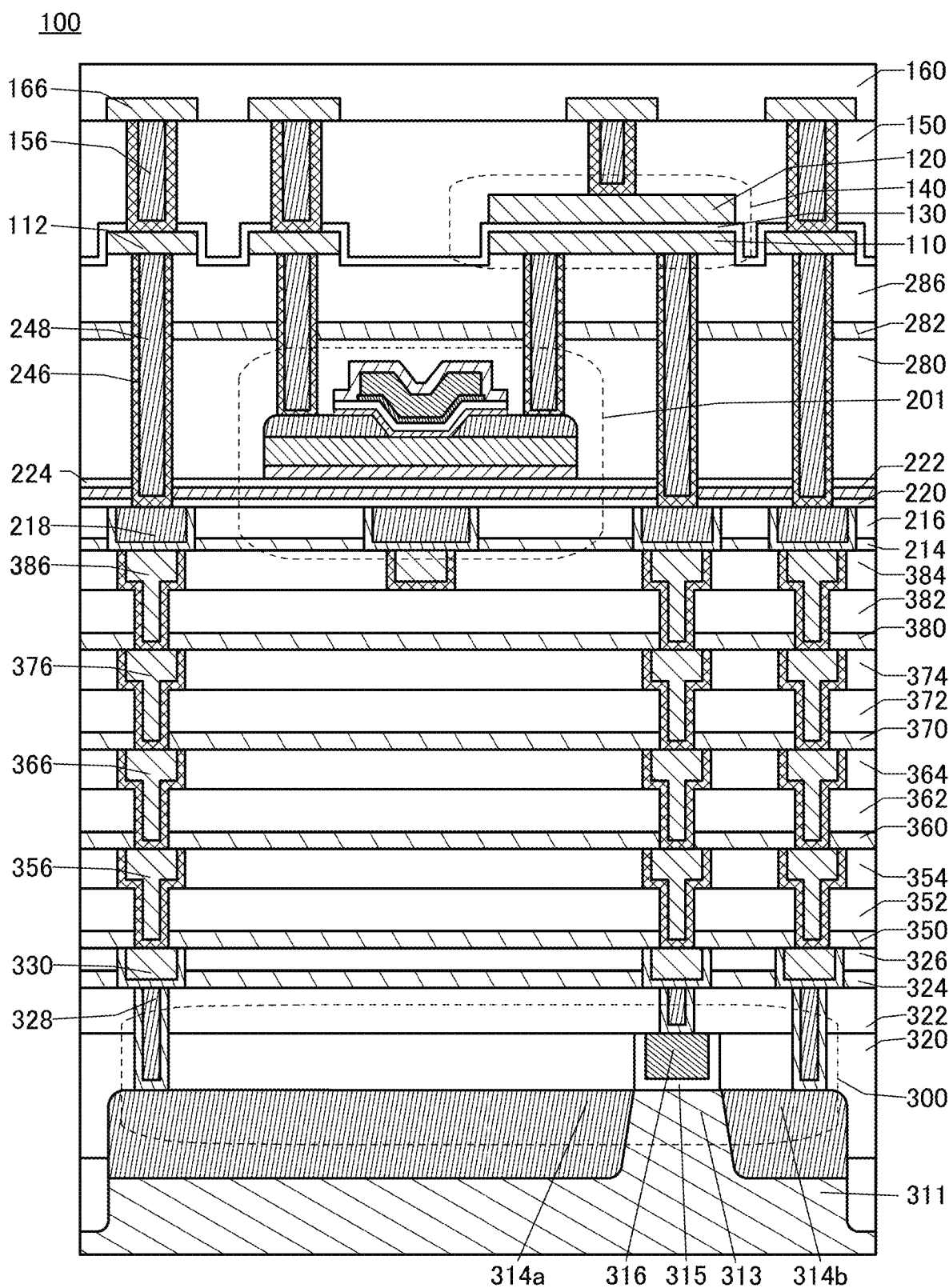
[FIG. 14] A cross-sectional view illustrating a structure example of a semiconductor device.

FIG. 14 illustrates a modification example of this embodiment.

FIG. 14 is a schematic cross-sectional view of the case where the transistor 200 in FIG. 13 is replaced with a transistor 201. Like the transistor 200, the transistor 201 is an OS transistor. Note that the details of the transistor 201 will be described in Embodiment 5.

For the details of other structural examples in FIG. 14, the description of FIG. 13 may be referred to.

Note that this embodiment can be combined with other embodiments in this specification as appropriate.

Embodiment 5

In this embodiment, details of the transistor 200 and the transistor 201 in Embodiment 4 are described with reference to FIG. 15 to FIG. 18.

<<Transistor 200>>

First, the details of the transistor 200 illustrated in FIG. 13 will be described.

Figure 15A:
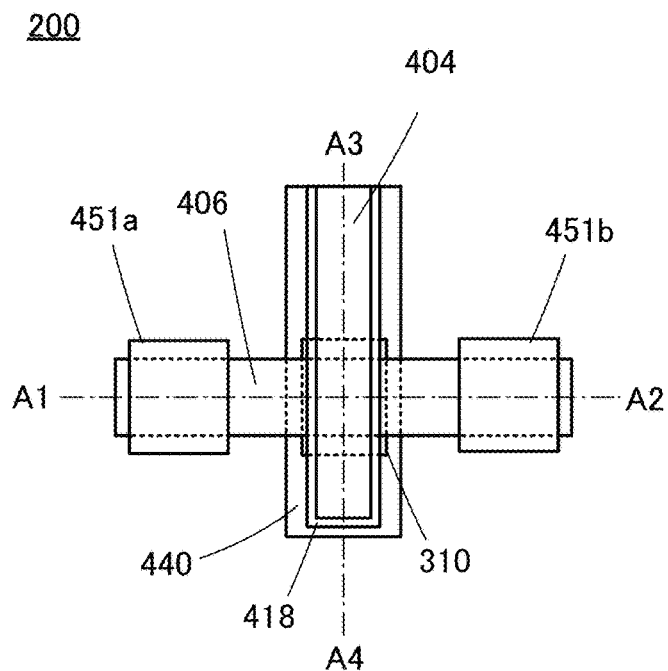
[FIG. 15] A top view and cross-sectional views illustrating a structure example of a transistor.
Figure 15C:
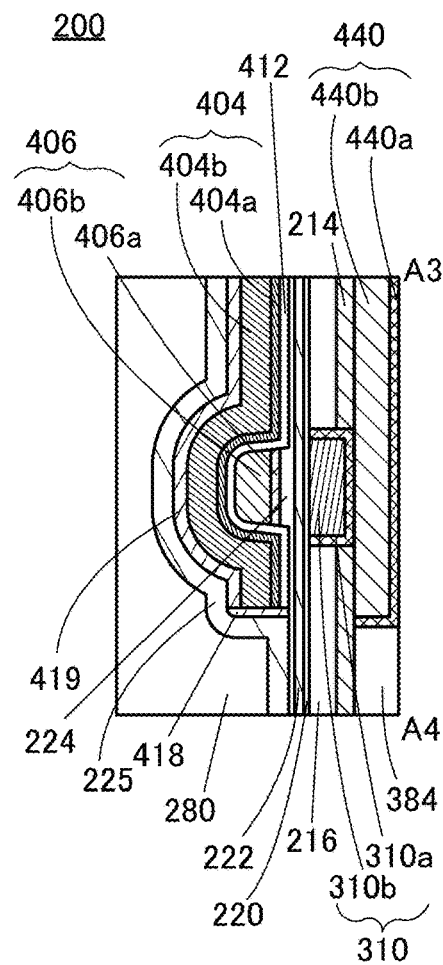
Figure 15B:
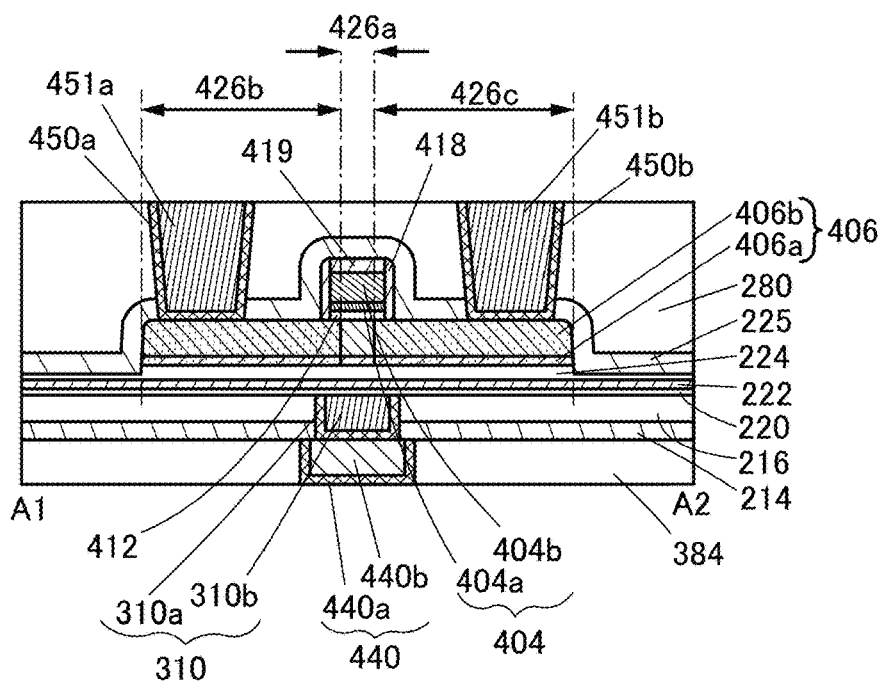

FIG. 15(A) is a top view of the semiconductor device including the transistor 200. Here, FIG. 15(B) is a cross-sectional view of a portion indicated by a dashed-dotted line A1-A2 in FIG. 15(A), and is a cross-sectional view in the channel length direction of the transistor 200. FIG. 15(C) is a cross-sectional view of a portion indicated by a dashed-dotted line A3-A4 in FIG. 15(A), and is a cross-sectional view in the channel width direction of the transistor 200. For clarity of the drawing, some components are not illustrated in the top view of FIG. 15(A).

As shown in FIG. 15(A) to (C), the transistor 200 includes an insulator 220 positioned over a substrate (not illustrated), an insulator 222 positioned over the insulator 220, an insulator 224 positioned over the insulator 222, a metal oxide 406a positioned over the insulator 224, a metal oxide 406b positioned to be in contact with at least part of a top surface of the metal oxide 406a, an insulator 412 positioned over the metal oxide 406b, a conductor 404a positioned over the insulator 412, a conductor 404b positioned over the conductor 404a, an insulator 419 positioned over the conductor 404b, an insulator 418 positioned to be in contact with side surfaces of the insulator 412, the conductor 404a, the conductor 404b, and the insulator 419, and an insulator 225 positioned to be in contact with a top surface of the metal oxide 406b and a side surface of the insulator 418. Here, as illustrated in FIG. 15(B), a top surface of the insulator 418 is preferably substantially aligned with a top surface of the insulator 419. The insulator 225 is preferably provided to cover the insulator 419, a conductor 404, the insulator 418, and a metal oxide 406.

Hereinafter, the metal oxide 406a and the metal oxide 406b are collectively referred to as the metal oxide 406. Note that although the metal oxide 406a and the metal oxide 406b are stacked in the transistor 200, the present invention is not limited thereto. For example, a structure in which only the metal oxide 406b is provided may be employed. Furthermore, hereinafter, the conductor 404a and the conductor 404b are collectively referred to as a conductor 404. Note that although the conductor 404a and the conductor 404b are stacked in the transistor 200, the present invention is not limited thereto. For example, a structure in which only the conductor 404b is provided may be employed.

A conductor 440 includes a conductor 440a and a conductor 440b, and the conductor 440a is formed in contact with an inner wall of an opening in an insulator 384 and the conductor 440b is formed on the inner side. Here, the level of top surfaces of the conductor 440a and the conductor 440b and the level of a top surface of the insulator 384 can be substantially the same. Note that although the conductor 440a and the conductor 440b are stacked in the transistor 200, the present invention is not limited thereto. For example, a structure in which only the conductor 440b is provided may be employed.

A conductor 310 includes a conductor 310a and a conductor 310b, and the conductor 310a is formed in contact with an inner wall of an opening in the insulator 214 and the insulator 216 and the conductor 310b is formed on the inner side. Thus, a structure in which the conductor 310a is in contact with the conductor 440b is preferable. Here, the level of top surfaces of the conductor 310a and the conductor 310b and the level of a top surface of the insulator 216 can be substantially the same. Note that although the conductor 310a and the conductor 310b are stacked in the transistor 200, the present invention is not limited thereto. For example, a structure in which only the conductor 310b is provided may be employed.

The conductor 404 can function as a top gate and the conductor 310 can function as a back gate. The potential of the back gate may be the same as the potential of the top gate, or may be a ground potential or a given potential. By changing the potential of the back gate independently of that of the top gate, the threshold voltage of the transistor can be changed.

The conductor 440 extends in the channel width direction in a manner similar to that of the conductor 404, and functions as a wiring through which a potential is applied to the conductor 310, i.e., the back gate. Here, when the conductor 310 that is embedded in the insulator 214 and the insulator 216 is provided to be stacked over the conductor 440 functioning as the wiring for applying a potential to the back gate, the insulator 214, the insulator 216, and the like are provided between the conductor 440 and the conductor 404, whereby the parasitic capacitance between the conductor 440 and the conductor 404 can be reduced and the withstand voltage can be increased. The reduction in the parasitic capacitance between the conductor 440 and the conductor 404 can improve the switching speed of the transistor, so that the transistor can have high frequency characteristics. Furthermore, an increase in the withstand voltage between the conductor 440 and the conductor 404 can improve the reliability of the transistor 200. Therefore, the film thicknesses of the insulator 214 and the insulator 216 are preferably large. Note that the extending direction of the conductor 440 is not limited thereto; for example, it may extend in the channel length direction of the transistor 200.

Here, it is preferred to use a conductive material that has a function of inhibiting the passage of impurities such as water or hydrogen (a conductive material through which the impurities are less likely to pass) for the conductor 310a and the conductor 440a. For example, tantalum, tantalum nitride, ruthenium, ruthenium oxide, or the like is preferably used, and a single layer or stacked layers are used. This can inhibit diffusion of impurities such as hydrogen or water from a lower layer into an upper layer through the conductor 440 and the conductor 310. Note that it is preferred that the conductor 310a and the conductor 440a have a function of inhibiting the passage of impurities such as hydrogen atoms, hydrogen molecules, water molecules, oxygen atoms, oxygen molecules, nitrogen atoms, nitrogen molecules, nitrogen oxide molecules (e.g., $N_2O$, NO, and $NO_2$), and copper atoms or oxygen (at least one of oxygen atoms and oxygen molecules). Furthermore, hereinafter, the same applies to the description of a conductive material that has a function of inhibiting the passage of impurities. When the conductor 310a and the conductor 440a have a function of inhibiting the passage of oxygen, the conductivities of the conductor 310b and the conductor 440b can be prevented from being lowered because of oxidation.

Moreover, a conductive material containing tungsten, copper, or aluminum as its main component is preferably used for the conductor 310b. Although not illustrated, the conductor 310b may have a stacked-layer structure, for example, a stacked layer of any of the above conductive materials and titanium or titanium nitride.

Furthermore, since the conductor 440b functions as a wiring, a conductor having higher conductivity than the conductor 310b is preferably used; for example, a conductive material including copper or aluminum as its main component can be used. Although not illustrated, the conductor 440b may have a stacked-layer structure, for example, a stacked layer of any of the above conductive materials and titanium or titanium nitride.

The insulator 214 can function as barrier insulating films that prevent impurities such as water or hydrogen from entering the transistor from a lower layer. The insulator 214 is preferably formed using an insulating material having a function of inhibiting the passage of impurities such as water or hydrogen. For example, it is preferable that silicon nitride, or the like be used for the insulator 214. This can inhibit diffusion of impurities such as hydrogen or water to a layer positioned above the insulator 214. Note that it is preferred that the insulator 214 have a function of inhibiting the passage of at least one of impurities such as hydrogen atoms, hydrogen molecules, water molecules, nitrogen atoms, nitrogen molecules, nitrogen oxide molecules (e.g., $N_2O$, NO, and $NO_2$), and copper atoms. Furthermore, hereinafter, the same applies to the description of an insulating material that has a function of inhibiting the passage of impurities.

Furthermore, the insulator 214 is preferably formed using an insulating material having a function of inhibiting the passage of oxygen (e.g., oxygen atoms or oxygen molecules). This can inhibit downward diffusion of oxygen contained in the insulator 224 or the like.

Furthermore, with the structure in which the conductor 310 is stacked over the conductor 440, the insulator 214 can be provided between the conductor 440 and the conductor 310. Here, even when a metal that is easily diffused, such as copper, is used for the conductor 440b, silicon nitride or the like provided as the insulator 214 can prevent diffusion of the metal to a layer above the insulator 214.

Furthermore, the insulator 222 is preferably formed using an insulating material that has a function of inhibiting the passage of oxygen and impurities such as water or hydrogen; for example, aluminum oxide or hafnium oxide is preferably used. This can suppress diffusion of impurities such as hydrogen or water from a layer under the insulator 222 to a layer over the insulator 222. Moreover, downward diffusion of oxygen contained in the insulator 224 or the like can be suppressed.

Furthermore, the concentration of impurities such as water, hydrogen, or nitrogen oxide in the insulator 224 is preferably lowered. The amount of hydrogen released from the insulator 224, which is converted into hydrogen molecules per unit area of the insulator 224, may be less than or equal to $2 \times 10^{15}$ molecules/cm$^2$, preferably less than or equal to $1 \times 10^{15}$ molecules/cm$^2$, further preferably less than or equal to $5 \times 10^{14}$ molecules/cm$^2$ in thermal desorption spectroscopy (TDS) within the film surface temperature range from 50° C. to 500° C., for example. The insulator 224 is preferably formed using an insulator from which oxygen is released by heating.

The insulator 412 can function as a first gate insulating film, and the insulator 220, the insulator 222, and the insulator 224 can function as second gate insulating films. Although a structure in which the insulator 220, the insulator 222, and the insulator 224 are stacked in the transistor 200 is illustrated, the present invention is not limited thereto. For example, a structure in which any two of the insulator 220, the insulator 222, and the insulator 224 are stacked may be employed, or a structure in which any one of them is used may be employed.

A metal oxide functioning as an oxide semiconductor is preferably used for the metal oxide 406. A metal oxide whose energy gap is greater than or equal to 2 eV, preferably greater than or equal to 2.5 eV, is preferably used. With use of a metal oxide having such a wide energy gap, the off-state current of the transistor can be reduced.

A transistor using a metal oxide has an extremely low leakage current in a non-conduction state; thus, a semiconductor device with low power consumption can be provided. Moreover, the metal oxide can be deposited by a sputtering method or the like, and thus can be used for a transistor included in a highly integrated semiconductor device.

The metal oxide 406 preferably contains at least indium or zinc. It is particularly preferable that indium and zinc are contained. Furthermore, aluminum, gallium, yttrium, tin, or the like is preferably contained in addition to them. Furthermore, one or more kinds selected from boron, silicon, titanium, iron, nickel, germanium, zirconium, molybdenum, lanthanum, cerium, neodymium, hafnium, tantalum, tungsten, magnesium, and the like may be contained.

Here, the case where the metal oxide 406 is an In-M-Zn oxide containing indium, an element M, and zinc is considered. Note that the element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, magnesium, and the like. Note that a plurality of the above-described elements may be combined as the element M.

Note that in this specification and the like, a metal oxide containing nitrogen is also collectively referred to as a metal oxide in some cases. A metal oxide containing nitrogen may be referred to as a metal oxynitride.

Here, the atomic ratio of the element M to constituent elements in a metal oxide used as the metal oxide 406a is preferably greater than the atomic ratio of the element M to constituent elements in a metal oxide used as the metal oxide 406b. Moreover, the atomic ratio of the element M to In in the metal oxide used as the metal oxide 406a is preferably greater than the atomic ratio of the element M to In in the metal oxide used as the metal oxide 406b. Furthermore, the atomic ratio of In to the element M in the metal oxide used as the metal oxide 406b is preferably greater than the atomic ratio of In to the element M in the metal oxide used as the metal oxide 406a.

By using the above metal oxide as the metal oxide 406a, it is preferable that the energy of the conduction band minimum of the metal oxide 406a be higher than the energy of the conduction band minimum of a region of the metal oxide 406b where the energy of the conduction band minimum is low. In other words, the electron affinity of the metal oxide 406a is preferably smaller than the electron affinity of the region of the metal oxide 406b where the energy of the conduction band minimum is low.

Here, the energy level at the conduction band minimum gently changes in the metal oxide 406a and the metal oxide 406b. In other words, it can be said that the energy level of the conduction band minimum continuously changes or continuously connected. To obtain such a structure, the density of defect states in a mixed layer formed at the interface between the metal oxide 406a and the metal oxide 406b is decreased.

Specifically, when the metal oxide 406a and the metal oxide 406b contain a common element (as a main component) in addition to oxygen, a mixed layer with a low density of defect states can be formed. For example, in the case where the metal oxide 406b is an In—Ga—Zn oxide, an In—Ga—Zn oxide, a Ga—Zn oxide, gallium oxide, or the like is used for the metal oxide 406a.

At this time, a narrow-gap portion formed in the metal oxide 406b functions as a main carrier path. Since the density of defect states at the interface between the metal oxide 406a and the metal oxide 406b can be decreased, the influence of interface scattering on carrier conduction can be small and a high on-state current can be obtained.

The metal oxide 406 includes a region 426a, a region 426b, and a region 426c. The region 426a is positioned between the region 426b and the region 426c as shown in FIG. 15(B). The region 426b and the region 426c are regions where resistance is reduced by deposition of the insulator 225 and regions with higher conductivity than the region 426a. Impurity elements such as hydrogen or nitrogen, which are contained in an atmosphere where the insulator 225 is deposited, are added to the region 426b and the region 426c. By this, oxygen vacancies are formed with the added impurity elements, and the impurity elements enter the oxygen vacancies mainly in a region of the metal oxide 406b overlapping with the insulator 225, thereby increasing the carrier density and reducing the resistance.

Therefore, the region 426b and the region 426c preferably have a higher concentration of at least one of hydrogen and nitrogen than the region 426a. The concentration of hydrogen or nitride can be measured by secondary ion mass spectrometry (SIMS) or the like. Here, as the concentration of hydrogen or nitride in the region 426a, the concentration of hydrogen or nitrogen in the middle of the region of the metal oxide 406b that overlaps with the insulator 412 (e.g., a portion in the metal oxide 406b which is located equidistant from both side surfaces of the insulator 412 in the channel length direction) can be measured.

Note that the resistance of the region 426b and the region 426c to which an element that forms an oxygen vacancy or an element bonded with an oxygen vacancy is added is reduced. Typical examples of such an element include hydrogen, boron, carbon, nitrogen, fluorine, phosphorus, sulfur, chlorine, titanium, and a rare gas. Typical examples of the rare gas element are helium, neon, argon, krypton, and xenon. Accordingly, the region 426b and the region 426c are made to contain one or more of the above elements.

Furthermore, it is preferable that the atomic ratio of In to the element M in the region 426b and the region 426c of the metal oxide 406a be comparable with the atomic ratio of In to the element M of the metal oxide 406b. In other words, in the metal oxide 406a, the atomic ratio of In to the element M in the region 426b and the region 426c is preferably larger than that in the region 426a. Here, when the indium content in the metal oxide 406 is increased, the carrier density is increased and the resistance can be decreased. With such a structure, even in the manufacturing process of the transistor 200, the thickness of the metal oxide 406b is reduced and the electric resistance of the metal oxide 406b is high; thus, the resistance of the metal oxide 406a in the region 426b and the region 426c is sufficiently reduced, and the region 426b and the region 426c in the metal oxide 406 can function as a source region and a drain region.

Figure 16A:
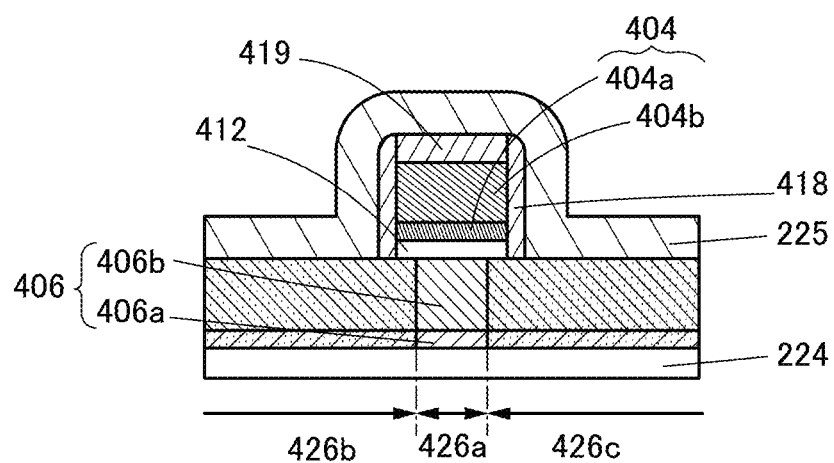
[FIG. 16] Cross-sectional views each illustrating a structure example of a transistor.

FIG. 16(A) is an enlarged view of the vicinity of the region 426a illustrated in FIG. 15(B). As illustrated in FIG. 16(A), the region 426b and the region 426c are formed in at least the regions of the metal oxide 406 that overlap with the insulator 225. Here, one of the region 426b and the region 426c in the metal oxide 406b can function as a source region, and the other can function as a drain region. Furthermore, the region 426a of the metal oxide 406b can function as a channel formation region.

Although the regions 426a, 426b, and 426c are formed in the metal oxide 406b and the metal oxide 406a in FIG. 15(B) and FIG. 16(A), these regions are formed at least in the metal oxide 406b. Although boundaries between the region 426a and the region 426b and the boundary between the regions 426a and 426c are substantially perpendicular to the top surface of the metal oxide 406 in FIG. 15(B) and the like, this embodiment is not limited to this structure. For example, in some cases, the region 426b and the region 426c extend to the conductor 404 side in the vicinity of a surface of the metal oxide 406b, and recede to the insulator 225 side in the vicinity of the bottom surface of the metal oxide 406a.

In the transistor 200, as illustrated in FIG. 16(A), the region 426b and the region 426c are formed in regions of the metal oxide 406 in contact with the insulator 225, and the regions that overlap with the vicinity of both end portions of the insulator 412 and the insulator 418. In that case, portions of the region 426b and the region 426c, which overlap with the conductor 404, function as so-called overlap regions (also referred to as Lov regions). With the Lov regions, a high resistance region is not formed between the channel formation region and the source or drain region of the metal oxide 406; thus, the on-state current and the mobility of the transistor can be increased.

Figure 16B:
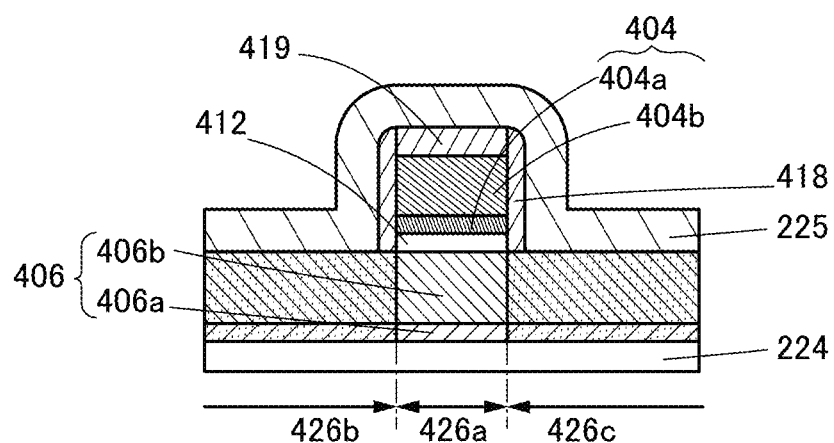

However, the semiconductor device described in this embodiment is not limited thereto. For example, as illustrated in FIG. 16(B), the region 426b and the region 426c may be formed in regions of the metal oxide 406 that overlap with the insulator 225 and the insulator 418. Note that in the structure illustrated in FIG. 16(B), the width of the conductor 404 in the channel length direction is substantially the same as the width of the region 426a. Since the structure illustrated in FIG. 16(B) is employed, the on-state current of the transistor can be increased because a high resistance region is not formed between the source and drain regions. Moreover, since the gate does not overlap with the source region and the drain region in the channel length direction in the structure illustrated in FIG. 16(B), formation of unnecessary capacitance can be inhibited.

Thus, by appropriately selecting the areas of the region 426b and the region 426c, a transistor having electrical characteristics required in the circuit design can be easily provided.

The insulator 412 is preferably provided in contact with the top surface of the metal oxide 406b. The insulator 412 is preferably formed using an insulator from which oxygen is released by heating. When such an insulator 412 is provided in contact with the top surface of the metal oxide 406b, oxygen can be supplied to the metal oxide 406b effectively. Furthermore, as in the insulator 224, the concentration of an impurity such as water or hydrogen in the insulator 412 is preferably reduced. The thickness of the insulator 412 is preferably greater than or equal to 1 nm and less than or equal to 20 nm, and may be approximately 1 nm, for example.

The insulator 412 preferably contains oxygen. For example, the released amount of oxygen molecules that is converted into the released amount of oxygen molecules per unit area of the insulator 412 is higher than or equal to $1\times10^{14}$ molecules/cm$^2$, preferably higher than or equal to $2\times10^{14}$ molecules/cm$^2$, further preferably higher than or equal to $4\times10^{14}$ molecules/cm$^2$ in a thermal desorption spectroscopy analysis method (TDS analysis) in the range of a surface temperature higher than or equal to 100° C. and lower than or equal to 700° C. or higher than or equal to 100° C. and lower than or equal to 500° C.

The insulator 412, the conductor 404, and the insulator 419 include a region overlapping with the metal oxide 406b. In addition, side surfaces of the insulator 412, the conductor 404a, the conductor 404b, and the insulator 419 are preferably aligned with each other.

A conductive oxide is preferably used for the conductor 404a. For example, the metal oxide that can be used as the metal oxide 406a or the metal oxide 406b can be used. In particular, an In—Ga—Zn-based oxide with an atomic ratio of [In]:[Ga]:[Zn]=4:2:3 to 4:2:4.1 or the vicinity thereof, which has high conductivity, is preferably used. When such a conductor 404a is provided, passage of oxygen to the conductor 404b can be inhibited, and an increase in electric resistance value of the conductor 404b due to oxidation can be prevented.

When such a conductive oxide is deposited by a sputtering method, oxygen can be added to the insulator 412, so that oxygen can be supplied to the metal oxide 406b. Thus, oxygen vacancies in the region 426a of the metal oxide 406 can be reduced.

The conductor 404b can be formed using a metal such as tungsten, for example. Furthermore, as the conductor 404b, a conductor that can add impurities such as nitrogen to the conductor 404a to improve the conductivity of the conductor 404a may be used. For example, titanium nitride or the like is preferably used for the conductor 404b. Alternatively, the conductor 404b may have a structure in which a metal such as tungsten is stacked over a metal nitride such as titanium nitride.

Here, the conductor 404 functioning as a gate electrode is provided to cover the top surface in the vicinity of the region 426a and the side surface, which is in the channel width direction, of the metal oxide 406b with the insulator 412 interposed therebetween. Thus, the electric field of the conductor 404 functioning as a gate electrode can electrically surround the top surface in the vicinity of the region 426a and the side surface, which is in the channel width direction, of the metal oxide 406b. Such a transistor structure in which a channel formation region is electrically surrounded by an electric field of the conductor 404 is referred to as a surrounded channel (s-channel) structure. Thus, a channel can be formed in the top surface in the vicinity of the region 426a and the side surface in the channel width direction of the metal oxide 406b, whereby a large amount of current can flow between the source and the drain, and a current in an on state (on-state current) can be increased. Since the top surface in the vicinity of the region 426a and the side surface in the channel width direction of the metal oxide 406b are surrounded by the electric field of the conductor 404, a leakage current in an off state (off-state current) can be small.

The insulator 419 is preferably provided over the conductor 404b. In addition, it is preferable that side surfaces of the insulator 419, the conductor 404a, the conductor 404b, and the insulator 412 be substantially aligned with each other. The insulator 419 is preferably deposited using an atomic layer deposition (ALD: Atomic Layer Deposition) method. Thus, the insulator 419 can be formed to have a thickness approximately greater than or equal to 1 nm and less than or equal to 20 nm, preferably greater than or equal to 5 nm and less than or equal to 10 nm. Here, as in the insulator 418, the insulator 419 is preferably formed using an insulating material that has a function of inhibiting the passage of oxygen and impurities such as water or hydrogen; for example, aluminum oxide or hafnium oxide is preferably used.

When the insulator 419 is provided, the insulator 419 and the insulator 418 which have a function of inhibiting the penetration of oxygen and impurities such as water or hydrogen can cover the top and side surfaces of the conductor 404. This can prevent entry of impurities such as water or hydrogen into the metal oxide 406 through the conductor 404. Thus, the insulator 418 and the insulator 419 have a function of a gate cap that protects the gate.

The insulator 418 is provided in contact with the side surface of the insulator 412, the conductor 404, and the insulator 419. The top surface of the insulator 418 is preferably substantially aligned with the top surface of the insulator 419. The insulator 418 is preferably formed by an ALD method. In that case, the thickness of the insulator 418 can be greater than or equal to 1 nm and less than or equal to 20 nm, preferably greater than or equal to 1 nm and less than or equal to 3 nm, and can be formed to a thickness of 1 nm.

As described above, the region 426b and the region 426c of the metal oxide 406 are formed using an impurity element added in the formation of the insulator 225. In the case where the transistor is miniaturized to have a channel length of approximately 10 nm to 30 nm, impurity elements contained in the source region or the drain region might be diffused to bring electrical connection between the source region and the drain region. In contrast, the insulator 418 is formed as described in this embodiment, whereby the distance between regions of the metal oxide 406 in contact with the insulator 225 can be increased; thus, the source region and the drain region can be prevented from being electrically connected to each other. Furthermore, when the insulator 418 is formed using an ALD method, the thickness thereof is as small as or smaller than the length of the miniaturized channel length, an excessive increase of the distance between the source region and the drain region is not caused, and thereby an increase in the resistance can be prevented.

Here, the insulator 418 is preferably formed using an insulating material that has a function of inhibiting the passage of oxygen and impurities such as water or hydrogen; for example, aluminum oxide or hafnium oxide is preferably used. In this manner, oxygen in the insulator 412 can be prevented from being diffused to the outside. In addition, impurities such as hydrogen and water can be inhibited from entering the metal oxide 406 from the end portion of the insulator 412 or the like.

The insulator 418 is preferably formed in such a manner that an insulating film is formed by an ALD method and then anisotropic etching is performed so as to leave portions in contact with the side surfaces of the insulator 412, the conductor 404, and the insulator 419. Thus, an insulator having a small thickness as described above can be easily formed. At this time, the insulator 419 is provided over the conductor 404, whereby the insulator 418 can remain sufficiently at the portion in contact with the insulator 412 and the conductor 404 even when the insulator 419 is partly removed by the anisotropic etching.

Here, the insulator 225 is provided to cover the insulator 419, the insulator 418, the metal oxide 406, and the insulator 224. Here, the insulator 225 is provided in contact with the top surface of the insulator 419 and the insulator 418 and the side surfaces of the insulator 418. As described above, in the insulator 225, impurities such as hydrogen or nitrogen are added to the metal oxide 406, so that the region 426b and the region 426c are formed. Therefore, the insulator 225 preferably contains at least one of hydrogen and nitrogen.

The insulator 225 is preferably provided in contact with side surfaces of the metal oxide 406b and the metal oxide 406a as well as the top surface of the metal oxide 406b. This enables a resistance reduction in the region 426b and the region 426c to proceed to the side surface of the metal oxide 406b and the side surface of the metal oxide 406a.

Furthermore, the insulator 225 is preferably formed using an insulating material having a function of inhibiting the passage of impurities such as water or hydrogen and oxygen. For example, for the insulator 225, silicon nitride, silicon nitride oxide, silicon oxynitride, aluminum nitride, or aluminum nitride oxide is preferably used. Formation of such an insulator 225 can prevent oxygen from passing through the insulator 225 and being supplied to oxygen vacancies in the region 426b and the region 426c, so that a reduction in carrier density can be prevented. Furthermore, it is possible to prevent impurities such as water or hydrogen from passing through the insulator 225 and the region 426b and the region 426c from excessively enlarging to the region 426a side.

The insulator 280 is preferably provided over the insulator 225. As in the insulator 224 or the like, the concentration of an impurity such as water or hydrogen in the film of the insulator 280 is preferably reduced.

In openings formed in the insulator 280 and the insulator 225, a conductor 450a and a conductor 451a, and a conductor 450b and a conductor 451b are provided. The conductor 450a and the conductor 451a, and the conductor 450b and the conductor 451b are preferably provided to face each other with the conductor 404 sandwiched therebetween.

Here the conductor 450a is formed in contact with an inner wall of the opening in the insulator 280 and the insulator 225, and the conductor 451a is provided on the inner side. The region 426b of the metal oxide 406 is positioned in at least part of a bottom of the opening, and the conductor 450a is in contact with the region 426b. Similarly, the conductor 450b is formed in contact with an inner wall of the opening in the insulator 280 and the insulator 225, and the conductor 451b is formed on an inner side. The region 426c of the metal oxide 406 is positioned in at least part of a bottom of the opening, and the conductor 450b is in contact with the region 426c.

The conductor 450a and the conductor 451a each function as one of a source electrode and a drain electrode, and the conductor 450b and the conductor 451b each function as the other of the source electrode and the drain electrode.

The conductor 450a and the conductor 450b are preferably formed using a conductive material having a function of inhibiting the passage of impurities such as water or hydrogen, like the conductor 310a or the like. For example, tantalum, tantalum nitride, titanium, titanium nitride, ruthenium, ruthenium oxide, or the like is preferably used, and a single layer or stacked layers are used. Thus, an impurity such as water or hydrogen can be inhibited from entering the metal oxide 406 through the conductor 451a and the conductor 451b from a layer above the insulator 280.

Furthermore, the conductor 451a and the conductor 451b are preferably formed using a conductive material containing tungsten, copper, or aluminum as its main component. Although not illustrated, the conductor 451a and the conductor 451b may have stacked-layer structures and may be, for example, stacked layers of the above-described conductive material and titanium or titanium nitride.

Next, component materials of the transistor 200 will be described.
<Substrate>

As a substrate over which the transistor 200 is formed, an insulator substrate, a semiconductor substrate, or a conductor substrate may be used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like and a compound semiconductor substrate containing silicon carbide, silicon germanium, gallium arsenide, indium phosphide, zinc oxide, or gallium oxide. Moreover, as the substrate over which the transistor 200 is formed, a semiconductor substrate in which an insulator region is included in the above semiconductor substrate, e.g., an SOI (Silicon On Insulator) substrate or the like is used. Examples of the conductor substrate include a graphite substrate, a metal substrate, an alloy substrate, and a conductive resin substrate. Alternatively, examples of the substrate over which the transistor 200 is formed includes a substrate including a metal nitride and a substrate including an oxide of a metal. Furthermore, a substrate in which an insulator substrate provided with a conductor or a semiconductor, a substrate in which a semiconductor substrate is provided with a conductor or an insulator, a substrate in which a conductor substrate is provided with a semiconductor or an insulator, or the like is used. Alternatively, any of these substrates over which an element is provided may be used. Examples of the element provided over the substrate include a capacitor, a resistor, a switching element, a light-emitting element, and a memory element.

Alternatively, a flexible substrate may be used as the substrate over which the transistor 200 is formed. Note that as a method for providing a transistor over a flexible substrate, there is a method in which the transistor is formed over a non-flexible substrate and then the transistor is separated and transferred to the substrate which is a flexible substrate. In that case, a separation layer is preferably provided between the non-flexible substrate and the transistor. Note that as the flexible substrate, a sheet, a film, or a foil containing a fiber may be used. In addition, the substrate may have elasticity. The flexible substrate may have a property of returning to its original shape when bending or pulling is stopped, or may have a property of not returning to its original shape. The non-flexible substrate or the flexible substrate has a region with a thickness, for example, greater than or equal to 5 µm and less than or equal to 700 µm, preferably greater than or equal to 10 µm and less than or equal to 500 µm, further preferably greater than or equal to 15 µm and less than or equal to 300 µm. When the substrate has a small thickness, the weight of the semiconductor device including the transistor can be reduced. Moreover, when the substrate has a small thickness, even in the case of using glass or the like, the substrate may have elasticity or a property of returning to its original shape when bending or pulling is stopped. Thus, an impact applied to a semiconductor device over the substrate, which is caused by dropping or the like, can be reduced. That is, a durable semiconductor device can be provided.

For the flexible substrate, metal, an alloy, a resin, glass, fiber thereof, or the like can be used, for example. The flexible substrate preferably has a lower coefficient of linear expansion because deformation due to an environment is inhibited. For the flexible substrate, a material whose coefficient of linear expansion is lower than or equal to $1 \times 10^{-3}$/K, lower than or equal to $5 \times 10^{-5}$/K, or lower than or equal to $1 \times 10^{-5}$/K can be used, for example. Examples of the resin include polyester, polyolefin, polyamide (nylon, aramid, or the like), polyimide, polycarbonate, and acrylic. In particular, aramid is favorably used for the flexible substrate because of its low coefficient of linear expansion.

<Insulator>

Examples of an insulator include an oxide, a nitride, an oxynitride, a nitride oxide, a metal oxide, a metal oxynitride, and a metal nitride oxide, each of which has an insulating property.

When a transistor is surrounded by an insulator having a function of inhibiting the passage of oxygen and impurities such as hydrogen, the transistor can have stable electrical characteristics. For example, an insulator that has a function of inhibiting the passage of oxygen and impurities such as hydrogen is used as each of the insulator 222 and the insulator 214.

As the insulator having a function of inhibiting the passage of oxygen and impurities such as hydrogen, a single layer or a stacked layer of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum may be used.

Furthermore, for the insulator 222 and the insulator 214, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like may be used, for example. Note that the insulator 222 and the insulator 214 preferably contain aluminum oxide, hafnium oxide, or the like.

As the insulator 384, the insulator 216, the insulator 220, the insulator 224, and the insulator 412, for example, a single layer or a stacked layer including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum can be used. For example, the insulator 384, the insulator 216, the insulator 220, the insulator 224, and the insulator 412 each preferably contain silicon oxide, silicon oxynitride, or silicon nitride.

The insulator 220, the insulator 222, the insulator 224 and/or the insulator 412 preferably include an insulator with a high dielectric constant. For example, the insulator 220, the insulator 222, the insulator 224 and/or the insulator 412 preferably contain gallium oxide, hafnium oxide, zirconium oxide, an oxide containing aluminum and hafnium, oxynitride containing aluminum and hafnium, an oxide containing silicon and hafnium, oxynitride containing silicon and hafnium, a nitride containing silicon and hafnium, or the like. Alternatively, the insulator 220, the insulator 222, the insulator 224 and/or the insulator 412 preferably have a stacked-layer structure of an insulator with a high dielectric constant and silicon oxide or silicon oxynitride. When silicon oxide and silicon oxynitride, which are thermally stable, are combined with an insulator with a high dielectric constant, the stacked-layer structure can have thermal stability and a high dielectric constant. For example, when a structure is employed in which aluminum oxide, gallium oxide, or hafnium oxide is in contact with the metal oxide 406 in each of the insulator 224 and the insulator 412, silicon contained in silicon oxide or silicon oxynitride can be inhibited from entering the metal oxide 406. Furthermore, for example, when a structure is employed in which silicon oxide or silicon oxynitride is in contact with the metal oxide 406 in each of the insulator 224 and the insulator 412, trap centers are formed at the interface between aluminum oxide, gallium oxide, or hafnium oxide and silicon oxide or silicon oxynitride, in some cases. The trap centers can shift the threshold voltage of the transistor in the positive direction by trapping electrons in some cases.

The insulator 384, the insulator 216, and the insulator 280 preferably include an insulator with a low dielectric constant. For example, the insulator 384, the insulator 216, and the insulator 280 preferably include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or a resin. Alternatively, each of the insulator 384, the insulator 216, and the insulator 280 preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and low dielectric constant. Examples of the resin include polyester, polyolefin, polyamide (e.g., nylon or aramid), polyimide, polycarbonate, and acrylic.

As the insulator 418 and the insulator 419, an insulator having a function of inhibiting the passage of oxygen and impurities such as hydrogen is used. For the insulator 418 and the insulator 419, a metal oxide such as aluminum oxide, hafnium oxide, magnesium oxide, gallium oxide, germanium oxide, yttrium oxide, zirconium oxide, lanthanum oxide, neodymium oxide, or tantalum oxide; silicon nitride oxide; silicon nitride; or the like may be used, for example.

<Conductor>

The conductor 404a, the conductor 404b, the conductor 310a, the conductor 310b, the conductor 450a, the conductor 450b, the conductor 451a, and the conductor 451b can be formed using a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like. For the conductor 404a, the conductor 404b, the conductor 310a, the conductor 310b, the conductor 450a, the conductor 450b, the conductor 451a, and the conductor 451b, a semiconductor having a high electric conductivity typified by polycrystalline silicon including an impurity element such as phosphorus, or silicide such as nickel silicide may be used.

Alternatively, for the above conductors, particularly the conductor 404a, the conductor 310a, the conductor 450a, and the conductor 450b, a metal element included in a metal oxide applicable to the metal oxide 406 and a conductive material containing oxygen may be used. Alternatively, the above-mentioned metal element and a conductive material containing nitrogen may be used. For example, as the conductive material, a conductive material containing nitrogen, such as titanium nitride or tantalum nitride, can be used.

The conductor 404a, the conductor 310a, the conductor 450a, and the conductor 450b can be indium tin oxide, indium oxide containing tungsten oxide, indium zinc oxide containing tungsten oxide, indium oxide containing titanium oxide, indium tin oxide containing titanium oxide, indium zinc oxide, and indium tin oxide to which silicon is added, or indium gallium zinc oxide containing nitrogen. With use of such a material, hydrogen contained in the metal oxide 406 can be captured in some cases. Alternatively, hydrogen entering from an external insulator or the like can be captured in some cases.

A plurality of conductive layers formed using the above materials may be stacked and used for the conductor 404a, the conductor 310a, the conductor 450a, and the conductor 450b. For example, a stacked-layer structure combining a material containing the above metal element and a conductive material containing oxygen may be employed. Furthermore, the conductor 404a, the conductor 310a, the conductor 450a, and the conductor 450b may have a stacked structure in which a material containing the above-described metal element and a conductive material containing nitrogen are combined, or a stacked structure in which a material containing the above-described metal element, a conductive material containing oxygen, and a conductive material containing nitrogen.

Note that in the case where an oxide is used for the channel formation region of the transistor, a stacked-layer structure combining a material containing the above-described metal element and a conductive material containing oxygen is preferably used for the gate electrode. In that case, the conductive material containing oxygen is preferably provided on the channel formation region side. When the conductive material containing oxygen is provided on the channel formation region side, oxygen released from the conductive material is easily supplied to the channel formation region.

<Metal Oxide that can be used for Metal Oxide 406>

The metal oxide 406 of the present invention is described below. A metal oxide functioning as an oxide semiconductor is preferably used for the metal oxide 406.

The metal oxide 406 preferably contains at least indium or zinc, further preferably contains indium and zinc. Furthermore, aluminum, gallium, yttrium, tin, or the like is preferably contained in addition to the metal oxide 406. Furthermore, one or more kinds selected from boron, silicon, titanium, iron, nickel, germanium, zirconium, molybdenum, lanthanum, cerium, neodymium, hafnium, tantalum, tungsten, magnesium, and the like may be contained.

Here, the case where the metal oxide 406 contains indium, the element M, and zinc is considered.

Preferred ranges of the atomic ratio of indium, the element M, and zinc contained in the metal oxide 406 are described below with reference to FIG. 17(A), FIG. 17(B), and FIG. 17(C). Note that the proportion of oxygen atoms is not illustrated in FIG. 17(A), FIG. 17(B), and FIG. 17(C). The terms of the atomic ratio of indium, the element M, and zinc contained in the metal oxide 406 are denoted by [In], [M], and [Zn], respectively.

Figure 17A:
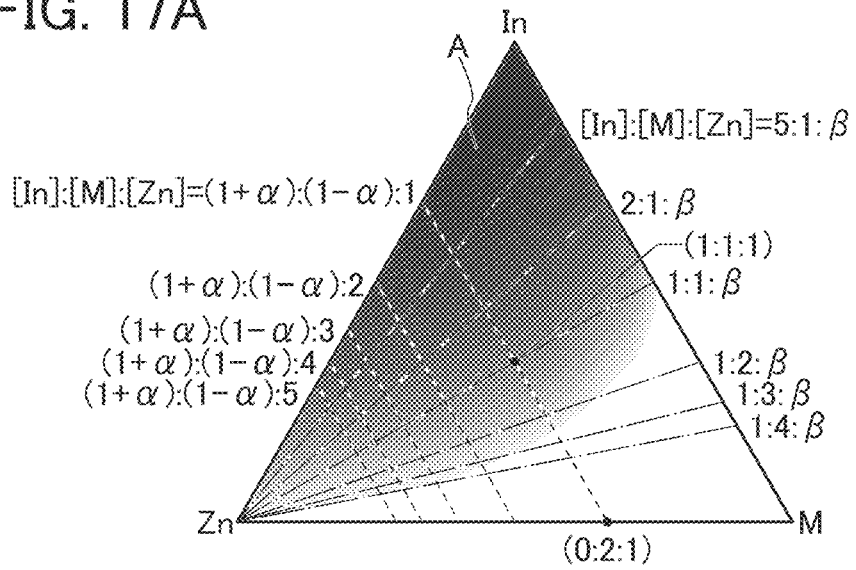
[FIG. 17] Diagrams each illustrating an atomic ratio range of a metal oxide.
Figure 17B:
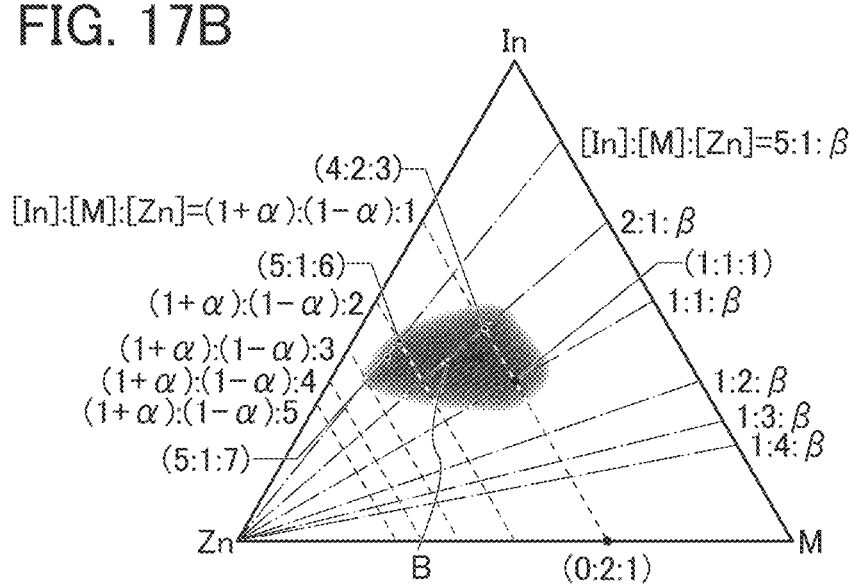
Figure 17C:
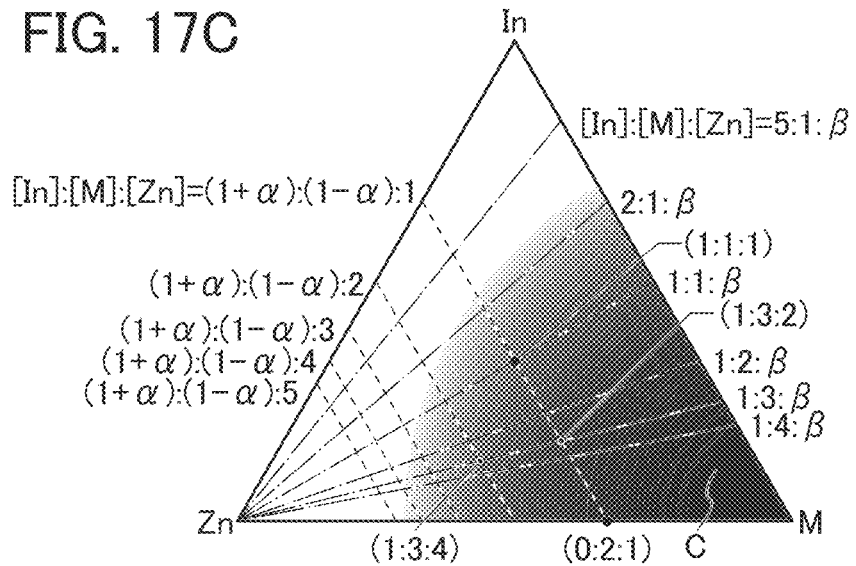

In FIG. 17(A), FIG. 17(B), and FIG. 17(C), dashed lines indicate a line where the atomic ratio of $[In]:[M]:[Zn]=(1+\alpha):(1-\alpha):1$ $(-1\leq\alpha\leq1)$, a line where the atomic ratio of $[In]:[M]:[Zn]=(1+\alpha):(1-\alpha):2$, a line where the atomic ratio of $[In]:[M]:[Zn]=(1+\alpha):(1-\alpha):3$, a line where the atomic ratio of $[In]:[M]:[Zn]=(1+\alpha):(1-\alpha):4$, and a line where the atomic ratio $[In]:[M]:[Zn]=(1+\alpha):(1-\alpha):5$.

Furthermore, dashed-dotted lines indicate a line where the atomic ratio of $[In]:[M]:[Zn]=5:1:\beta(\beta\geq0)$, a line where the atomic ratio of $[In]:[M]:[Zn]=2:1:\beta$, a line where the atomic ratio of $[In]:[M]:[Zn]=1:1:\beta$, a line where the atomic ratio of $[In]:[M]:[Zn]=1:2:\beta$, a line where the atomic ratio of $[In]:[M]:[Zn]=1:3:\beta$, and a line where the atomic ratio of $[In]:[M]:[Zn]=1:4:\beta$.

A metal oxide having the atomic ratio of $[In]:[M]:[Zn]=0:2:1$ or a value in the neighborhood thereof in FIG. 17(A), FIG. 17(B), and FIG. 17(C) tends to have a spinel crystal structure.

A plurality of phases coexist in the metal oxide in some cases (two-phase coexistence or three-phase coexistence, or the like). For example, in the case where the atomic ratio is in the neighborhood of $[In]:[M]:[Zn]=0:2:1$, two phases of a spinel crystal structure and a layered crystal structure are likely to coexist. In addition, in the case where the atomic ratio is in the neighborhood of $[In]:[M]:[Zn]=1:0:0$, two phases of a bixbyite crystal structure and a layered crystal structure are likely to coexist. In the case where a plurality of phases coexist in the metal oxide, a grain boundary might be formed between different crystal structures.

A region A in FIG. 17(A) shows an example of the preferred ranges of the atomic ratio of indium to the element M and zinc contained in the metal oxide 406.

When the indium content of the metal oxide is increased, the carrier mobility (electron mobility) of the metal oxide can be increased. Thus, a metal oxide having a high content of indium has higher carrier mobility than a metal oxide having a low content of indium.

In contrast, when the indium content and the zinc content of a metal oxide become lower, carrier mobility becomes lower. Thus, in the case of an atomic ratio of $[In]:[M]:[Zn]=0:1:0$ and a value in the neighborhood thereof (e.g., a region C in FIG. 17(C)), insulation performance becomes better.

The metal oxide used as the metal oxide 406b preferably has an atomic ratio represented by the region A in FIG. 17(A), with which a high carrier mobility is obtained. The metal oxide used as the metal oxide 406b may have In:Ga:Zn=4:2:3 to 4.1 and approximately a value in the vicinity thereof, for example. By contrast, the metal oxide used as the metal oxide 406a preferably has an atomic ratio represented by the region C illustrated in FIG. 17(C), with which relatively high insulating properties are obtained. The metal oxide used as the metal oxide 406a may have In:Ga:Zn=approximately 1:3:4.

In the region A, particularly in a region B illustrated in FIG. 17(B), an excellent metal oxide having high carrier mobility and high reliability can be obtained.

Note that the region B includes values of $[In]:[M]:[Zn]=4:2:3$ to 4.1 and in the vicinity thereof. The values in the vicinity includes $[In]:[M]:[Zn]=5:3:4$, for example. Note that the region B includes values of $[In]:[M]:[Zn]=5:1:6$ and in the vicinity thereof and values of $[In]:[M]:[Zn]=5:1:7$ and in the vicinity thereof.

In the case where an In-M-Zn oxide is used for the metal oxide 406, it is preferable to use a target including polycrystalline In-M-Zn oxide as the sputtering target. Note that the atomic ratio of the deposited metal oxide varies from the above atomic ratios of metal elements of the sputtering target in a range of ±40%. For example, when the composition ratio of a sputtering target used for the metal oxide 406 is In:Ga:Zn=4:2:4.1 [atomic ratio], the composition ratio of the deposited metal oxide may be In:Ga:Zn=4:2:3 [atomic ratio] or in the neighborhood thereof. When the composition ratio of a sputtering target used for the metal oxide 406 is In:Ga:Zn=5:1:7 [atomic ratio], the composition ratio of the deposited metal oxide may be 5:1:6 [atomic ratio] or in the neighborhood thereof.

Note that the property of a metal oxide is not uniquely determined by an atomic ratio. Even with the same atomic ratio, the property of a metal oxide might be different depending on a formation condition. For example, in the case where the metal oxide 406 is deposited with a sputtering apparatus, a film having an atomic ratio deviated from the atomic ratio of a target is formed. Furthermore, [Zn] in the film might be smaller than [Zn] in the target depending on the substrate temperature in deposition. Thus, the illustrated regions are each a region representing an atomic ratio with which a metal oxide tends to have specific characteristics, and boundaries of the region A to the region C are not precise.

<Composition of Metal Oxide>

Described below is the composition of a CAC (Cloud-Aligned Composite)-OS that can be used for an OS transistor.

Note that in this specification and the like, CAC refers to an example of a function or a material composition, and CAAC (c-axis aligned crystal) described later refers to an example of a crystal structure.

A CAC-OS or a CAC-metal oxide has a conducting function in part of the material and has an insulating function in another part of the material; as a whole, the CAC-OS or the CAC-metal oxide has a function of a semiconductor. In the case where the CAC-OS or the CAC-metal oxide is used in an active layer of a transistor, the conducting function is a function of allowing electrons (or holes) serving as carriers to flow, and the insulating function is a function of not allowing electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

Furthermore, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, the conductive regions are observed to be coupled in a cloud-like manner with their boundaries blurred, in some cases.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS or the CAC-metal oxide includes components having different bandgaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or the CAC-metal oxide is used in a channel region of a transistor, high current drive capability in the on state of the transistor, that is, a high on-state current and high field-effect mobility, can be obtained.

In other words, the CAC-OS or the CAC-metal oxide can also be referred to as a matrix composite or a metal matrix composite.

<Structure of Metal Oxide>

Oxide semiconductors can be classified into single crystal oxide semiconductors and the others, non-single-crystal oxide semiconductors. Examples of the non-single-crystal oxide semiconductors include a CAAC-OS (c-axis-aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement is included in the distortion in some cases. Note that a clear crystal grain boundary (also referred to as grain boundary) cannot be observed even in the vicinity of distortion in the CAAC-OS. That is, it is found that formation of a crystal grain boundary is inhibited by the lattice arrangement distortion. This is probably because the CAAC-OS can tolerate distortion owing to non-dense arrangement of oxygen atoms in the a-b plane direction, an interatomic bond length changed by metal element substitution, and the like.

Furthermore, the CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is an oxide semiconductor with high crystallinity. On the other hand, a clear crystal grain boundary cannot be observed in the CAAC-OS; thus, it can be said that a reduction in electron mobility due to the crystal grain boundary is less likely to occur. Furthermore, entry of impurities, formation of defects, or the like might decrease the crystallinity of the oxide semiconductor; thus, it can also be said that the CAAC-OS is an oxide semiconductor having small amounts of impurities and defects (e.g., oxygen vacancies). Thus, an oxide semiconductor including the CAAC-OS is physically stable. Therefore, the oxide semiconductor including the CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

The a-like OS is an oxide semiconductor having a structure between those of the nc-OS and an amorphous oxide semiconductor. The a-like OS contains a void or a low-density region. That is, the a-like OS has lower crystallinity than the nc-OS and the CAAC-OS.

An oxide semiconductor can have various structures which show different properties. Two or more of the amorphous oxide semiconductor, the polycrystalline oxide semiconductor, the a-like OS, the nc-OS, and the CAAC-OS may be included in an oxide semiconductor of one embodiment of the present invention.

<Transistor including Metal Oxide>

Next, the case where the metal oxide is used for a transistor will be described.

Note that when the above metal oxide semiconductor is used for a transistor, a transistor with high field-effect mobility can be achieved. In addition, the transistor having high reliability can be achieved.

Furthermore, the carrier density in the region 426a of the metal oxide 406b in the transistor is preferably low. In the case where the carrier density of a metal oxide film is reduced, the impurity concentration in the metal oxide is reduced to reduce the density of defect states. In this specification and the like, a state with a low impurity concentration and a low density of defect states is referred to as a highly purified intrinsic or substantially highly purified intrinsic state. For example, the carrier density in the region 426a of the metal oxide 406b may be lower than $8\times10^{11}/cm^3$, preferably lower than $1\times10^{11}/cm^3$, and further preferably lower than $1\times10^{10}/cm^3$, and higher than or equal to $1\times10^{-9}/cm^3$.

The highly purified intrinsic or substantially highly purified intrinsic metal oxide has a low density of defect states and accordingly has a low density of trap states in some cases.

Charges trapped by the trap states in the metal oxide take a long time to disappear and may behave like fixed charges. Thus, a transistor whose channel region is formed in the oxide semiconductor having a high density of trap states has unstable electrical characteristics in some cases.

Accordingly, in order to obtain stable electrical characteristics of the transistor, it is effective to reduce the concentration of impurities in the region 426a of the metal oxide 406b. In addition, in order to reduce the concentration of impurities in the region 426a of the metal oxide 406b, the impurity concentration in an adjacent film is also preferably reduced. Examples of impurities include hydrogen, nitrogen, an alkali metal, an alkaline earth metal, iron, nickel, and silicon.

<Impurity>

Here, the influence of each impurity in the metal oxide will be described.

When silicon or carbon that is a Group 14 element is contained in the metal oxide, defect states are formed in the metal oxide. The concentration of silicon or carbon (the concentration is measured by SIMS) in the region 426a of the metal oxide 406b is set to be lower than or equal to $2\times10^{18}$ atoms/cm$^3$, preferably lower than or equal to $2\times10^{17}$ atoms/cm$^3$.

When the metal oxide contains an alkali metal or an alkaline earth metal, defect states are formed and carriers are generated, in some cases. Thus, a transistor including a metal oxide that contains an alkali metal or an alkaline earth metal is likely to be normally on. Therefore, it is preferable to reduce the concentration of an alkali metal or an alkaline earth metal in the region 426a of the metal oxide 406b. Specifically, the concentration of an alkali metal or an alkaline earth metal in the region 426a of the metal oxide 406b obtained by SIMS is set lower than or equal to $1\times10^{18}$ atoms/cm$^3$, preferably lower than or equal to $2\times10^{16}$ atoms/cm$^3$.

Furthermore, when containing nitrogen, the metal oxide easily becomes n-type by generation of electrons serving as carriers and an increase in carrier density. Thus, a transistor in which the region 426a of the metal oxide 406b contains nitrogen is likely to have normally-on characteristics. Therefore, nitrogen in the region 426a of the metal oxide 406b is preferably reduced as much as possible; for example, the nitrogen concentration in the region 426a of the metal oxide 406b is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$ in SIMS.

Furthermore, hydrogen contained in a metal oxide reacts with oxygen bonded to a metal atom to be water, and thus forms an oxygen vacancy, in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor in which the region 426a of the metal oxide 406b contains much hydrogen is likely to have normally-on characteristics. Therefore, hydrogen in the region 426a of the metal oxide 406b is preferably reduced as much as possible. Specifically, the hydrogen concentration of the metal oxide, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

By sufficiently reducing impurities in the region 426a of the metal oxide 406b, the transistor can have stable electrical characteristics.

<<Transistor 201>>

Next, the details of the transistor 201 illustrated in FIG. 14 will be described.

Figure 18A:
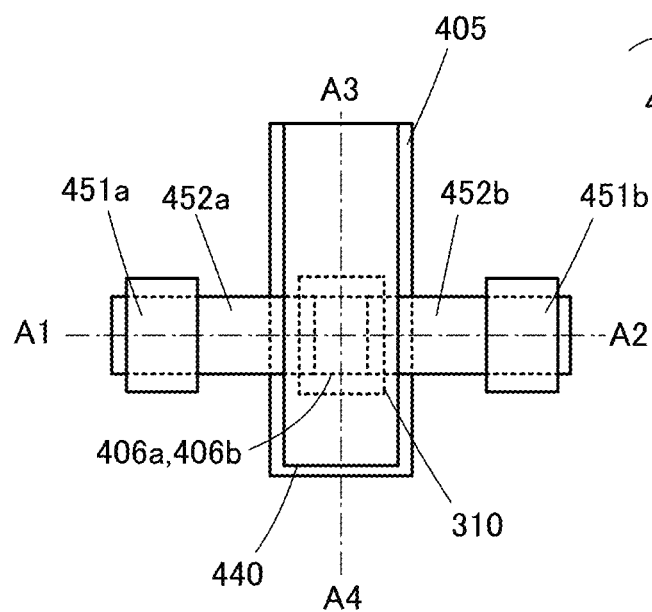
[FIG. 18] A top view and cross-sectional views illustrating a structure example of a transistor.
Figure 18C:
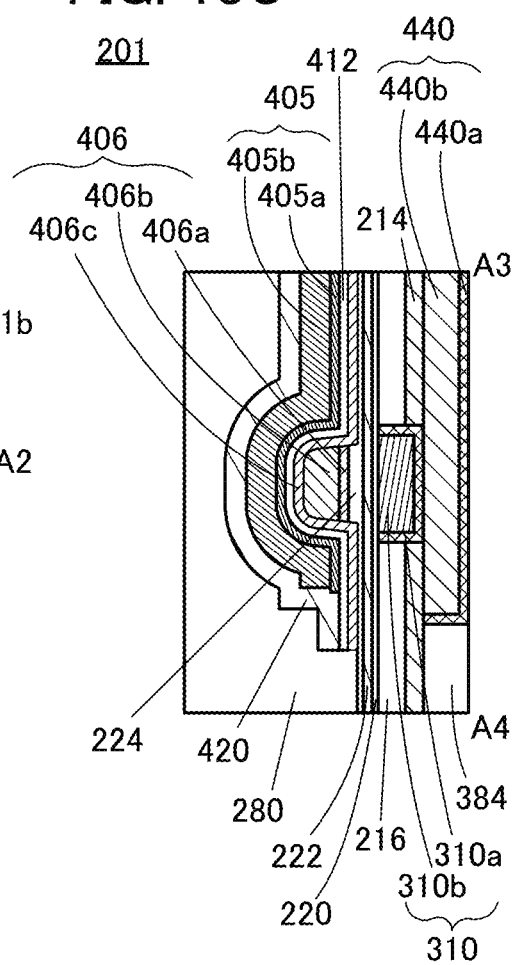
Figure 18B:
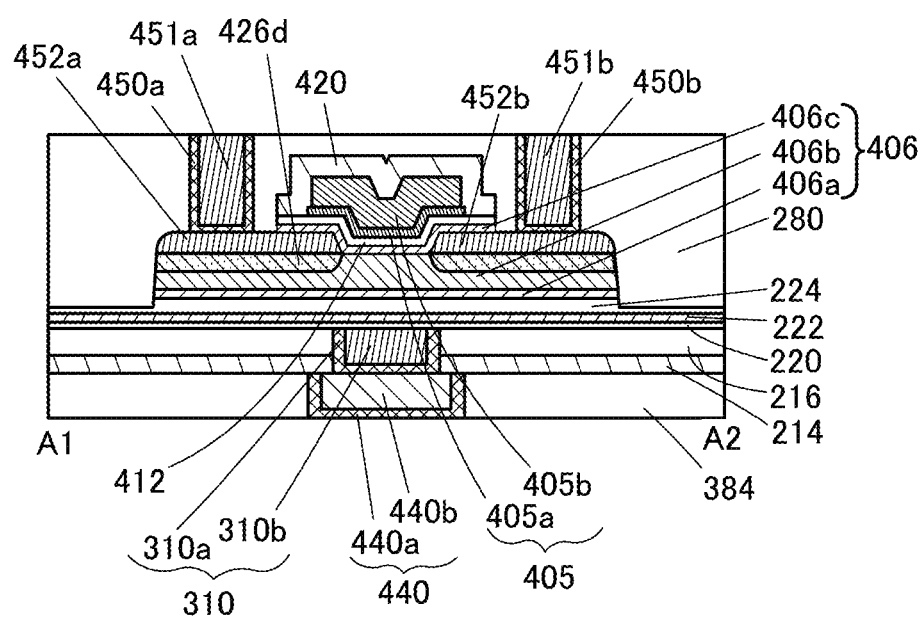

FIG. 18(A) is a top view of the transistor 201. Furthermore, FIG. 18(B) is a cross-sectional view of a portion indicated by a dashed-dotted line A1-A2 in FIG. 18(A), and is a cross-sectional view in the channel length direction of the transistor 201. FIG. 18(C) is a cross-sectional view of a portion indicated by a dashed-dotted line A3-A4 in FIG. 18(A), and is a cross-sectional view in the channel width direction of the transistor 201. For clarity of the drawing, some components are not illustrated in the top view of FIG. 18(A). The components common to the transistor 201 and the transistor 200 are denoted by the same reference numerals.

As shown in FIGS. 18(A) to (C), the transistor 201 includes the insulator 224 positioned over a substrate (not illustrated), the metal oxide 406a positioned over the insulator 224, the metal oxide 406b positioned in contact with at least part of a top surface of the metal oxide 406a, a conductor 452a and a conductor 452b positioned in contact with at least part of a top surface of the metal oxide 406b, a metal oxide 406c that is in contact with at least part of the top surface of the metal oxide 406b and positioned over the conductor 452a and the conductor 452b, the insulator 412 positioned over the metal oxide 406c, a conductor 405a positioned over the insulator 412, a conductor 405b positioned over the conductor 405a, and an insulator 420 positioned over the conductor 405b.

A conductor 405 (the conductor 405a or the conductor 405b) can function as a top gate and the conductor 310 can function as a back gate. The potential of the back gate may be the same as the potential of the top gate, or may be a ground potential or a given potential. By changing the potential of the back gate independently of that of the top gate, the threshold voltage of the transistor can be changed.

The conductor 405a can be formed using a material similar to that of the conductor 404a in FIG. 15. The conductor 405b can be formed using a material similar to that of the conductor 404b in FIG. 15.

The conductor 452a has a function as one of a source electrode and a drain electrode, and the conductor 452b has a function of the other of the source electrode and the drain electrode.

A metal such as aluminum, titanium, chromium, nickel, copper, yttrium, zirconium, molybdenum, silver, tantalum, or tungsten or an alloy containing any of the metals as its main component can be used for the conductors 452a and 452b. Although a single layer structure is shown in the drawing, a stacked-layer structure of two or more layers may be employed. Furthermore, a transparent conductive material containing indium oxide, tin oxide, or zinc oxide may be used.

In the transistor 201, a channel is preferably formed in the metal oxide 406b. Therefore, the metal oxide 406c is preferably formed using a material having a higher insulating property relatively than the metal oxide 406b. The metal oxide 406c may be formed using a material similar to that of the metal oxide 406a.

When the metal oxide 406c is provided, the transistor 201 can be a buried-channel transistor. Moreover, oxidation of end portions of the conductor 452a and the conductor 452b can be prevented. Furthermore, leakage current between the conductor 405 and the conductor 452a (or between the conductor 405 and the conductor 452b) can be prevented. Note that the metal oxide 406c may be omitted in some cases.

The metal oxide 406b includes a region 426d. As illustrated in FIG. 18(B), the region 426d is positioned in a region where the metal oxide 406b is in contact with the conductor 452a and the conductor 452b. The region 426d might be formed by damage in deposition of the conductor 452a and the conductor 452b and by addition of impurities such as nitrogen contained in the deposition atmosphere. By this, in the region 426d of the metal oxide 406b, oxygen vacancies are formed with the added impurity elements, and in addition, the impurity elements enter the oxygen vacancies, thereby increasing the carrier density and reducing the resistance. Note that depending on deposition conditions of the conductor 452a and the conductor 452b, the region 426d is formed only at an interface with the metal oxide 406b in some cases.

An insulating material having a function of inhibiting the passage of impurities such as water or hydrogen and oxygen is preferably used for the insulator 420. As the insulator 420, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like may be used, for example.

When the transistor 201 is provided with the insulator 420, the conductor 405 can be prevented from oxidation. Furthermore, impurities such as water or hydrogen can be prevented from entering the metal oxide 406.

The transistor 201 can have a larger contact area between the metal oxide 406b and the electrode (the source electrode or the drain electrode) than the transistor 200. A step for forming the region 426b and the region 426c illustrated in FIG. 15 is not necessary. Therefore, the transistor 201 can have a larger on-state current than the transistor 200. In addition, the manufacturing process can be simplified.

For the details of other components of the transistor 201, the description of the transistor 200 can be referred to.

Note that this embodiment can be combined with other embodiments in this specification as appropriate.

Embodiment 6

In this embodiment, examples in which the semiconductor device described in the above embodiment is used as a memory device in an electronic component will be described with reference to FIG. 19.

FIG. 19(A) illustrates an example in which the semiconductor device described in any of the above embodiments is used as a memory device in an electronic component. Note that the electronic component is also referred to as a semiconductor package or an IC package. For the electronic component, there are a plurality of standards and names corresponding to a terminal extraction direction and a terminal shape. Thus, examples thereof are described in this embodiment.

A semiconductor device composed of the transistor described in the above Embodiment 1 is completed by integrating a plurality of detachable components on a printed circuit board through an assembly process (post-process).

The post-process can be completed through steps shown in FIG. 19(A). Specifically, after an element substrate obtained in a pre-process is completed (Step STP1), a rear surface of the substrate is ground (Step STP2). The substrate is thinned at this stage, whereby the warpage or the like of the substrate in the pre-process is reduced and the size of the component is reduced.

The rear surface of the substrate is ground, and a dicing step is performed to divide the substrate into a plurality of chips (Step STP3). Then, the divided chips are separately picked up, and a die bonding step is performed to mount and bond them to a lead frame (Step STP4). For the bonding the chip and the lead frame in this die bonding step, an appropriate method, such as the bonding with a resin or the bonding with a tape, is selected in accordance with products, as appropriate. Note that the die bonding step may be performed in such a manner that mounting and bonding are conducted on an interposer.

Note that in this embodiment, when an element is formed on one of surfaces of a substrate, the one surface is referred to as a surface, and the other surface (a surface on which the element is not formed) is referred to as a rear surface.

Next, a wire bonding in which a lead of the lead frame and an electrode on the chip are electrically connected with a metal fine line (wire) is performed (Step STP5). A silver line or a gold line can be used as the metal fine line. Furthermore, ball bonding or wedge bonding can be used as the wire bonding.

A wire-bonded chip is subjected to a molding step of sealing with an epoxy resin or the like (Step STP6). The molding step is performed, whereby the inside of the electronic component is filled with a resin, so that damage to the circuit portion and the wire embedded by external mechanical force can be reduced, and in addition, deterioration of characteristics due to moisture or dust can be reduced.

Next, the lead of the lead frame is subjected to plating treatment. Then, the lead is cut and processed (Step STP7). This plate processing prevents corrosion of the lead and enables more reliable soldering at the time of mounting the electronic component on a printed circuit board in a later step.

Next, printing (marking) is performed on a surface of the package (Step STP8). Then, through a final inspection step (Step STP9), the electronic component is completed (Step STP10).

The above-described electronic component can include the semiconductor device described in the above embodiment. Thus, a highly reliable electronic component can be obtained.

Furthermore, FIG. 19(B) illustrates a perspective schematic view of the completed electronic component. FIG. 19(B) illustrates a perspective schematic view of a QFP (Quad Flat Package) as an example of the electronic component. An electronic component 4700 illustrated in FIG. 19(B) includes a lead 4701 and a circuit portion 4703. The electronic component 4700 illustrated in FIG. 19(B) is mounted on a printed circuit board 4702, for example. A plurality of electronic components 4700 described above which are combined and electrically connected to each other on the printed circuit board 4702 can be mounted inside an electronic device. A completed circuit board 4704 is provided in an electronic device or the like.

Note that one embodiment of the present invention is not limited to the shape of the electronic component 4700, and the element substrate fabricated in Step STP1 can be included. Further, the element substrate of one embodiment of the present invention includes an element substrate that has been subjected up to the grinding of the rear surface of the substrate of Step STP2. In addition, the element substrate of one embodiment of the present invention includes an element substrate that has been subjected up to the dicing step of Step STP3. For example, a semiconductor wafer 4800 or the like illustrated in FIG. 19(C) corresponds to the element substrate. In the semiconductor wafer 4800, a plurality of circuit portions 4802 are formed on a top surface of a wafer 4801. A portion without the circuit portion 4802 on the top surface of the wafer 4801 is a spacing 4803 that is a region for dicing.

The dicing is performed along scribe lines SCL1 and scribe lines SCL2 (referred to as a dicing line or cutting lines in some cases) shown in dashed-dotted lines. Note that to perform the dicing step readily, it is preferable that the spacing 4803 be provided so that a plurality of the scribe lines SCL1 are parallel to each other, the plurality of scribe lines SCL2 are parallel to each other, and the scribe lines SCL1 and the scribe line SCL2 are perpendicular to each other.

With the dicing step, a chip 4800a as illustrated in FIG. 19(D) can be cut out from the semiconductor wafer 4800. The chip 4800a includes a wafer 4801a, the circuit portion 4802, and a spacing 4803a. Note that it is preferable to make the spacing 4803a small as much as possible. In this case, the width of the spacing 4803 between adjacent circuit portions 4802 may be substantially the same as a cutting allowance of the scribe line SCL1 or a cutting allowance of the scribe line SCL2.

Note that the shape of the element substrate of one embodiment of the present invention is not limited to the shape of the semiconductor wafer 4800 illustrated in FIG. 19(C). For example, a rectangular semiconductor wafer 4810 shown in FIG. 19(E) may be used. The shape of the element substrate can be changed as appropriate, depending on a manufacturing process of an element and an apparatus for manufacturing an element.

Note that this embodiment can be combined with other embodiments in this specification as appropriate.

Embodiment 7

A memory device of one embodiment of the present invention can be applied to a variety of removable memory device such as a memory card (for example, an SD card), a USB (Universal Serial Bus) memory, and an SSD (Solid State Drive), that can be provided with the memory device. In this embodiment, some structure examples of the removable memory devices will be described with reference to FIG. 20.

Figure 20A:
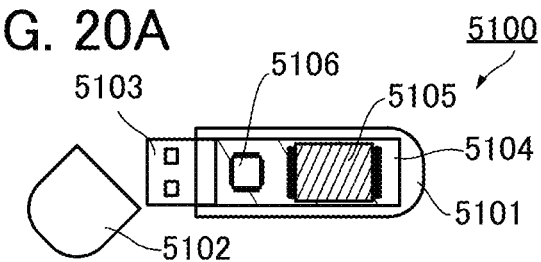
[FIG. 20] Schematic drawings illustrating examples of electronic devices.

FIG. 20(A) is a schematic diagram of a USB memory. A USB memory 5100 includes a housing 5101, a cap 5102, a USB connector 5103, and a substrate 5104. The substrate 5104 is held in the housing 5101. The substrate 5104 is provided with a memory device and a circuit for driving the memory device. For example, a memory chip 5105 and a controller chip 5106 are attached to the substrate 5104. The memory chip 5105 includes the digital-analog converter circuit 11, the writing circuit 12, the row driver 13, the memory cell array 14, the reading circuit 15, the analog-digital converter circuit 16, and the like, which are described in Embodiment 1. Specifically, a processor, a work memory, an ECC circuit, and the like are incorporated in the controller chip 5106. Note that the circuit configurations of the memory chip 5105 and the controller chip 5106 are not limited to those described above, and can be changed depending on circumstances or conditions. For example, the digital-analog converter circuit 11, the writing circuit 12, the row driver 13, the memory cell array 14, the reading circuit 15, and the analog-digital converter circuit 16 may be incorporated not in the memory chip 5105 but in the controller chip 5106. The USB connector 5103 functions as an interface for connection to an external device.

Figure 20B:
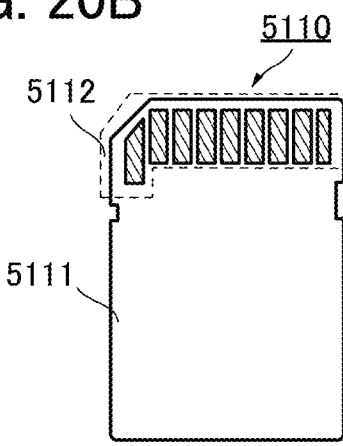
Figure 20C:
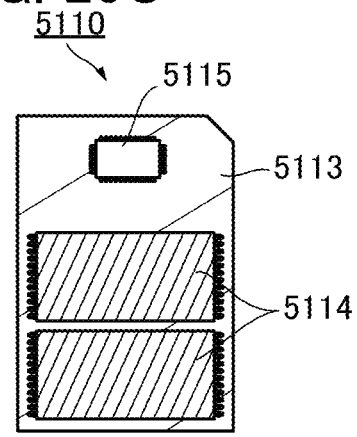

FIG. 20(B) is a schematic external diagram of an SD card, and FIG. 20(C) is a schematic diagram illustrating the internal structure of the SD card. An SD card 5110 includes a housing 5111, a connector 5112, and a substrate 5113. The connector 5112 functions as an interface for connection to an external device. The substrate 5113 is held in the housing 5111. The substrate 5113 is provided with a memory device and a circuit for driving the memory device. For example, a memory chip 5114 and a controller chip 5115 are attached to the substrate 5113. The memory chip 5114 includes the digital-analog converter circuit 11, the writing circuit 12, the row driver 13, the memory cell array 14, the reading circuit 15, the analog-digital converter circuit 16, and the like, which are described in Embodiment 1. A processor, a work memory, an ECC circuit, and the like are incorporated in the controller chip 5115. Note that the circuit configurations of the memory chip 5114 and the controller chip 5115 are not limited to those described above, and can be changed depending on circumstances or conditions, as appropriate. For example, the digital-analog converter circuit 11, the writing circuit 12, the row driver 13, the memory cell array 14, the reading circuit 15, and the analog-digital converter circuit 16 may be incorporated not in the memory chip 5114 but in the controller chip 5115.

When the memory chip 5114 is provided also on a back side of the substrate 5113, the capacitance of the SD card 5110 can be increased. In addition, a wireless chip with a wireless communication function may be provided on the substrate 5113. By this, wireless communication between an external device and the SD card 5110 can be conducted, which enables data reading and writing from/to the memory chip 5114.

Figure 20D:
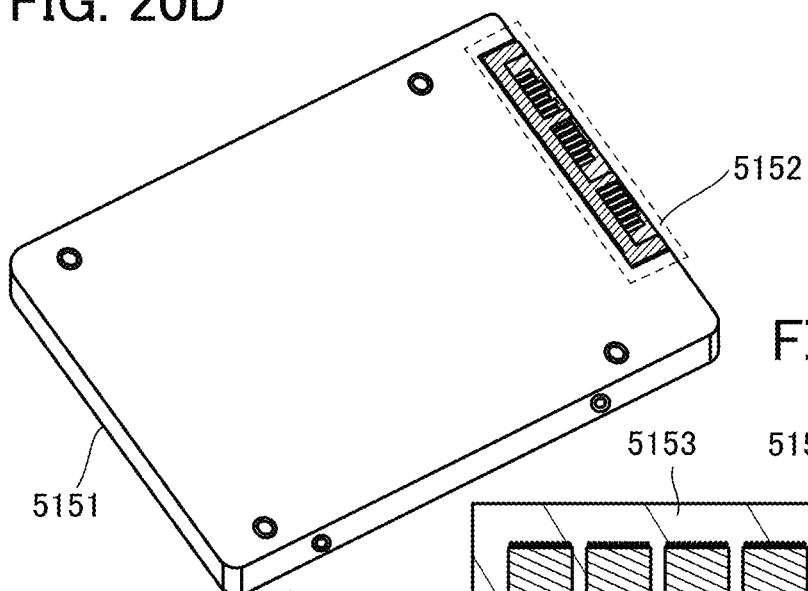
Figure 20E:
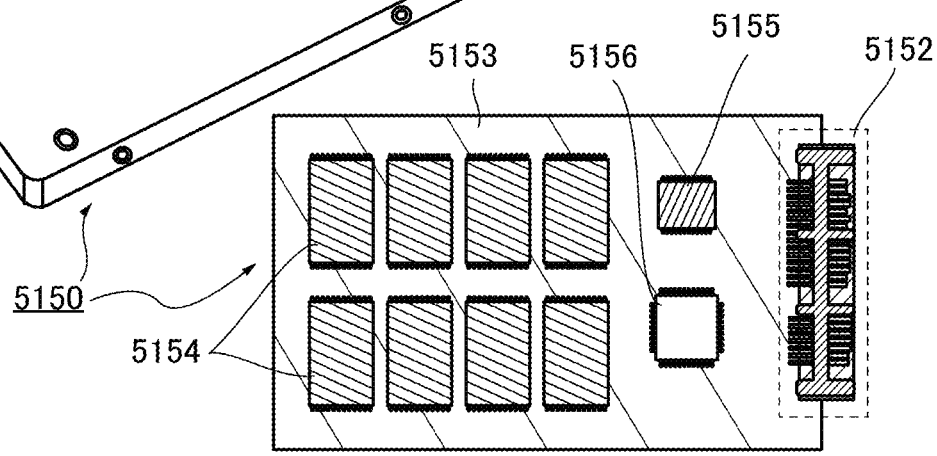

FIG. 20(D) is a schematic external view of an SSD, and FIG. 20(E) is a schematic diagram illustrating the internal structure of the SSD. An SSD 5150 includes a housing 5151, a connector 5152, and a substrate 5153. The connector 5152 functions as an interface for connection to an external device. The substrate 5153 is held in the housing 5151. The substrate 5153 is provided with a memory device and a circuit for driving the memory device. For example, a memory chip 5154, a memory chip 5155, and a controller chip 5156 are attached to the substrate 5153. The memory chip 5154 includes the digital-analog converter circuit 11, the writing circuit 12, the row driver 13, the memory cell array 14, the reading circuit 15, the analog-digital converter circuit 16, and the like, which are described in Embodiment 1. When the memory chip 5154 is also provided on a back side of the substrate 5153, the capacitance of the SSD 5150 can be increased. A work memory is incorporated in the memory chip 5155. For example, a DRAM chip may be used as the memory chip 5155. A processor, an ECC circuit, and the like are incorporated in the controller chip 5156. Note that the circuit configurations of the memory chip 5154, the memory chip 5155, and the controller chip 5115 are not limited to those described above, and can be changed depending on circumstances or conditions. For example, a memory functioning as a work memory may also be provided in the controller chip 5156.

Note that this embodiment can be combined with other embodiments in this specification as appropriate.

Embodiment 8

In this embodiment, examples of electronic devices to which a disclosed memory device can be applied will be described.

<Laptop Personal Computer>

Figure 21A:
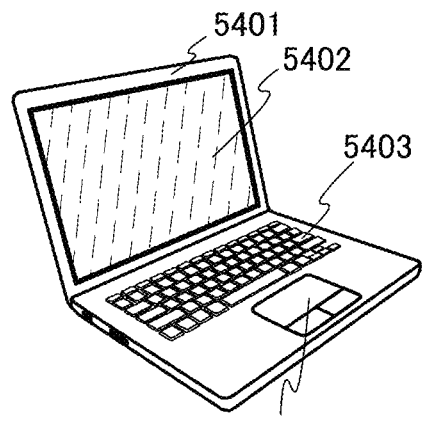
[FIG. 21] Perspective views illustrating structure examples of electronic devices.

FIG. 21(A) is a laptop personal computer, which includes a housing 5401, a display portion 5402, a keyboard 5403, a pointing device 5404, and the like. The memory device of one embodiment of the present invention can be provided in the laptop personal computer.

<Smartwatch>

Figure 21B:
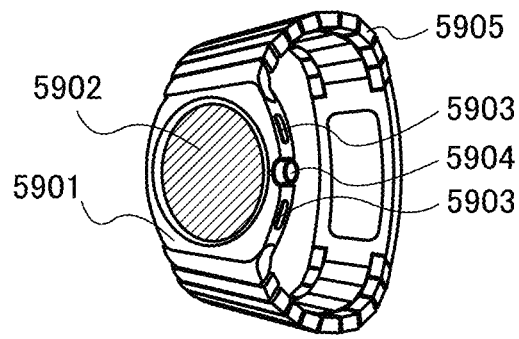

FIG. 21(B) is a smartwatch that is one type of wearable terminals, which includes a housing 5901, a display portion 5902, an operation button 5903, an operator 5904, a band 5905, and the like. The memory device of one embodiment of the present invention can be provided in the smartwatch. Furthermore, for the display portion 5902, a display device to which a function of the position input device is added may be used. Moreover, the function of the position input device can be added by provision of a touch panel in the display device. Alternatively, the function of position input device can be added by provision of a photoelectric conversion element called a photosensor in a pixel portion of the display device. Moreover, the operation button 5903 may be provided with any of a power switch for starting the smartwatch, a button for operating application of the smartwatch, a volume control button, a switch for putting light of the display portion 5902 on or off, and the like. Although the number of the operation buttons 5903 is two in the smartwatch illustrated in FIG. 21(B), the number of the operational buttons of the smartwatch is not limited thereto. The operator 5904 functions as a crown for adjusting the time. The operator 5904 may be used as an input interface for operating the application of the smartwatch besides the time adjustment. Although the smartwatch illustrated in FIG. 21(B) has the operator 5904, without being limited thereto, a structure without the operator 5904 may be used.

<Video camera>

Figure 21C:
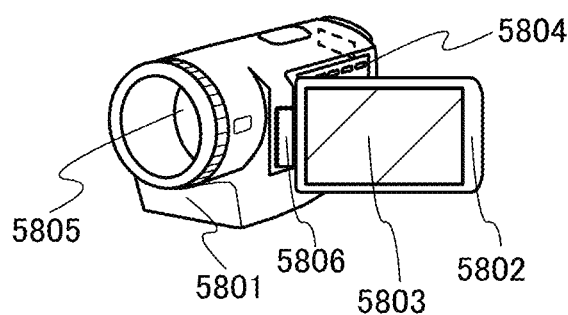

FIG. 21(C) is a video camera, which includes a first housing 5801, a second housing 5802, a display portion 5803, an operation key 5804, a lens 5805, a joint 5806, and the like. The memory device of one embodiment of the present invention can be provided in the video camera. The operation key 5804 and the lens 5805 are provided in the first housing 5801, and the display portion 5803 is provided in the second housing 5802. Furthermore, the first housing 5801 and the second housing 5802 are connected to each other with the joint 5806, and the angle between the first housing 5801 and the second housing 5802 can be changed with the joint 5806. Images on the display portion 5803 may be switched in accordance with the angle at the joint 5806 between the first housing 5801 and the second housing 5802.

<Mobile Phone>

Figure 21D:
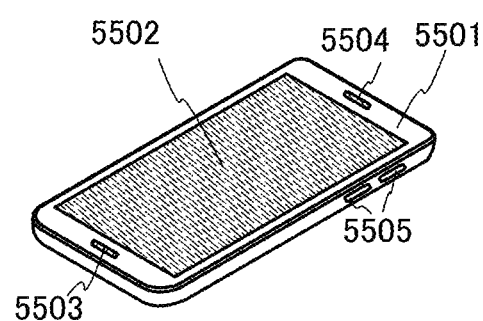

FIG. 21(D) is a mobile phone having a function of an information terminal, which includes a housing 5501, a display portion 5502, a microphone 5503, a speaker 5504, and an operation button 5505. The memory device of one embodiment of the present invention can be provided in the mobile phone. Furthermore, for the display portion 5502, a display device to which a function of position input device is added may be used. Moreover, the function of position input device can be added by provision of a touch panel in the display device. Alternatively, the function of position input device can be added by provision of a photoelectric conversion element called a photosensor in a pixel portion of the display device. Furthermore, the operation button 5505 may be provided with a button for starting the mobile phone, a button for operating application of the mobile phone, a volume control button, or a switch for putting light of the display portion 5502 on or off.

Although the mobile phone in FIG. 21(D) includes two operation buttons 5505, the number of the operational buttons included in the mobile phone is not limited thereto. Although not illustrated, the mobile phone illustrated in FIG. 21(D) may include a light-emitting device for use as a flash light or a lighting device.

<Television Device>

Figure 21E:
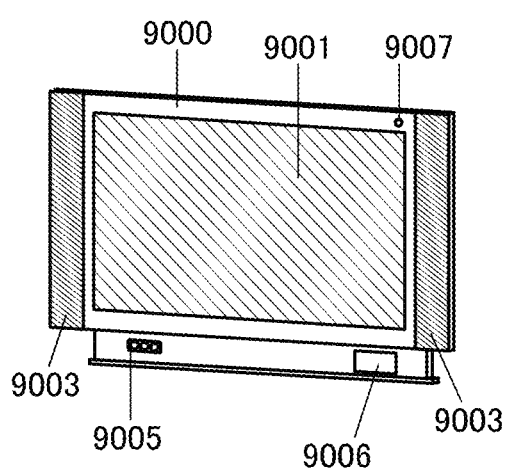

FIG. 21(E) is a perspective view showing a television device. The television device includes a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared rays), and the like. The memory device of one embodiment of the present invention can be provided in the television device. The television device can include the display portion 9001 having a large screen size of, for example, 50 inches or more, or 100 inches or more.

<Moving Body>

The memory device described above can also be used around a driver seat in an automobile, which is a moving body.

Figure 21F:
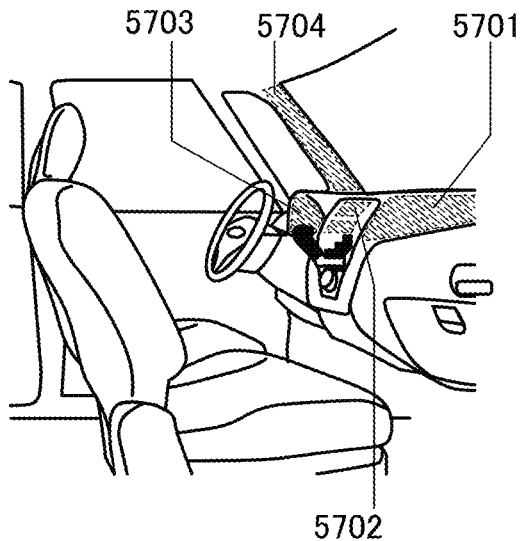

FIG. 21(F) illustrates a windshield and its vicinity inside an automobile, for example. FIG. 21(F) illustrates a display panel 5701, a display panel 5702, and a display panel 5703 attached to a dashboard, and a display panel 5704 attached to a pillar.

The display panel 5701 to the display panel 5703 can display a variety of kinds of information such as navigation information, a speedometer, a tachometer, a mileage, a fuel meter, a gearshift indicator, and air-condition setting. The content, layout, or the like to be displayed on the display panels can be changed freely to suit the user's preferences, so that the design can be improved. The display panel 5701 to the display panel 5703 can also be used as lighting devices.

The display panel 5704 can compensate for the view obstructed by the pillar (blind areas) by showing an image taken by an imaging unit provided for the car body. That is, showing an image taken by an imaging unit provided on the outside of the car body leads to elimination of blind areas and enhancement of safety. In addition, showing an image so as to compensate for the area which a driver cannot see makes it possible for the driver to confirm safety easily and comfortably. The display panel 5704 can also be used as a lighting device.

The memory device of one embodiment of the present invention can be provided in a moving body. The memory device of one embodiment of the present invention can be used, for example, in a frame memory that temporarily stores displaying image data used in displaying an image on the display panel 5701 to the display panel 5704, a memory device that stores a program for driving a system of a moving body, and the like.

Although not illustrated, the electronic devices illustrated in FIGS. 21(A) to (C), (E), (F) can each include a microphone and a speaker. The above structure enables the above electronic devices to have an audio input function, for example.

Although not illustrated, the electronic devices illustrated in FIGS. 21(A), (B), (D) to (F) may have a structure with a camera.

The electronic devices illustrated in FIGS. 21(A) to (F) may have, although not illustrated, a structure provided with a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays) in the housing. In particular, when a detection device including a sensor for detecting inclination, such as a gyroscope sensor or an acceleration sensor, is provided for the mobile phone illustrated in FIG. 21(D), the direction (which direction the mobile phone faces in, with respect to the vertical direction) of the mobile phone is determined, so that display on the direction of the display portion 5502 can be automatically changed in accordance with the direction of the mobile phone.

Although not illustrated, the electronic devices illustrated in FIGS. 21(A) to (F) may include a device for obtaining biological information such as fingerprints, veins, iris, or voice prints. With this structure, an electronic device having a biometric authentication function can be achieved.

Furthermore, as a display portion of the electronic devices illustrated in FIGS. 21(A) to (F), a flexible base may be used. Specifically, the display portion may have a structure in which a transistor, a capacitor, a display element, and the like are provided over a flexible base. With this structure, not only the electronic devices illustrated in FIGS. 21(A) to (F) with a flat plane housing but also an electronic device including a curved surface can be achieved.

Note that this embodiment can be combined with other embodiments in this specification as appropriate.

Example

In this example, a memory cell array and peripheral circuits which can be used for a semiconductor device of one embodiment of the present invention will be described. Note that in this example, the memory cell array and the peripheral circuit are referred to as a memory device for convenience. Furthermore, results obtained by fabricating the memory device and measuring its data retention characteristics in practice, will be described.

<Circuit Configuration of Memory Device>

Figure 22:
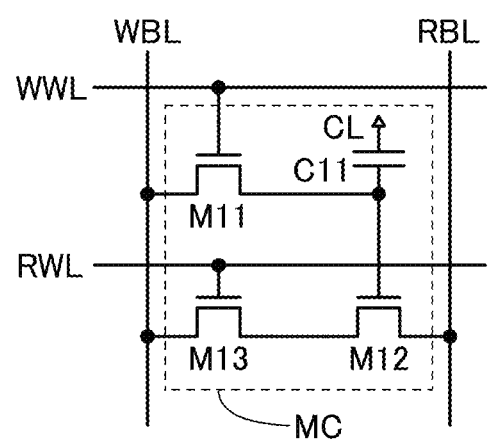
[FIG. 22] A circuit diagram showing a memory cell in Example.

FIG. 22 illustrates a memory cell MC that can be used in the memory cell array. The memory cell MC illustrated in FIG. 22 has a configuration in which the memory cell 1470 illustrated in FIG. 10(D) is modified. A transistor M11 corresponds to the transistor M2; a transistor M12 corresponds to the transistor M3; a capacitor C11 corresponds to the capacitor C2; and the wiring WBL corresponds to the wiring BL. The memory cell MC is different from the memory cell 1470 in that a transistor M13 is provided as a switching element between the transistor M12 and the wiring WBL. Note that the transistor M11 may have a structure with a back gate, like the transistor M2 in the memory cell 1470. In addition, the memory cell MC illustrated in FIG. 22 has a configuration in which the memory cell 1480 illustrated in FIG. 11(A) is modified. The transistor M11 corresponds to the transistor M4; the transistor M12 corresponds to the transistor M5; the transistor M13 corresponds to the transistor M6; and the capacitor C11 corresponds to the capacitor C3. The memory cell MC is different from the memory cell 1480 in that a second terminal of the transistor M12 is not electrically connected to either a second terminal of the capacitor C11 or the wiring GND. Note that the transistor M11 may have a structure with a back gate, like the transistor M2 in the memory cell 1480.

The memory cell MC includes the transistor M11 to the transistor M13 and the capacitor C11. A first terminal of the transistor M11 is electrically connected to a gate of the transistor M12 and a first terminal of the capacitor C11, a second terminal of the transistor M11 is electrically connected to the wiring WBL, and a gate of the transistor M11 is electrically connected to the wiring WWL. A second terminal of the capacitor C11 is electrically connected to the wiring CL. A first terminal of the transistor M12 is electrically connected to the wiring RBL, and a second terminal of the transistor M12 is electrically connected to a first terminal of the transistor M13. A second terminal of the transistor M13 is electrically connected to the wiring WBL, and a gate of the transistor M13 is electrically connected to the wiring RWL.

The wiring WWL and the wiring RWL function as a write word line and a read word line, respectively, as in the case of the description of the memory cell 1480. The wiring WBL functions as a write bit line, and the wiring RBL functions as a read bit line. The wiring CL functions as a wiring for applying a predetermined potential to the second terminal of the capacitor C11, as in the case of the description of the memory cell 1410, the memory cell 1420, and the memory cell 1430. Note that in data writing and data reading, a low-level potential (referred to as reference potential in some cases) is preferably applied to the wiring CL.

Data writing is performed in such a manner that the transistor M11 is turned on by application of a high-level potential to the wiring WWL, the transistor M13 is turned on by application of a high-level potential to the wiring RWL, and the potential of the wiring WBL at the time of making the current corresponding to the written data flow from the wiring WBL to the wiring RBL is written to the first terminal of the capacitor C11. After that, by applying a low-level potential to the wiring WWL to turn off the transistor M11, the potential of the first terminal of the capacitor C11 and the potential of the gate of the transistor M12 are held.

Data reading is performed in such a manner that a predetermined potential is applied to the wiring WBL, a high-level potential is applied to the wiring RWL so that the transistor M13 is turned on, and the current corresponding to the potential written to the first terminal of the capacitor C11 is made to flow from the wiring WBL to the wiring RBL. The potential of the wiring RBL changes according to the current. At this time, by reading out the potential of the wiring RBL, the potential held at the first terminal of the capacitor C11 (or the gate of the transistor M12) can be read out. In other words, data written into this memory cell can be read out from the potential held at the first terminal (or the gate of the transistor M12) of the capacitor C11.

In particular, as the transistor M11, a transistor using an In—Ga—Zn oxide that is a CAAC-OS (hereinafter, referred to as CAAC-IGZO) for an active layer is used. It is known that a transistor in which a CAAC-IGZO is used for an active layer has extremely low off-state current characteristics. For example, the off-state current of the transistor can be less than or equal to 100 zA (z: zept, $10^{-21}$), less than or equal to 1 zA, or less than or equal to 10 yA (y: yocto, $10^{-24}$) per channel width of 1 µm. Therefore, by using the transistor as the transistor M11, a loss of data retained at the first terminal of the capacitor C11, due to current leakage, can be prevented. In other words, data written in the memory cell MC can be retained for a long time.

Furthermore, a transistor using silicon for an active layer is used for the transistor M12, the transistor M13, and a transistor M21 to a transistor M23 described later. A transistor including silicon in its active layer is suitable for a transistor included in a signal converter circuit, an amplifier circuit, or the like because of its high on-state current characteristics. As the silicon, amorphous silicon, microcrystalline silicon, polycrystalline silicon, or the like can be used.

The memory device of this example has the structure where the transistor is formed over a semiconductor substrate of single crystal silicon and the transistor M11 is formed thereover with an insulating film or the like sandwiched therebetween.

Figure 23:
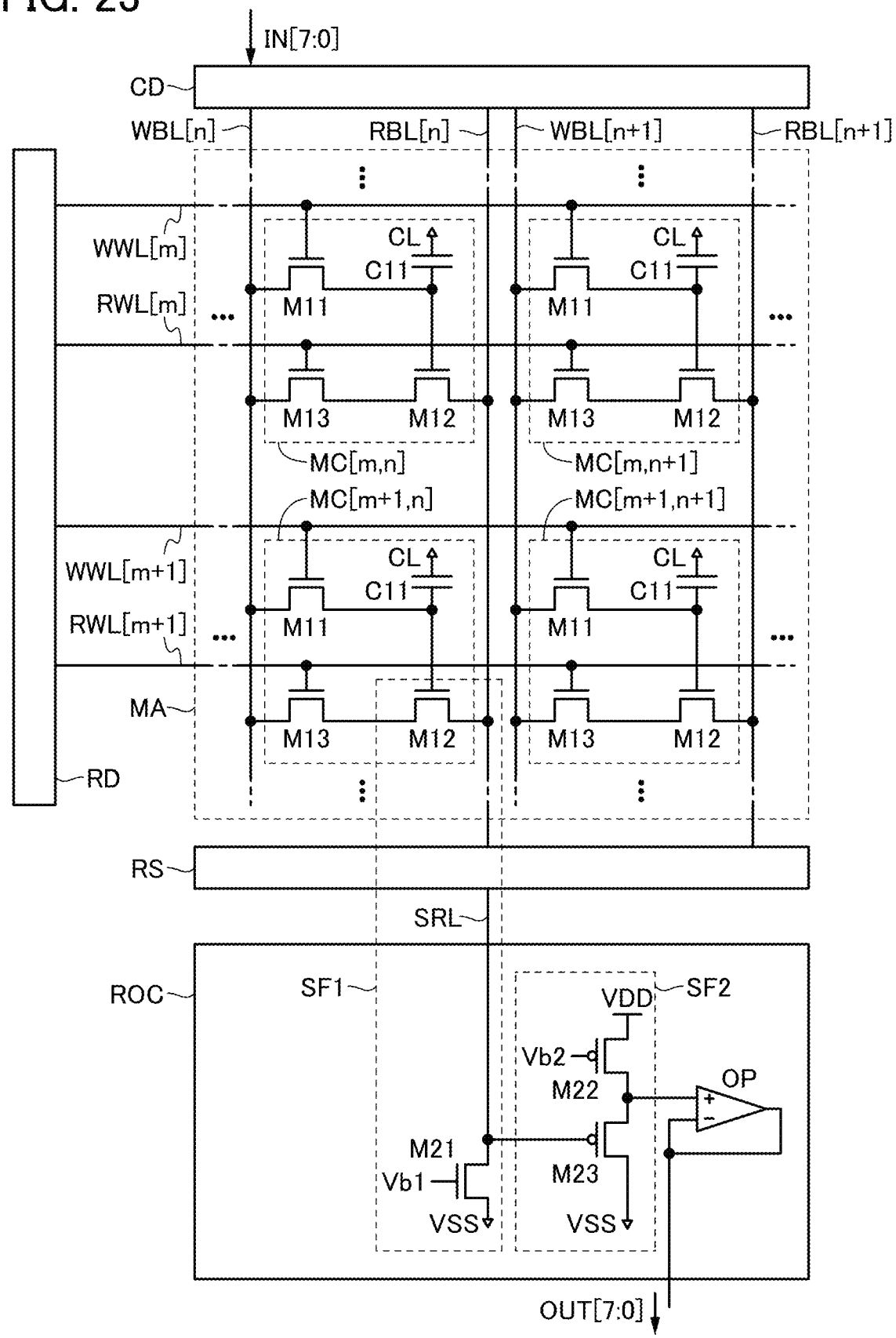
[FIG. 23] A circuit diagram showing a memory device in Example.

FIG. 23 illustrates a configuration of a memory cell array MA using the memory cell MC and peripheral circuits thereof.

The memory cell array MA includes memory cells MC arranged in a matrix. Note that FIG. 23 illustrates the memory cells MC arranged at addresses of m-th row and n-th column, m-th row and n+1-th column, m+1-th row and n-th column, and m+1-th row and n+1-th column (here, each of m and n is an integer greater than or equal to 1). Furthermore, a memory cell arranged at an address of m-th row and n-th column is denoted by a reference numeral MC[m, n], and in a similar manner, memory cells arranged at addresses of m-th row and n+1-th column, m+1-th row and n-th column, and m+1-th row and n+1-th column are denoted by, respectively, reference numerals MC[m, n+1], MC[m+1, n], and MC[m+1, n+1]. In this example, address notation is omitted, and one or more of a plurality of memory cells included in the memory cell array MA may be collectively denoted by a memory cell MC in some cases.

A wiring WWL[m] and a wiring WWL[m+1] are wirings electrically connected to the memory cells MC located in the m-th row and the m+1-th row, respectively, and have a function of the wiring WWL in FIG. 22. A wiring RWL[m] and a wiring RWL[m+1] are wirings electrically connected to the memory cells MC located in the m-th row and the m+1-th row, respectively, and have a function of the wiring RWL in FIG. 22. A wiring WBL[n] and a wiring WBL[n+1] are wirings electrically connected to the memory cells MC located in the n-th row and the n+1-th row, respectively, and have a function of the wiring WBL in FIG. 22. A wiring RBL[n] and a wiring RBL[n+1] are wirings electrically connected to the memory cells MC in the n-th row and the n+1-th row, respectively, and have a function of the wiring RBL in FIG. 22. In this example, the denotation of addresses for one or a plurality of wirings included in the memory cell array MA is omitted in some cases. For example, the wiring WBL[n] and the wiring WBL[n+1] are collectively referred to as the wiring WBL in some cases. In addition, the WWL[m] and the wiring WWL[m+1] are collectively referred to as the wiring WWL in some cases.

FIG. 23 illustrates a circuit CD, a circuit RD, a circuit RS, and a reading circuit ROC as peripheral circuits of the memory cell array MA.

The circuit CD includes a column driver circuit and a write selection circuit. The circuit CD is electrically connected to the wiring WBL and the wiring RBL. The circuit CD has a function of receiving 8-bit writing data as a signal IN[7:0] from the outside, a function of selecting the wiring WBL in a column including a memory cell MC to which data is written, to apply a writing voltage corresponding to the data, and a function of selecting the wiring WBL in a column including a memory cell MC from which data is read out, to apply a predetermined potential.

The circuit RD is electrically connected to the wiring WWL and the wiring RWL. The circuit RD has a function of selecting the wiring WWL in a row including a memory cell MC to which data is written, to apply a predetermined potential to the wiring WWL and a function of selecting the wiring RWL in a row including a memory cell MC from which the data is read out, to apply a predetermined potential to the wiring RWL.

The circuit RS is electrically connected to the wiring RBL and a wiring SRL. The circuit RS has a function of selecting the wiring RBL in a column including a memory cell MC from which data is read out to be electrically connected to the wiring SRL.

The reading circuit ROC includes the transistor M21 to the transistor M23 and an operational amplifier OP.

A first terminal of the transistor M21 is electrically connected to the wiring SRL and a gate of the transistor M23, a second terminal of the transistor M21 is electrically connected to a wiring VSS, and a gate of the transistor M21 is electrically connected to a wiring Vb1.

The wiring VSS is a wiring for supplying a low-level potential, and the wiring Vb1 is a wiring for supplying a voltage higher than the threshold voltage of the transistor M21.

Here, the transistor M12 and the transistor M21 are focused on. As shown in FIG. 23, a source follower circuit SF1 is constructed with a connection configuration of the transistor M12 and the transistor M21. Here, when data is read out from the memory cell MC[m+1, n], a high-level potential (for example, a potential supplied from the wiring VDD, described later) is applied to the wiring WBL[n] and a predetermined potential is applied to the wiring RWL[m+1] to turn on the transistor M13, so that a potential almost equal to a potential input to the gate of the transistor M12 (potential held by the capacitor C11) can be supplied to a gate of the transistor M23 by the source follower circuit SF1.

A first terminal of a transistor M22 is electrically connected to a first terminal of the transistor M23 and a non-inverting input terminal of the operational amplifier OP, a second terminal of the transistor M22 is electrically connected to the wiring VDD, and a gate of the transistor M22 is electrically connected to a wiring Vb2. A second terminal of the transistor M23 is electrically connected to the wiring VSS.

The wiring VDD is a wiring for supplying a high-level potential higher than a low-level potential supplied from the wiring VSS. The wiring Vb2 is a wiring for supplying a voltage lower than the threshold voltage of the transistor M22.

The above connection of the transistor M22 and the transistor M23 constructs a source follower circuit SF2. Thus, a potential almost equal to the potential input to the gate of the transistor M23 is input to the non-inverting input terminal of the operational amplifier OP.

An inverting input terminal of the operational amplifier OP is electrically connected to an output terminal of the operational amplifier OP. That is, the operational amplifier OP has a connection configuration with a voltage follower. Although the detailed specifications of the memory device of this example will be described later, a signal OUT [7:0] output from the operational amplifier OP corresponds to eight pieces of data read out from eight memory cells MC.

Note that by adjusting each of the potentials supplied from the wiring Vb1 and the wiring Vb2, an error between the reading voltage and the writing voltage can be reduced.

<Fabrication of Memory Device>

Figure 24:
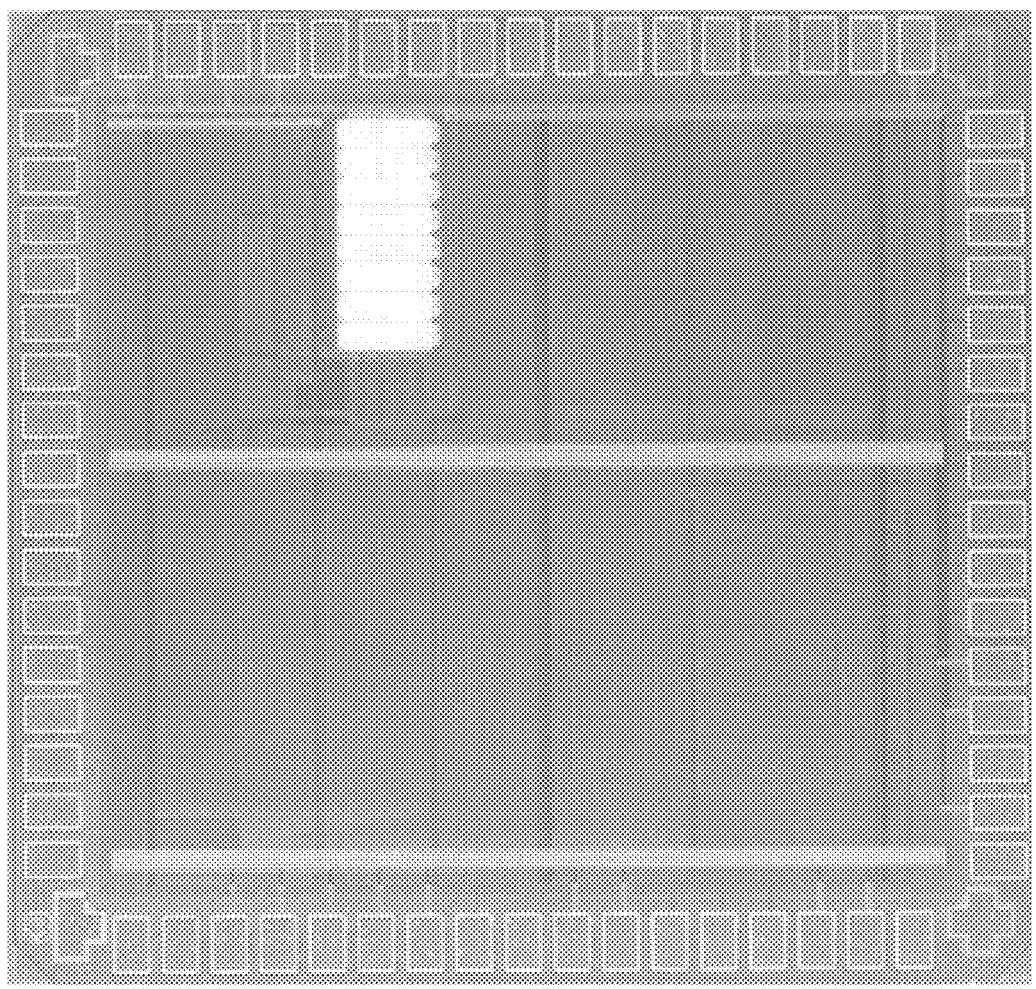
[FIG. 24] A top view photograph of a memory die including a memory device.

The above-described circuit configuration of the memory device was actually built on a semiconductor substrate to prototype a memory die. FIG. 24 is a taken image of a top view of the memory die.

In addition, the specifications of the memory die are shown in a table below. Note that in an item of Technology Size shown in the table below, CMOS shows the transistor M12, the transistor M13, and the transistor M21 to the transistor M23, and OSFET indicates the transistor M11. Furthermore, an item of Density indicates that the memory cell array MA includes circuits arranged in a matrix of two rows and eight columns and that the one circuit includes eight memory cells that can be accessed in parallel at once.

TABLE 1

| | |
|---|---|
| Die Size | 3.02 mm × 2.87 mm |
| Resolution | 6 bit |
| Technology Size | CMOS: 0.15 μm |
| | OSFET: 0.50 μm |
| Storage Capacitance | 10 fF |
| Cell Size | 6.4 μm × 13 μm |
| Density | 128 cell |
| | (2 rows × 8 columns × 8 cells) |
| Number of I/O | 8 |
| Supply Voltage | 1.8 V/13.5 V |

<Various Kinds of Measurement and Results>

One memory cell MC was selected in the memory die including the memory device shown in FIG. 23, and 16 types of voltages were written to the memory cell MC, whereby read voltages with respect to the respective writing voltages were measured. Then, the same measurement was conducted on other 15 memory cells MC, and a mean and a standard deviation σ of the voltages read out from the 16 memory cells MC, with respect to various types of voltages, were obtained.

Figure 25:
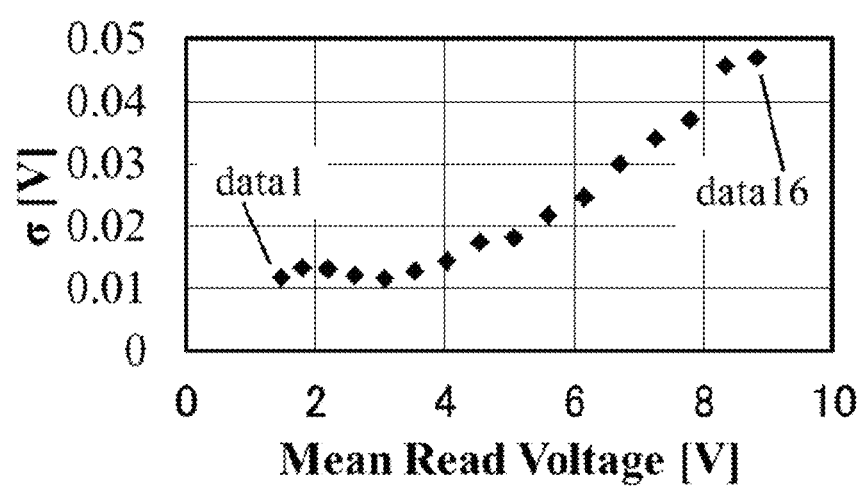
[FIG. 25] A graph showing a relation of a read voltage and a standard deviation with respect to voltages written to a memory device.

FIG. 25 shows results thereof. FIG. 25 is a graph in which, with respect to the 16 types of writing voltages (data 1 to the data 16 in the diagram), the mean of the reading voltage (Mean Read Voltage) is represented by the horizontal axis, and the standard deviation is represented by the vertical axis.

Next, the number of levels were calculated from the results. The number of levels is obtained in the following manner: a difference between a mean of reading voltages with respect to a first writing voltage and a mean of reading voltages with respect to a second writing voltage is divided by a value six times the standard deviation σ of the reading voltage with respect to the first writing voltage (corresponding to a range from $-3\sigma$ to $3\sigma$); this calculation is conducted on all intervals of means of all of the reading voltages; and the obtained values are added. The number of levels was calculated to be 68.2 according to the results in FIG. 25, which is a larger value than $64=2^6$. In other words, the memory device fabricated this time shows a possibility that 6-bit data can be written to one memory cell MC with an accuracy from $-3\sigma$ to $3\sigma$.

Figure 26A:
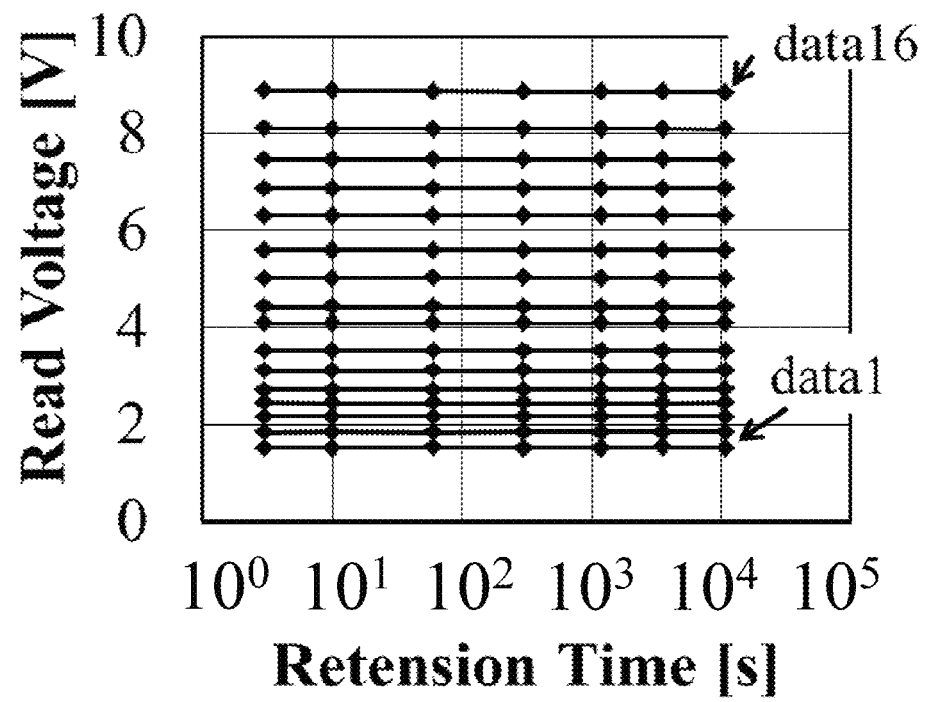
[FIG. 26] (A) A graph showing a change in read voltages over retention time in a memory device to which a voltage is written, and (B) A graph showing a relation between an initial read voltage and a variation in read voltages after a certain period of time, in a memory device to which a voltage is written.

Next, the data retention characteristics of the fabricated memory device were measured. Specifically, the 16 types of writing voltages used in the above measurement were written to memory cells MC included in the memory cell array MA of the memory device, and a change in each reading voltage over time at a room temperature was measured (FIG. 26(A)). A graph shown in FIG. 26(A) shows the amount of change in reading voltage (Read Voltage) with respect to retention time (Retension Time), and from this graph, it is found that the 16 types of voltages written to the memory cells MC is kept without change over approximately 3 hours.

Figure 26B:
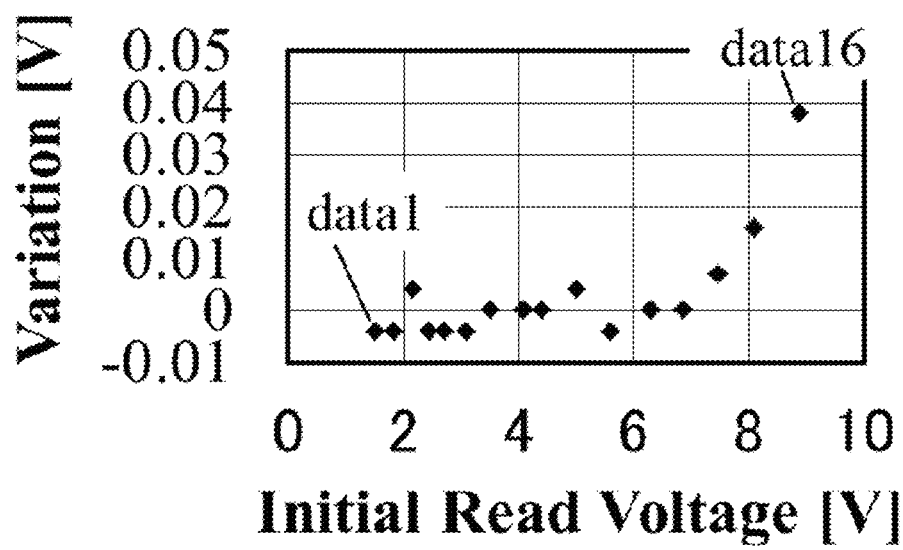

The graph in FIG. 26(B) shows the amount of change in voltages 3 hours later, with respect to the initial reading voltage (Initial Read Voltage). From the graph in FIG. 26(B), it is confirmed that the amount of change in reading voltages (Variation) ranged from −0.01 V to 0.05 V and the data is retained accurately even 3 hours later.

In the circuit configuration illustrated in FIG. 23, when a transistor including CAAC-IGZO in an active layer is used as a writing transistor, 6-bit data can be processed per cell, and a memory device capable of retaining the data for a long time can be formed.

Note that this example can be combined with other embodiments in this specification as appropriate.

(Notes on the Description in this Specification and the Like)

The following are notes on the description of structures in the embodiments and example in this specification.

<Notes on One Embodiment of the Present Invention described in Embodiments and Example>

One embodiment of the present invention can be constituted by appropriately combining the structure described in each embodiment and example with any of the structures described in the other embodiments. In addition, in the case where a plurality of structure examples are described in one embodiment, some of the structure examples can be combined as appropriate.

Note that what is described (or part thereof) in one embodiment or example can be applied to, combined with, or replaced with at least one of another content (or part thereof) in the embodiment or example and what is described (or part thereof) in another embodiment or other embodiments.

Note that in each embodiment or example, a content described in the embodiment or example is a content described with reference to a variety of diagrams or a content described with text in the specification.

Note that by combining a diagram (or part thereof) described in one embodiment or example with at least one of another part of the diagram, a different diagram (or part thereof) described in the embodiment or example, and a diagram (or part thereof) described in another embodiment, other embodiments, or a different example, much more diagrams can be formed.

<Notes on Ordinal Numbers>

In this specification and the like, ordinal numbers such as "first," "second," and "third" are used in order to avoid confusion among components. Thus, the terms do not limit the number of components. Furthermore, the terms do not limit the order of components. In this specification and the like, for example, a "first" component in one embodiment (or example) can be referred to as a "second" component in other embodiments (or example) or claims. Furthermore, in this specification and the like, for example, a "first" component in one embodiment (or example) can be omitted in other embodiments or claims.

<Notes on the Description for Drawings>

Embodiments (or example) are described with reference to drawings. However, the embodiments (or example) can be implemented with various different modes. It is readily understood by those skilled in the art that modes and details can be changed in various ways without departing from the spirit and scope of the present invention. Thus, the present invention should not be interpreted as being limited to the description of the embodiments (or example). Note that in the structures of the invention in the embodiments (the structure in the example), the same portions or portions having similar functions are denoted by the same reference numerals in different drawings, and the description of such portions is not repeated.

In this specification and the like, the terms for explaining arrangement, such as "over" and "under," are used for convenience to describe the positional relation between components with reference to drawings. Furthermore, the positional relation between components is changed as appropriate in accordance with a direction in which the components are described. Therefore, the terms for explaining arrangement are not limited to those used in this specification and may be changed to other terms as appropriate depending on the situation.

The term "over" or "under" does not necessarily mean that a component is placed directly over or directly under and directly in contact with another component. For example, the expression "electrode B over insulating layer A" does not necessarily mean that the electrode B is on and in direct contact with the insulating layer A and does not exclude the case where another component is provided between the insulating layer A and the electrode B.

In drawings, the size, the layer thickness, or the region is determined arbitrarily for description convenience. Therefore, the size, the layer thickness, or the region is not limited to the illustrated scale. Note that the drawings are schematically shown for clarity, and embodiments of the present invention are not limited to shapes or values shown in the drawings. For example, the following can be included: variation in signal, voltage, or current due to noise or variation in signal, voltage, or current due to a difference in timing.

In drawings such as perspective views, some components might not be illustrated for clarity of the drawings.

In the drawings, the same components, components having similar functions, components formed of the same material, or components formed at the same time are denoted by the same reference numerals in some cases, and the description thereof is not repeated in some cases.

<Notes on Expressions that can be Rephrased>

In this specification and the like, one of a source and a drain is denoted by "one of a source and a drain" (or a first electrode or a first terminal) and the other of the source and the drain is denoted by "the other of the source and the drain" (or a second electrode or a second terminal) in the description of the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation. In this specification and the like, two terminals except a gate are sometimes referred to as a first terminal and a second terminal or as a third terminal and a fourth terminal. In this specification and the like, in the case where a transistor has two or more gates (this structure is referred to as a dual-gate structure in some cases), these gates are referred to as a first gate and a second gate or a front gate and a back gate in some cases. In particular, the term "front gate" can be rephrased as the simple term "gate". In addition, the term "back gate" can be rephrased as the simple term "gate". Note that the bottom gate is a terminal that is formed before a channel formation region in manufacture of a transistor, and the "top gate" is a terminal that is formed after a channel formation region in manufacture of a transistor.

A transistor includes three terminals called a gate, a source, and a drain. The gate is a terminal that functions as a control terminal for controlling a conduction state of the transistor. One of two input/output terminals that function as the source or the drain serves as a source and the other serves as a drain, in accordance with the conductivity of the transistor and the level of a potential applied to each terminal. Thus, the terms of source and drain are interchangeable for use in this specification and the like.

In addition, in this specification and the like, the term such as an "electrode" or a "wiring" does not limit a function of the component. For example, an "electrode" is used as part of a "wiring" in some cases, and vice versa. Furthermore, the term "electrode" or "wiring" includes a case of a plurality of "electrodes" and "wirings" formed in an integrated manner.

In this specification and the like, voltage and potential can be interchanged with each other as appropriate. The voltage refers to a potential difference from a reference potential. When the reference potential is a ground potential, for example, the voltage can be rephrased into the potential. The ground potential does not necessarily mean 0 V. Potentials are relative values, and the potential applied to a wiring or the like is changed depending on the reference potential, in some cases.

In this specification and the like, the terms "film" and "layer" can be interchanged with each other depending on the case or circumstances. For example, the term "conductive layer" can be changed into the term "conductive film" in some cases. Alternatively, for example, the term "insulating film" can be changed into the term "insulating layer" in some cases. Alternatively, the term such as "film" or "layer" is not used and can be replaced with another term depending on circumstances or conditions. For example, the term "conductive layer" or "conductive film" can be changed into the term "conductor" in some cases. Furthermore, for example, the term "insulating layer" or "insulating film" can be changed into the term "insulator" in some cases.

In this specification and the like, the terms "wiring", "signal line", "power supply line", and the like can be interchanged with each other depending on circumstances or conditions. For example, the term "wiring" can be changed into the term such as "signal line". In addition, the term "wiring" can be changed into the term such as "power supply line" in some cases. Inversely, the term such as "signal line" or "power supply line" can be changed into the term "wiring" in some cases. The term such as "power supply line" can be changed into the term such as "signal line" in some cases. Inversely, the term such as "signal line" can be changed into the term such as "power supply line" in some cases. The term "potential" that is applied to a wiring can be changed into the term "signal" or the like depending on circumstances or conditions. Inversely, the term "signal" or the like can be changed into the term "potential" in some cases.

<Notes on Definitions of Terms>

Definitions of the terms that are mentioned in the above embodiments and example are described below.

<<Impurity in Semiconductor>>

An impurity in a semiconductor refers to, for example, elements other than the main components of a semiconductor layer. For example, an element with a concentration lower than 0.1 atomic % is an impurity. When an impurity is contained, DOS (Density of States) may be formed in a semiconductor, the carrier mobility may be decreased, or the crystallinity may be decreased. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components of the semiconductor; specifically, there are hydrogen (included in water), lithium, sodium, silicon, boron, phosphorus, carbon, and nitrogen, for example. When the semiconductor is an oxide semiconductor, oxygen vacancies may be formed by entry of impurities such as hydrogen, for example. Furthermore, when the semiconductor is a silicon layer, examples of an impurity that changes the characteristics of the semiconductor include oxygen, Group 1 elements except hydrogen, Group 2 elements, Group 13 elements, and Group 15 elements.

<<Transistor>>

In this specifications, a transistor is an element having at least three terminals including a gate, a drain, and a source. Furthermore, a channel formation region is provided between the drain (a drain terminal, a drain region, or a drain electrode) and the source (a source terminal, a source region, or a source electrode). By applying a voltage which exceeds a threshold voltage between the gate and the source, a channel is formed in the channel formation region, and current can be supplied between the source and the drain.

Furthermore, functions of a source and a drain might be switched when a transistor of opposite polarity is employed or a direction of current flow is changed in circuit operation, for example. Thus, the terms of source and drain are interchangeable for use in this specification and the like.

<<Switch>>

In this specification and the like, a switch is conducting (on state) or not conducting (off state) to determine whether current flows or not. Alternatively, a switch has a function of selecting and changing a current path.

Examples of a switch include an electrical switch and a mechanical switch. That is, any element can be used as a switch as long as it can control current, without limitation to a certain element.

Examples of a typical electrical switch include a transistor (e.g., a bipolar transistor or a MOS transistor), a diode (e.g., a PN diode, a PIN diode, a Schottky diode, a MIM (Metal Insulator Metal) diode, a MIS (Metal Insulator Semiconductor) diode, or a diode-connected transistor), and a logic circuit in which such elements are combined.

In the case of using a transistor as a switch, an "on state" of the transistor refers to a state in which a source electrode and a drain electrode of the transistor are electrically short-circuited. Furthermore, an "off state" of the transistor refers to a state in which the source electrode and the drain electrode of the transistor are electrically cut off. In the case where a transistor operates just as a switch, the polarity (conductivity type) of the transistor is not particularly limited to a certain type.

An example of a mechanical switch is a switch formed using a MEMS (micro electro mechanical systems) technology, such as a digital micromirror device (DMD). Such a switch includes an electrode that can be moved mechanically, and operates by controlling conduction and non-conduction in accordance with movement of the electrode.

<<Connection>>

In this specification and the like, when it is described that X and Y are connected, the case where X and Y are electrically connected, the case where X and Y are functionally connected, and the case where X and Y are directly connected are included therein. Accordingly, without being limited to a predetermined connection relation, for example, a connection relation other than that shown in a drawing or text is also possible.

Here, X, Y, and the like each denote an object (e.g., a device, an element, a circuit, a wiring, an electrode, a terminal, a conductive film, or a layer).

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, a switch is conducting (on state) or not conducting (off state) to determine whether current flows or not.

For example, in the case where X and Y are functionally connected, one or more circuits that enable functional connection between X and Y (e.g., a logic circuit (an inverter, a NAND circuit, a NOR circuit, or the like); a signal converter circuit (a DA converter circuit, an AD converter circuit, a gamma correction circuit, or the like); a potential level converter circuit (a power source circuit (e.g., a step-up converter or a step-down converter), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; and/or a control circuit) can be connected between X and Y. For example, even when another circuit is interposed between X and Y, X and Y are functionally connected when a signal output from X is transmitted to Y.

Note that when it is explicitly described that X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, the explicit expression "X and Y are electrically connected" is the same as the explicit simple expression "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

For example, the expression "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order" can be used. Alternatively, the expression "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order" can be used. Alternatively, the expression "X is electrically connected to Y through a source (or a first terminal or the like) and a drain (or a second terminal or the like) of the transistor, and X, the source (or the first terminal or the like) of the transistor, the drain (or the second terminal or the like) of the transistor, and Y are provided in this connection order" can be used. When the connection order in a circuit configuration is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, X, Y, Z1, and Z2 each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

<<Parallel and Perpendicular>>

In this specification, the term "parallel" indicates that the angle formed between two straight lines is greater than or equal to −10° and less than or equal to 10°. Thus, the case where the angle is greater than or equal to −5° and less than or equal to 5° is also included. The term "substantially parallel" indicates that the angle formed between two straight lines is greater than or equal to −30° and less than or equal to 30°. Moreover, "perpendicular" indicates a state where the angle formed between two straight lines is greater than or equal to 80° and less than or equal to 100°. Thus, the case where the angle is greater than or equal to 85° and less than or equal to 95° is also included. The term "substantially perpendicular" indicates that the angle formed between two straight lines is greater than or equal to 60° and less than or equal to 120°.

REFERENCE NUMERALS

MC[1]: memory cell, MC[2]: memory cell, MC[3]: memory cell, MC[4]: memory cell, MC[5]: memory cell, MC[6]: memory cell, MC[7]: memory cell, MC[8]: memory cell, MC[9]: memory cell, MC[10]: memory cell, MC: memory cell, MA: memory cell array, BL: wiring, BLB: wiring, WL: wiring, BGL: wiring, BGL1: wiring, BGL2: wiring, BGL3: wiring, BGL4: wiring, CL: wiring, RBL: wiring, WBL: wiring, RWL: wiring, WWL: wiring, SL: wiring, SRL: wiring, BRL: wiring, VDD: wiring, VSS: wiring, GND: wiring, Vb1: wiring, Vb2: wiring, IN[7:0]: signal, OUT[7:0]: signal, C1: capacitor, C2: capacitor, C3: capacitor, C4: capacitor, C5: capacitor, C11: capacitor, M1: transistor, M2: transistor, M3: transistor, M4: transistor, M5: transistor, M6: transistor, M7: transistor, M8: transistor, M9: transistor, M10: transistor, M11: transistor, M12: transistor, M13: transistor, M21: transistor, M22: transistor, M23: transistor, MS1: transistor, MS2: transistor, MS3: transistor, transistor MS4: transistor, CD: circuit, RD: circuit, RS: circuit, ROC: reading circuit, SF1: source follower circuit, SF2: source follower circuit, 10: semiconductor device, 10A: semiconductor device, 11: digital-analog converter circuit, 12: writing circuit, 13: row driver, 14: memory cell array, 15: reading circuit, 16: analog-digital converter circuit, 17: power-supply unit, 20: control portion, 20A: control portion, 21: gray code converter circuit, 22: ECC encoder circuit, 23: gray code converter circuit, 24: ECC decoder circuit, 25: gray code inverter circuit, 26: gray code inverter circuit, 100: semiconductor device, 110: conductor, 112: conductor, 120: conductor, 130: insulator, 140: capacitor, 150: insulator, 156: conductor, 160: insulator, 166: conductor, 200: transistor, 201: transistor, 214: insulator, 216: insulator, 218: conductor, 220: insulator, 222: insulator, 224: insulator, 225: insulator, 246: conductor, 248: conductor, 280: insulator, 282: insulator, 286: insulator, 300: transistor, 310: conductor, 310a: conductor, 310b: conductor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 404: conductor, 404a: conductor, 404b: conductor, 405: conductor, 405a: conductor, 405b: conductor, 406: metal oxide, 406a: metal oxide, 406b: metal oxide, 406c: metal oxide, 412: insulator, 418: insulator, 419: insulator, 420: insulator, 426a: region, 426b: region, 426c: region, 426d: region, 440: conductor, 440a: conductor, 440b: conductor, 450a: conductor, 450b: conductor, 451a: conductor, 451b: conductor, 452a: conductor, 452b: conductor, 1410: memory cell, 1420: memory cell, 1430: memory cell, 1440: memory cell, 1450: memory cell, 1460: memory cell, 1470: memory cell, 1480: memory cell, 1490: memory cell, 4700: electronic component, 4701: lead, 4702: printed circuit board, 4703: circuit portion, 4704: circuit board, 4800: semiconductor wafer, 4800a: chip, 4801: wafer, 4801a: wafer, 4802: circuit portion, 4803: spacing, 4803a: spacing, 4810: semiconductor wafer, 5100: USB memory, 5101: housing, 5102:

cap, 5103: USB connector, 5104: substrate, 5105: memory chip, 5106: controller chip, 5110: SD card, 5111: housing, 5112: connector, 5113: substrate, 5114: memory chip, 5115: controller chip, 5150: SSD, 5151: housing, 5152: connector, 5153: substrate, 5154: memory chip, 5155: memory chip, 5156: controller chip, 5401: housing, 5402: display portion, 5403: keyboard, 5404: pointing device, 5501: housing, 5502: display portion, 5503: microphone, 5504: speaker, 5505: operation button, 5701: display panel, 5702: display panel, 5703: display panel, 5704: display panel, 5801: first housing, 5802: second housing, 5803: display portion, 5804: operation key, 5805: lens, 5806: joint, 5901: housing, 5902: display portion, 5903: operation button, 5904: operator, 5905: band, 9000: housing, 9001: display portion, 9003: speaker, 9005: operation key, 9006: connection terminal 9007: sensor

The invention claimed is:

1. A semiconductor device comprising:
a first gray code converter circuit;
a second gray code converter circuit;
a gray code inverter circuit;
an ECC encoder circuit;
an ECC decoder circuit;
a writing circuit; and
a memory portion,
wherein the first gray code converter circuit is electrically connected to the ECC encoder circuit,
wherein the ECC encoder circuit is electrically connected to the memory portion,
wherein the memory portion is electrically connected to the second gray code converter circuit,
wherein the memory portion is electrically connected to the ECC decoder circuit,
wherein the second gray code converter circuit is electrically connected to the ECC decoder circuit,
wherein the ECC decoder circuit is electrically connected to the gray code inverter circuit,
wherein the first gray code converter circuit is configured to convert first data input to the first gray code converter circuit into second data with a gray code and to output the second data,
wherein the ECC encoder circuit is configured to generate first inspection data on the basis of the second data and outputting the first inspection data,
wherein the memory portion is configured to retain the first data and the first inspection data and to read out and output the first data as third data and the first inspection data as second inspection data,
wherein the writing circuit is configured to divide the first data into a plurality of memory cells included in the memory portion when transmitting the first data and the first inspection data,
wherein the writing circuit is configured to divide the first inspection data into the plurality of memory cells when transmitting the first data and the first inspection data,
wherein the second gray code converter circuit is configured to convert the third data into fourth data with the gray code and to output the fourth data,
wherein the ECC decoder circuit is configured to conduct error detection on the fourth data and the second inspection data,
wherein the ECC decoder circuit is configured to conduct error correction on the fourth data to output fifth data when an error is detected from the fourth data,
wherein the ECC decoder circuit is configured to output the fourth data when an error is not detected from the fourth data, and
wherein the gray code inverter circuit is configured to convert the fourth data or the fifth data from the gray code to have a code format of the first data and to output the converted fourth data and the fifth converted data.

2. The semiconductor device according to claim 1,
wherein the memory portion comprises a memory cell,
wherein the memory cell comprises a transistor, and
wherein the transistor comprises a metal oxide in a channel formation region.

3. A semiconductor wafer comprising the semiconductor device according to claim 1, and a region for dicing.

4. An electronic device comprising the semiconductor device according to claim 1 and a housing.

5. A semiconductor device comprising:
a first gray code converter circuit;
a second gray code converter circuit;
a first gray code inverter circuit;
a second gray code inverter circuit;
an ECC encoder circuit;
an ECC decoder circuit;
a writing circuit; and
a memory portion,
wherein the first gray code converter circuit is electrically connected to the ECC encoder circuit,
wherein the ECC encoder circuit is electrically connected to the first gray code inverter circuit,
wherein the first gray code inverter circuit is electrically connected to the memory portion,
wherein the memory portion is electrically connected to the second gray code converter circuit,
wherein the second gray code converter circuit is electrically connected to the ECC decoder circuit,
wherein the ECC decoder circuit is electrically connected to the second gray code inverter circuit,
wherein the first gray code converter circuit is configured to convert first data input to the first gray code converter circuit into second data with a gray code and to output the second data,
wherein the ECC encoder circuit is configured to generate first inspection data on the basis of the second data and to output the first inspection data,
wherein the first gray code inverter circuit is configured to convert the first inspection data from a gray code to have a code format of the first data and to output the converted first inspection data as second inspection data,
wherein the memory portion is configured to retain the first data and the second inspection data and to read out and output the first data as third data and the second inspection data as third inspection data,
wherein the writing circuit is configured to divide the first data into a plurality of memory cells included in the memory portion when transmitting the first data and the second inspection data,
wherein the writing circuit is configured to divide the first inspection data into the plurality of memory cells when transmitting the first data and the second inspection data,
wherein the second gray code converter circuit is configured to convert the third data into fourth data with a gray code and to output the fourth data, wherein the second gray code converter circuit is configured to convert the third inspection data into fourth inspection data with a gray code and to output the fourth inspection data, wherein the ECC decoder circuit is configured to conduct error detection on the fourth data and the fourth inspection data, wherein the ECC decoder circuit is configured to conduct error correction on the fourth data to output fifth data when an error is detected from the fourth data, wherein the ECC decoder circuit is configured to output the fourth data when an error is detected from the fourth inspection data, wherein the ECC decoder circuit is configured to output the fourth data when an error is not detected from the fourth data or the fourth inspection data, and wherein the second gray code inverter circuit is configured to convert the fourth data or the fifth data from a gray code to have a code format of the first data and to output the converted fourth data or the converted fifth data.

6. The semiconductor device according to claim 5,
wherein the memory portion comprises a memory cell,
wherein the memory cell comprises a transistor, and
wherein the transistor comprises a metal oxide in a channel formation region.

7. A semiconductor wafer comprising the semiconductor device according to claim 5, and a region for dicing.

8. An electronic device comprising the semiconductor device according to claim 5 and a housing.

9. An operation method of a semiconductor device, the semiconductor device comprising a first gray code converter circuit, a second gray code converter circuit, a gray code inverter circuit, an ECC encoder circuit, an ECC decoder circuit, and a memory portion, comprising first to seventh steps, wherein in the first step, first data input to the first gray code converter circuit is converted into second data with a gray code and the second data is output by the first gray code converter circuit, wherein in the second step, first inspection data is generated on the basis of the second data and the first inspection data is output by the ECC encoder circuit, wherein in the third step, the first data are retained in a plurality of memory cells included in the memory portion, and the first inspection data are retained in the plurality of memory cells, wherein in the fourth step, third data is read out as the first data from the memory portion and second inspection data is read out as the first inspection data from the memory portion, wherein in the fifth step, the third data input to the second gray code converter circuit is converted into fourth data with the gray code and the fourth data is output by the second gray code converter circuit, wherein in the sixth step, error detection is conducted on the fourth data and the second inspection data by the ECC decoder circuit, wherein error correction is conducted on the fourth data using the second inspection data and the fourth data is output as the fifth data by the ECC decoder circuit when an error is detected from the fourth data, and wherein the fourth data is output by the ECC decoder circuit when an error is not detected from the fourth data, and wherein in the seventh step, the fourth data or the fifth data is converted from the gray code to have a code format of the first data and the converted fourth data or the converted fifth data is output by the gray code inverter circuit.

10. An operation method of a semiconductor device, the semiconductor device comprising a first gray code converter circuit, a second gray code converter circuit, a first gray code inverter circuit, a second gray code inverter circuit, an ECC encoder circuit, an ECC decoder circuit, and a memory portion, comprising first to eight steps, wherein in the first step, first data input to the first gray code converter circuit is converted into second data with a gray code and the second data is output by the first gray code converter circuit, wherein in the second step, first inspection data is generated on the basis of the second data and the first inspection data is output by the ECC encoder circuit, wherein in the third step, the first inspection data is converted from a gray code to have a code format of the first data and the converted first inspection data is output as second inspection data by the first gray code inverter circuit, wherein in the fourth step, the first data are retained in a plurality of memory cells included in the memory portion, and the second inspection data are retained in the plurality of memory cells, wherein in the fifth step, third data is read out as the first data from the memory portion and third inspection data is read out as the second inspection data from the memory portion, wherein in the sixth step, the third data input to the second gray code converter circuit is converted to have the gray code and the converted third data is output as fourth data by the second gray code converter circuit and the third inspection data input to the second gray code converter circuit is converted to have the gray code and the converted third inspection data is output as fourth inspection data by the second gray code converter circuit, wherein in the seventh step, error detection is conducted on the fourth data and the fourth inspection data by the ECC decoder circuit, wherein error correction is conducted on the fourth data using the fourth inspection data and the fourth data is output as fifth data by the ECC decoder circuit when an error detection is detected from the fourth data, and wherein outputting the fourth data is output by the ECC decoder circuit when an error is not detected from the fourth data, and wherein in the eighth step, the fourth data or the fifth data is converted from the gray code to have a code format of the first data and the converted fourth data or the converted fifth data is output by the second gray code inverter circuit.

* * * * *